(12) United States Patent
Falster et al.

(10) Patent No.: US 7,442,253 B2
(45) Date of Patent: Oct. 28, 2008

(54) PROCESS FOR FORMING LOW DEFECT DENSITY, IDEAL OXYGEN PRECIPITATING SILICON

(75) Inventors: Robert J. Falster, London (GB); Joseph C. Holzer, St. Charles, MO (US); Marco Cornara, Galliate (IT); Daniela Gambaro, Galliate (IT); Massimiliano Olmo, Novara (IT); Steve A. Markgraf, Maple Grove, MN (US); Paolo Mutti, Milan (IT); Seamus A. McQuaid, Vitoria (ES); Bayard K. Johnson, Jefferson Hills, PA (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 11/753,294

(22) Filed: May 24, 2007

(65) Prior Publication Data
US 2007/0224783 A1 Sep. 27, 2007

Related U.S. Application Data

(60) Continuation of application No. 11/058,996, filed on Feb. 16, 2005, now Pat. No. 7,229,693, which is a continuation of application No. 10/373,899, filed on Feb. 25, 2003, now Pat. No. 6,896,728, which is a division of application No. 09/705,092, filed on Nov. 2, 2000, now Pat. No. 6,555,194, which is a continuation of application No. 09/057,800, filed on Apr. 9, 1998, now Pat. No. 6,190,631.

(60) Provisional application No. 60/062,316, filed on Oct. 17, 1997, provisional application No. 60/041,845, filed on Apr. 9, 1997.

(51) Int. Cl.
*C30B 25/12* (2006.01)

(52) U.S. Cl. .............................. 117/89; 117/19; 117/20; 117/84

(58) Field of Classification Search .................. 117/19, 117/20, 84, 89
See application file for complete search history.

(56) References Cited

U.S. PATENT DOCUMENTS 3,997,368 A 12/1976 Petroff et al.

(Continued)

FOREIGN PATENT DOCUMENTS

CN 85100856 A 7/1986

(Continued)

OTHER PUBLICATIONS

"Axial Temperature Gradient of Silicon Crystals During Czochralski Growth", Journal of Crystal Growth, vol. 151, pp. 273-277, 1995.

(Continued)

*Primary Examiner*—Felisa C Hiteshew
(74) *Attorney, Agent, or Firm*—Armstrong Teasdale LLP

(57) ABSTRACT

The present invention is directed to a process for producing a silicon wafer which, during the heat treatment cycles of essentially any arbitrary electronic device manufacturing process, may form an ideal, non-uniform depth distribution of oxygen precipitates and may additionally contain an axially symmetric region which is substantially free of agglomerated intrinsic point defects. The process either comprises exposing the wafer's front and back surfaces to different atmospheres, or thermally annealing two wafers in a face-to-face arrangement.

18 Claims, 32 Drawing Sheets

U.S. PATENT DOCUMENTS

| | | | |
|---|---|---|---|
| 4,314,595 A | 2/1982 | Yamamoto et al. | |
| 4,376,657 A | 3/1983 | Nagasawa et al. | |
| 4,437,922 A | 3/1984 | Bishoff et al. | |
| 4,505,759 A | 3/1985 | O'Mara | |
| 4,548,654 A | 10/1985 | Tobin | |
| 4,851,358 A | 7/1989 | Huber | |
| 4,868,133 A | 9/1989 | Huber | |
| 4,981,549 A | 1/1991 | Yamashita et al. | |
| 5,264,189 A | 11/1993 | Yamashita et al. | |
| 5,327,007 A | 7/1994 | Imura et al. | |
| 5,401,669 A | 3/1995 | Falster et al. | |
| 5,403,406 A | 4/1995 | Falster et al. | |
| 5,445,975 A | 8/1995 | Gardner et al. | |
| 5,474,020 A | 12/1995 | Bell et al. | |
| 5,478,408 A | 12/1995 | Mitani et al. | |
| 5,485,803 A | 1/1996 | Habu | |
| 5,487,354 A | 1/1996 | von Ammon et al. | |
| 5,502,010 A | 3/1996 | Nadahara et al. | |
| 5,502,331 A | 3/1996 | Inoue et al. | |
| 5,534,294 A | 7/1996 | Kubota et al. | |
| 5,539,245 A | 7/1996 | Imura et al. | |
| 5,548,654 A | 8/1996 | Fast | |
| 5,561,316 A | 10/1996 | Fellner | |
| 5,593,494 A | 1/1997 | Falster | |
| 5,611,855 A | 3/1997 | Wijaranakula | |
| 5,667,584 A | 9/1997 | Takano et al. | |
| 5,674,756 A | 10/1997 | Satoh et al. | |
| 5,704,973 A | 1/1998 | Sakurada et al. | |
| 5,728,211 A | 3/1998 | Takano et al. | |
| 5,738,942 A | 4/1998 | Kubota et al. | |
| 5,779,791 A | 7/1998 | Korb et al. | |
| 5,788,763 A | 8/1998 | Hayashi et al. | |
| 5,885,905 A | 3/1999 | Nadahara et al. | |
| 5,919,302 A | 7/1999 | Falster et al. | |
| 5,935,320 A | 8/1999 | Graef et al. | |
| 5,939,770 A | 8/1999 | Kageyama | |
| 5,944,889 A | 8/1999 | Park et al. | |
| 5,954,873 A | 9/1999 | Hourai et al. | |
| 5,968,262 A | 10/1999 | Saishouji et al. | |
| 5,968,264 A | 10/1999 | Lida et al. | |
| 6,045,610 A | 4/2000 | Park et al. | |
| 6,146,459 A | 11/2000 | Park | |
| 6,153,008 A | 11/2000 | von Ammon et al. | |
| 6,251,184 B1 | 6/2001 | Park | |
| 6,254,672 B1 | 7/2001 | Falster et al. | |
| 6,287,380 B1 | 9/2001 | Falster et al. | |
| 6,340,392 B1 | 1/2002 | Park | |
| 6,379,642 B1 | 4/2002 | Falster et al. | |
| 6,409,826 B2 | 6/2002 | Falster et al. | |
| 6,409,827 B2 * | 6/2002 | Falster et al. | 117/15 |
| 6,409,833 B2 | 6/2002 | Park | |
| 6,472,040 B1 | 10/2002 | Park | |
| 6,503,594 B2 | 1/2003 | Park | |
| 6,605,150 B2 | 8/2003 | Falster et al. | |
| 6,632,278 B2 * | 10/2003 | Falster et al. | 117/84 |
| 6,638,357 B2 | 10/2003 | Mule'Stagno et al. | |
| 6,676,753 B2 | 1/2004 | Park | |
| 6,689,209 B2 * | 2/2004 | Falster et al. | 117/2 |
| 6,821,344 B2 | 11/2004 | Park | |
| 6,840,997 B2 | 1/2005 | Falster et al. | |
| 6,896,728 B2 * | 5/2005 | Falster et al. | 117/3 |

FOREIGN PATENT DOCUMENTS

| | | |
|---|---|---|
| DE | 155 531 | 6/1982 |
| DE | 39 05 626 A1 | 8/1989 |
| DE | 4323964 A1 | 1/1994 |
| DE | 4414947 A1 | 8/1995 |
| DE | 19806045 A1 | 8/1998 |
| EP | 0503816 B1 | 9/1992 |
| EP | 0504837 A2 | 9/1992 |
| EP | 0536958 A1 | 4/1993 |
| EP | 0716168 A1 | 6/1996 |
| EP | 0799913 | 12/1998 |
| EP | 0 962 556 | 8/1999 |
| EP | 0962557 A1 | 8/1999 |
| EP | 0 954 018 | 11/1999 |
| EP | 0 964 435 | 12/1999 |
| GB | 2 137 524 A | 10/1984 |
| GB | 2182262 | 10/1986 |
| JP | 2-32535 | 2/1988 |
| JP | 1-242500 | 9/1989 |
| JP | 2-180789 | 7/1990 |
| JP | HEI 2-267195 | 10/1990 |
| JP | 3-9078 | 2/1991 |
| JP | HEI 3-93700 | 4/1991 |
| JP | 3-185831 | 8/1991 |
| JP | HEI 4-042893 | 2/1992 |
| JP | 4-108682 | 4/1992 |
| JP | 4-294540 | 10/1992 |
| JP | 5-155700 | 6/1993 |
| JP | HEI 7-041383 | 2/1995 |
| JP | 7/158458 | 5/1995 |
| JP | 7-201874 | 8/1995 |
| JP | HEI 7-206591 | 8/1995 |
| JP | 7/321120 | 12/1995 |
| JP | 7/335657 | 12/1995 |
| JP | HEI 8-012493 | 1/1996 |
| JP | 8/045944 | 2/1996 |
| JP | 8/045945 | 2/1996 |
| JP | 8/045947 | 2/1996 |
| JP | HEI 8-208374 | 8/1996 |
| JP | 8/268794 | 10/1996 |
| JP | HEI 8-330316 | 12/1996 |
| JP | 9-199416 | 7/1997 |
| JP | 9/202690 | 8/1997 |
| JP | 11-067781 A | 3/1999 |
| JP | 11-150119 | 6/1999 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| KR | 1997-0003671 | 1/1997 |
| WO | WO 97/26393 | 7/1997 |
| WO | WO 98/38675 | 9/1998 |
| WO | WO 98/45507 | 10/1998 |
| WO | WO 98/45508 | 10/1998 |
| WO | WO 98/45509 | 10/1998 |
| WO | WO 98/45510 | 10/1998 |

OTHER PUBLICATIONS

Abe, T., "Innovated Silicon Crystal Growth and Wafering Technologies" Electrochemical Society Proceedings, vol. 97, No. 3, pp. 123-133.

Abe, T., et al., "Defect-Free Surfaces of Bulk Wafers by Combination of RTA and Crystal Growth Conditions".

Abe, T., et al., "Swirl Defects in Float-Zoned Silicon Crystals," Physics., vol. 116B, pp. 139-147, 1985.

Abe, T., et al., "The Characteristics of Nitrogen in Silicon Crystals," VLSI Science and Technology/1985, (Electrochem. Soc. Pennington, 1985), Proceedings vol. 85-5, pp. 543-551, 1985.

Abe, T., et al., "Behavior of Point Defects in FZ Silicon Crystals", Semiconductor Silicon 1990, *Proceedings of the Sixth International Symposium on Silicon Materials Science and Technology*, vol. 90-7, pp. 105-116, 1990.

Abe, T., et al., "Dynamic Behavior of Intrinsic Point Defects in FZ and CZ Siicon Crystals," Mat. Res. Soc. Symp. Proc., vol. 262, pp. 3-13, 1992.

Borionetti, G., et al., "Investigation of Low Density Defects in Czochralski Silicon Crystals: Their Detectability, Formation Kinetics and Influence on Gate Oxide Integrity," Electrochemical Society Proceedings, vol. 96-13, pp. 160-169.

Chiou, H.D., "The Effects of Preheatings on Axial Oxygen Precipitation Uniformity in Czochralaski Silicon Crystals", *J. Electrochem. Soc.*, vol. 139, No. 6, Jun. 1992.

de Kock, A.J.R., "Microdefects in Swirl-Free Silicon Crystals," pp. 83-94 (source unknown) (date unknown).

de Kock, A.J.R.,"The Elimination of Vacancy-Cluster Formation in Dislocation-Free Silicon Crystals", J. of the Electrochem. Soc.: Solid-State Science and Technology, vol. 118, No. 11, pp. 1851-1856, 1971.

de Kock, A.J.R., et al., "Effect of Growth Parameters on Formation and Elimination of Vacancy Clusters in Dislocation-Free Silicon Crystals", Journal of Crystal Growth, vol. 22, pp. 311-320, 1974.

de Kock, A.J.R., "Point Defect Condensation in Dislocation-Free Silicon Crystals," Semiconductor Silicon, pp. 508-520, 1977.

de Kock, A.J.R., et al., "The Effect of Doping on the Formation of Swirl Defects in Dislocation-Free Czochralski-Grown Silicon Crystals", Journal of Crystal Growth, vol. 49, pp. 718-734, 1980.

Dornberger, E., et al., "Simulation of Grown-in Voids in Czochralski Silicon Crystals", Electrochemical Society Proceedings, vol. 97, No. 22 pp. 40-49.

Dornberger, E., et al., "The Impact of Dwell Time Above 900° C. During Crystal Growth on the Gate Oxide Integrity of Silicon Wafers", Electrochemical Society Proceedings, vol. 96-13, pp. 140-151.

Dornberger, E., et al., "The Dependence Ring Like Distributed Stacking Faults on the Axial Temperature Gradient of Growing Czochralski Dilicon Crystals", Electrochemical Society Proceedings, vol. 95-4, pp. 294-305, 1995.

Dornberger, E., et al., "Simulation of Non-Uniform Grown-in Void Distributions in Czochralski Silicon Crystals", Electrochemical Society Proceedings, vol. 98-1, pp. 490-503, 1998.

Eidenzon, A.M. et al., "Microdefects in Dislocation-Free Silicon Monocrystals, "TSVAM Met., No. 3 pp. 64-67, 1984.

Eidenzon, A.M. et al., "Influence of Growth Rate on Swirl Defects in Large Dislocation-Free Crystals of Silicon Grown by the Czochralski Method," Sov. Phys. Crystallogr., vol. 30, No. 5 (1985) pp. 576-580, American Institute of Physics.

Eidenzon, A.M. et al., "Influence of Growth Microdefects on Formation of Microdefects During High-Temperature Treatment of Silicon,"Sov. Phys. Crystallogr., vol. 31, No. 2, pp. 199-203, American Institute of Physics, 1985.

Eidenzon, A.M. et al., "Specific Microdefects in Dislocation-Free Silicon Doped with Phosphorus," Sov. Phys. Crystallogr., vol. 33, No. 4, pp. 561-565, American Institute of Physics, 1988.

Eidenzon, A.M. et al., "Interrelation Between Distributions of Growth- and Thermally- Induced Microdefects and Impurity Distribution in Dislocation-Free Silicon Grown by the Czochralski Method with a Constant Magnetic Field Acting on the Melt," Sov. Phys. Crystallogr., vol. 35, No. 2, pp. 250-254, American Institute of Physics, 1990.

Eidenzon, A.M. et al., "Classification of Grown-In Microdefects in Czochralski-Grown Silicon Crystals," Inorganic Materials, vol. 31(4), 1994, pp. 401-409.

Eidenzon, A.M. et al., "Defect-Free Silicon Crystals Grown by the Czochralski Technique" Inorganic Materials, vol. 33-3, pp. 219-225, 1997.

Eidenzon, A.M. et al., "Influence of growth rate on swirl defects in large dislocation-free crystals of silicon grown by the Czochralski method" Soviet Physics Crystallography, pp. 576-580, 30(5), 1985.

European Search Report for European Patent Application No. EP 1 118 697 A3, dated Sep. 3, 2001, 3 pages European Search Report for European Patent Application No. EP 1 118 697 A3, 3 pages, 2001.

European Search Report for European Patent Application No. EP 02 02 1897, dated Oct. 9, 2003, 3 pages.

Falster, R., et al., "The Engineering of Silicon Wafer Material Properties Through Vacancy Concentration Profile Control and the Achievement of Ideal Oxygen Precipitation Behavior", Mat. Res. Soc. Symp. Proc. vol. 510, pp. 27-35, 1998.

Foll, H., et al. "The Formation of Swirl Defects in Silicon by Agglomeration of Self-Interstitials", Journal of Crytsal Growth, 1977, pp. 90-1087, vol. 40, North-Holland Publishing Company.

Hara, A., et al. "Enhancement of Oxygen Preceipitation in Quenched Czochralski Silicon Crytsals" Journal of Applied Phys. vol. 66, pp. 3958-3960, 1989.

Harada, H., et al., Oxygen Precipitation Enhanced with Vacancies in Silicon, pp. 76-85.

Hawkins, G.A., et al., "Effect of Rapid Thermal Processing on Oxygen Precipitation in Silicon", Mat. Res. Soc. Symp. Proc., vol. 104, pp. 197-200, 1988.

Hawkins, G.A., et al., "The Effect of Rapid Thermal Annealing on the Precipitation of Oxygen in Silicon", J. Appl. Phys., vol. 65, No. 9, pp. 3644-3654, 1989.

Herng-Der Chiou, "The Effects of Preheatings on Axial Oxygen Precipitation Uniformity in Czochralski Silicon Crystals", J. Electrochem. Soc., vol. 139, No. 6, Jun. 1992.

Hourai, M., et al., "Nature and Generation of Grown-In Defects in Czochralski Silicon Crystals," Electrochemical Society Proceedings, vol. 98-1, pp. 453-467.

Hourai, M., et al., "Improvement of Gate Oxide Integrity Characteristics of CZ-Grown Silicon Crystals", Progress in Semiconductor Fabrication presented by: Semiconductor Equipment and Materials International, Semicon/Europa 93, Mar. 30-Apr. 1, 1993, Geneva, Switzerland.

Hourai, M., et al., "Growth Parameters Determining the Type of Grown-In Defects in Czochralski Silicon Crystals", Materials Science Forum, vols. 196-201, (1985), pp. 1713-1718.

Hourai, M., et al., "Formation Behavior of Infrared Light Scattering Defects in Silicon During Czochralski Crystal Growth," J. Electrochem. Soc., vol. 142(9), (1995), 3193-3201.

Isomae, S., et al., "Depth profiles of interstitial oxygen concentrations in silicon subjected to three-step annealing", J. Appl. Phys., 55(4), (1984), pp. 817-824.

Jacob, M., et al. "Influence of RTP on Vacancy Concentrations", Mat. Res. Soc. Symp. Proc. vol. 490, pp.129-134, 1998.

Kitano, et al., "Identification of Vacancy Clusters in FZ-SI Crystals," Phys. Stat. Sol, vol. 127(a), (1991), 341-347.

Kissinger, G., et al., "A Method for Studying the Grwon-In Defect Density Spectra in Czochralski Silicon Wafers", J. Electrochem. Soc., vol. 144, No. 4, pp. 1447-1456, 1997.

Majima, et al., "High-Sensitivity Defect Evaluation by a New Preferential Etching Technique for Highly As-Doped Si Crystals," Jpn. J. Appl. Phys., vol. 36, No. 10 (1997) pp. 6195-6199.

Nadahara, S., et al., "Hydrogen Annealed Silicon Wafer", Solid State Phenomena, vols. 57-58, pp. 19-26, 1997.

Nagasima, et al., "Observation of Grown-in Defects in CZ-Si Crystal," Meeting of the Japan Society of Applied Physics (1993).

Nakamura, K., et al., "Formation Process of Grown-In Defects in Czochralski Grown Silicon Crystals", Journal of Crystal Growth, vol. 180 (1997) pp. 61-72.

Pagani, M., et al. "Spatial variations on oxygen precipitation in silicon after high temperature rapid thermal annealing", Appl. Physl. Lett., vol. 70, No. 12, pp. 1572-1574, 1997.

Park, J.G., et al., "Effect of Crystal Defects on Device Characteristics", Electrochemical Society Proceedings, vol. 97-22, pp. 173-195, 1997.

Puzanov, N.I., et al., "Relaxation in a System of Point Defects in a Growing Dislocation-Free Crystal of Silicon", Sov. Phys. Crystallogr., vol. 31, No. 2 (1986) pp. 219-222, American Institute of Physics of Silicon.

Puzanov, N.I., et al., "Influence of Transitional Crystallization Regimes on Microdefects in Silicon", USSR Academy of Sciences Newsletter, vol. 22, No. 8, pp. 1237-1242, 1986.

Puzanov, N.I., et al., "Influence of Growth Conditions on the Formation of Microdefects in Dislocation-Free Silicon," Sov. Phsys. Crystallogr., vol. 34(2), (1989) pp. 273-278.

Puzanov, N.I., et al., "Microdefects in Silicon Grown by the Czochralski Method with a Vertical Magnetic Field Acting on the Melt," Sov. Phys. Crystallogr. 35(1), (1990), pp. 102-105.

Puzanov, N.I., et al., "Effects of Silicon Monocrystal Growth Conditions on Oxygen Precipitation During High-Temperature Processing," vol. 37, No. 5 (1992) pp. 1-10.

Puzanov, N.I., et al., "The Effect Of Thermal History During Crystal Growth On Oxygen Precipitation In Czochralski-grown Silicon", Semicond. Sci. Technol., vol. 7, pp. 406-413, 1992.

Puzanov, N., et al., "Formation of the banks of anomalous oxygen precipitation in Czochralski-grown Si crystals" Journal of Crystal Growth vol. 137, pp. 642-652, 1994.

Puzanov, N.I., et al., "Modeling Point-Defect Distribution in Dislocation-Free Si Crystals Grown from the Melt," Inorganic Materials, Vo. 32(1), (1996), pp. 1-9.

Puzanov, N.I., et al., "Cultivation, Morphology and Structural Integrity of Dislocation-Free Silicon Tetracrystals", Inorganic Materials, vol. 32, No. 8, pp. 903-912, 1996.

Puzanov, N.I., et al., "The Role of Intrinsic Point Defects in the Formation of Oxygen Precipitation Centers in Dislocation-Free Silicon" Crystallography Reports, vol. 41, No. 1, pp. 134-141, 1996.

Puzanov, N.I., et al., "Harmful Microdefects in the Seed-End Portion of Large-Diameter Silicon Ingots", Inorganic Materials, pp. 765-769, vol. 33, No. 8, 1997.

Puzanov, N., et al., "Modelling microdefect distribution in dislocation-free Si crystals grown from the melt", Journal of Crystal Growth, 178, pp. 468-478, 1997.

Puzanov, N., et al., "Role of Vacancies in the Nucleation of Ringlike-patterned Oxidation-induced Stacking Faults in Melt-grown Silicon Crystals" Inorganic Materials, vol. 34-4, pp. 307-314, 1998.

Roksnoer, P.J., "Effect of Low Cooling Rates on Swirls and Striations in Dislocation-Free Silicon Crystals," vol. 35, (1976), pp. 245-248.

Roksnoer, P.J., "Microdefects in a Non-Striated Distribution in Floating-Zone Silicon Crystals", Journal of Crystal Growth, vol. 53, pp. 563-573, 1981.

Roksnoer, P.J., "The Mechanism of Formation of Microdefects in Silicon", Journal of Crystal Growth, vol. 68, pp. 596-612, 1984.

Ryuta, J, et al., "Crystal-Originated Singularities on Si Wafer Surface after SC1 Cleaning," Japanese Journal of Applied Physics, vol. 29(11) (1990), pp. L1947-L1949.

Seidel, T.E., "Silicon Wafers for the 1990's" Journal of Crystal Growth, vol. 85, (1987), pp. 97-105.

Shimanuki, Y., et al., "Effects of Thermal History on Microdefect Formation in Czochralski Silicon Crystals", Japanese Journal of Applied Physics, vol. 24, No. 12, pp. 1594-1599, 1985.

Shimizu, H., et al., "Effects of Surface Defects (COPs) On Isolation Leakage and Gate Oxide Integrity in MOS Large-Scale-Integrated-Circuit Devices and Cost Effective p-/p- Epitaxial Wafers" Electrochemical Society Proceedings, vol. 99, No. 1, pp. 315-323 (from a presentation on or about May 3, 1999).

Shimizu, H., et al., "Excellence of Gate Oxide Integrity in Metal-Oxide-Semiconductor Large-Scale-Integrated Circuits Based on P-/P- Thin-Film Epitaxial Silicon Wafers", Jpn. J. Appl. Phys., vol. 36, pp. 2565-2570, Part 1, No. 5A, 1997.

Shimura, F., "Semiconductor Silicon Crystal Technology" Academic Press, Inc., San Diego, CA, pp. 360-377, 1989.

Sinno, T., et al., "On the Dynamics of the Oxidation-Induced Stacking-Fault Ring in As-Grown Czochralski Silicon Crystals", Applied Physics Letters, vol. 70, No. 17, pp. 2250-2252, 1997.

Sinno, T., et al., "Point Defect Dynamics and the Oxidation-Induced Stacking-Fault Ring in Czochralski-Grown Silicon Crystals", Journal of Electrochemical Society, vol. 145, No. 1, pp. 302-318, 1998.

Stutius, et al., "Growth and Doping of ZnSe and $ZnS_xSe_{1-x}$ by Organometallic Chemical Vapor Deposition," Journal of Crystal Growth, vol. 59 (1982) pp. 1-9.

Tan, T.Y., "Point Defects, Diffusion Processes, and Swirl Defect Formation in Silicon", Appl. Phys. A., vol. 37, pp. 1-17, 1985.

Vanhellemont, J., et al., "Defects in As-Grown Silicon and Their Evolution During Heat Treatments", Materials Science Forum, vols. 258-263, pp. 341-346, 1997.

Von Ammon et al. "The Dependence of Bulk Defects on the Axial Temperature Gradient of Silicon Crystals During Czochralski Growth" Journal of Crystal Growth, vol. 151, pp. 273-277, 1995.

Voronkov, "The Mechanism of Swirl Defects Formation in Silicon", Journal of Crystal Growth, vol. 59, pp. 625-643, 1982.

Voronkov, V., et al., "Behavior and Effects of Intrinsic Point Defects in the Growth of Large Silicon Crystals" Electrochemical Society Proceedings, vol. 97-22, pp. 3-17, 1997.

Voronkov, V., et al., "Grown-In Microdefects, Residual Vacancies and Oxygen Precipitation Banks in Czochralski Silicon" Journal of Crystal Growth, 304, pp. 462-474, 1999.

Wijaranakula, W., "Numerical Modeling of the Point Defect Aggregation during the Czochralski Silicon Crystal Growth", Journal of Electrochemical Society, vol. 139, No. 2, pp. 604-616, 1992.

Wijaranakula, W., "Effect of High-Temperature Annealing on the Dissolution of the D-Defects in N-Type Czochralski Silicon," Appl. Phys. Lett., vol. 64(8), (1994), 1030-1032.

Wijaranakula, W., "Fundamentals of Point Defect Aggregation and Dissolution Phenomena of Crystal Originated Defects in Czochralski Silicon," Materials Science Forum, vols. 196-201 (1995) pp. 1691-1696.

Winkler et al. "Improvement of the Gate Oxide Integrity by Modifying Crystal Pulling and Its Impact on Device Failures" J. Electrochem. Soc., vol. 141, No. 5, pp. 1398-1401, 1994.

Yamagishi, et al., "Recognition of D Defects in Silicon Signle Crystals by Preferential Etching and Effect on Gate Oxide Integrity", Semicond. Sci Technol. 7, 1992, A135-A140.

Yamauchi, T., et al., "Application of Copper-Decoration Method to Characterize As-Grown Czochralski-Silicon," Jpn. J. Appl. Phys., vol. 31, (1992), pp. L439-L442.

Zimmerman, H., et al. "Gold and Platinum Diffusion: the Key to the Understanding of Intrinsic Point Defect Behavior in Silicon", Applied Physics A Solids and Surfaces, vol. A55, No. 1 (1992) pp. 121-134.

Zimmerman al. "Vacancy Concentration Wafer Mapping in Silicon" J. Crystal Growth, vol. 129, pp. 582-592, 1993.

* cited by examiner

PROCESS FOR FORMING LOW DEFECT DENSITY, IDEAL OXYGEN PRECIPITATING SILICON

REFERENCE TO RELATED APPLICATION

This is a continuation of application Ser. No. 11/058,996, filed on Feb. 16, 2005; which is a continuation of Ser. No. 10/373,899, filed on Feb. 25, 2003, now U.S. Pat. No. 6,896,728; which is a division of application Ser. No. 09/705,092, filed Nov. 2, 2000, now U.S. Pat. No. 6,555,194; which is a continuation of application Ser. No. 09/057,800, filed Apr. 9, 1998, now U.S. Pat. No. 6,190,631; which claims the benefit of U.S. Provisional Application No. 60/041,845, filed Apr. 9, 1997, and U.S. Provisional Application No. 60/062,316, filed Oct. 17, 1997; all of which are incorporated in their entirety herein by reference.

BACKGROUND OF THE INVENTION

The present invention generally relates to the preparation of semiconductor material substrates, especially silicon wafers, which are used in the manufacture of electronic components. More particularly, the present invention relates to a silicon wafer, and a process for the preparation thereof, which, during the heat treatment cycles of essentially any arbitrary electronic device manufacturing process, may form an ideal, non-uniform depth distribution of oxygen precipitates and may additionally contain an axially symmetric region which is substantially free of agglomerated intrinsic point defects.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes included a series of steps which were designed to produce silicon having a zone or region near the surface of the wafer which is free of oxygen precipitates (commonly referred to as a "denuded zone" or a "precipitate free zone") with the balance of the wafer, i.e., the wafer bulk, containing a sufficient number of oxygen precipitates for IG purposes. Denuded zones can be formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600-750° C.), and (c) growth of oxygen ($SiO_2$) precipitates at a high temperature (1000-1150° C.). See, e.g., F. Shimura, *Semiconductor Silicon Crystal Technology*, Academic Press, Inc., San Diego Calif. (1989) at pages 361-367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

SUMMARY OF THE INVENTION

Among the objects of the invention, therefore, is the provision of a process for heat-treating a Cz, single crystal silicon wafer to influence the precipitation behavior of oxygen in the wafer in a subsequent thermal processing step, the wafer comprising two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer. The wafer further comprises an axially symmetric region which has radial width of at least about 30% the length of the radius of the wafer and has no detectible agglomerated intrinsic point defects at a detection limit of $10^3$ defects/cm$^3$. The process comprises the steps of subjecting the wafer to a heat-treatment in excess of about 1175° C. in a non-oxidizing atmosphere to form crystal lattice vacancies in the front surface and bulk layers, and controlling the cooling rate of the heat-treated wafer to produce a wafer having a vacancy concentration profile in which a maximum concentration is located between the central plane and the back surface layer, the vacancy concentration generally increasing from the front surface to the region of maximum concentration and generally decreasing from the region of maximum concentration to the back surface with the difference in the concentration of vacancies in the front surface layer, the back surface layer, and the bulk layer being such that a thermal treatment at a temperature in excess of 750° C. is capable of forming in the wafer a denuded zone in the front surface layer and in the back surface layer and oxygen clusters or precipitates in the bulk zone, with the concentration of the oxygen clusters or precipitates in the bulk layer being primarily dependant upon the concentration of vacancies.

The invention is further directed to a process for producing a single crystal silicon wafer having two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer. The wafer has a non-uniform distribution of crystal lattice vacancies in which a maximum concentration is located between the central plane and the back surface layer, the vacancy concentration generally increasing from the front surface to the region of maximum concentration and generally decreasing from the region of maximum concentration to the back surface, the wafer further comprising a first axially symmetric region, which has no detectible agglomerated intrinsic point defects at a detection limit of $10^3$ defects/cm$^3$. The process comprising the steps of growing a single crystal silicon ingot in which the ingot comprises a central axis, a seed-cone, an end-cone and a constant diameter portion between the seed-cone and the end-cone having a circumferential edge, a radius extending from the central axis to the circumferential edge, and a nominal diameter of 150 mm, 200 mm, or greater than 200 mm; controlling (i) a growth velocity, v, (ii) an average axial temperature gradient, $G_0$, during the growth of the constant diameter portion of the crystal over the temperature range from solidification to a temperature of no less than about 1325° C., and (iii) the cooling rate of the crystal from the solidification temperature to about 1,050° C. to cause the formation of an axially symmetrical segment which has no detectible agglomerated intrinsic point defects at a detection limit of $10^3$ defects/cm$^3$, wherein the axially symmetric region extends inwardly from the circumferential edge of the ingot, has a width as measured from the circumferential edge radially toward the central axis of the ingot which is at least about 30% the length of the radius of the ingot, and has a length as measured along the central axis of at least about 20% the length of the constant diameter portion of the ingot; slicing a single crystal silicon wafer from the constant diameter portion of the ingot; subjecting the wafer to a heat-treatment in excess of about 1175° C. in a non-oxidizing atmosphere to form crystal lattice vacancies in the front surface and bulk layers; and, controlling the cooling rate of the heat-treated wafer to produce a wafer having a vacancy concentration profile in which a maximum concentration is located between the central plane and the back surface layer, the vacancy concentration generally increasing from the front surface to the region of maximum concentration and generally decreasing from the region of maximum concentration to the back surface and the difference in the concentration of vacancies in the front surface layer, the back surface layer, and the bulk layer being such that a thermal treatment at a temperature in excess of 750° C. is capable of forming in the wafer a denuded zone in the front surface layer and in the back surface layer and oxygen clusters or precipitates in the bulk zone, with the concentration of the oxygen clusters or precipitates in the bulk layer being primarily dependant upon the concentration of vacancies.

The present invention is still further directed to a process for heat-treating a Cz, single crystal silicon wafer, to influence the precipitation behavior of oxygen in the wafer in a subsequent thermal processing step, the wafer comprising two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer. The wafer further comprises a first axially symmetric region in which vacancies are the predominant intrinsic point defect and which has no detectible agglomerated intrinsic point defects at a detection limit of $10^3$ defects/cm$^3$, wherein the first axially symmetric region comprises the central axis or has a width of at least about 15 mm. The process comprises the steps of subjecting the wafer to a heat-treatment in excess of about 1175° C. in a non-oxidizing atmosphere to form crystal lattice vacancies in the surface layer and the bulk layer; and, controlling the cooling rate of the heat-treated wafer to produce a wafer having a non-uniform concentration of vacancies in which a maximum concentration is located between the central plane and the back surface layer, the vacancy concentration generally increasing from the front surface to the region of maximum concentration and generally decreasing from the region of maximum concentration to the back surface such that, upon subjecting the wafer to an oxygen precipitation heat treatment, a denuded zone is formed in the surface layer and oxygen clusters or precipitates are formed in the bulk layer with the concentration of the oxygen clusters or precipitates in the bulk layer being primarily dependant upon the concentration of vacancies.

Other objects and features of this invention will be in part apparent and in part pointed out hereinafter.

DETAILED DESCRIPTION OF THE PREFERRED EMBODIMENTS

Figure 1:
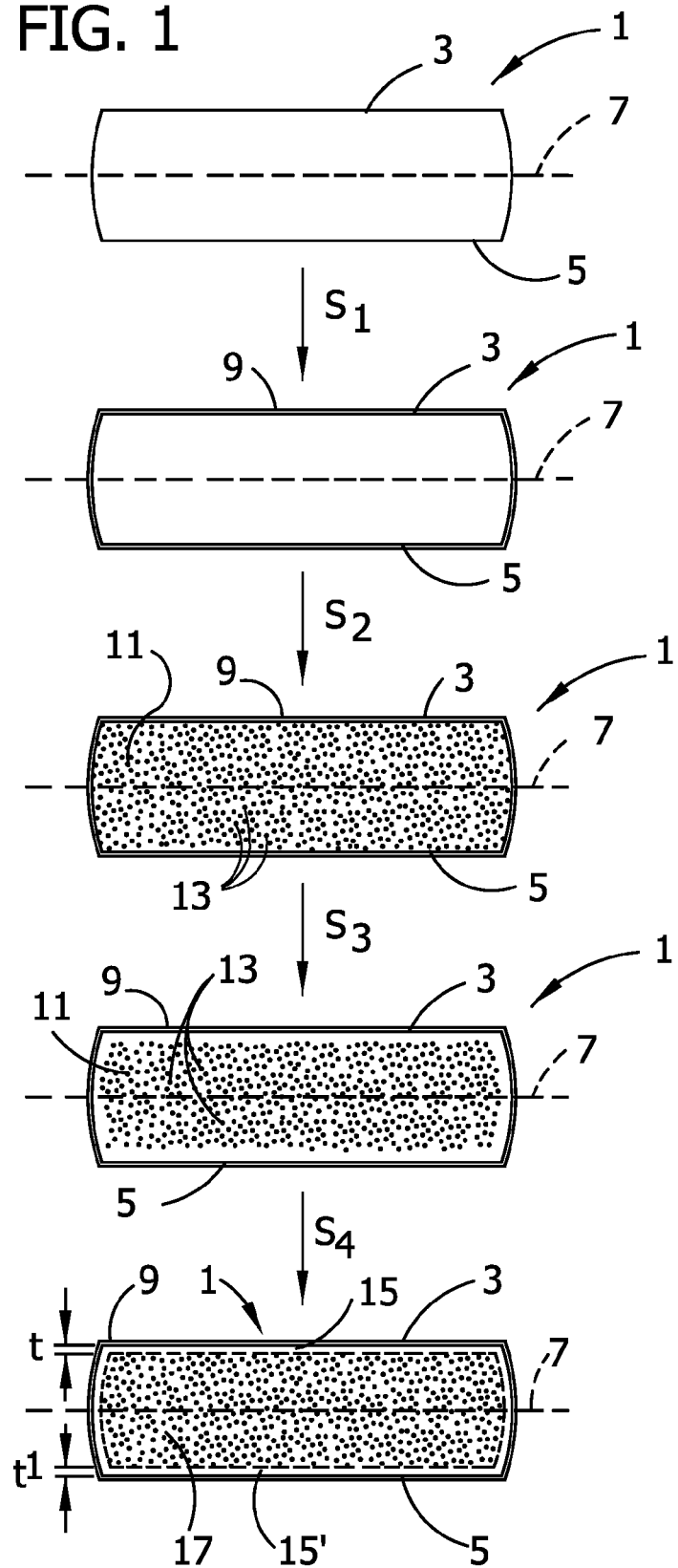
FIG. 1 is a schematic depiction of the process of the present invention.

In accordance with the present invention, an ideal precipitating wafer has been discovered which, during essentially any electronic device manufacturing process, will form a denuded zone of sufficient depth and a wafer bulk containing a sufficient density of oxygen precipitates for IG purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will precipitate during the electronic device manufacturing process.

The starting material for the ideal precipitating wafer of the present invention is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982 (incorporated herein by reference).

Czochralski-grown silicon typically has an oxygen concentration within the range of about $5 \times 10^{17}$ to about $9 \times 10^{17}$ atoms/cm$^3$ (ASTM standard F-121-83). Because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process.

Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced. The presence or absence of these nucleation centers in the starting material is not critical to the present invention provided, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C. The detection limit for oxygen precipitates is currently about $5 \times 10^6$ precipitates/cm$^3$. The presence (or density) of oxygen precipitation nucleation centers cannot be directly measured using presently available techniques. Various techniques may be used, however, to indirectly detect their presence. As previously discussed, preexisting oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment, e.g., annealing the wafer at a temperature of 800° C. for four hours and then at a temperature of 1000° C. for sixteen hours.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Referring now to FIG. 1, the starting material for the ideal precipitating wafer of the present invention, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In a first embodiment of the process of the present invention wafer 1 is heat-treated in an oxygen-containing atmosphere in step $S_1$ to grow a superficial oxide layer 9 which envelopes wafer 1. In general, the oxide layer will have a thickness which is greater than the native oxide layer which forms upon silicon (about 15 Ångstroms); preferably, the oxide layer has a thickness of at least about 20 Ångstroms and, in some embodiments, at least about 25 Ångstroms or even at least about 30 Ångstroms. Experimental evidence obtained to-date, however, suggests that oxide layers having a thickness greater than about 30 Ångstroms, while not interfering with the desired effect, provide little or no additional benefit.

In step $S_2$, the wafer is subjected to a heat-treatment step in which the wafers are heated to an elevated temperature to form and thereby increase the number density of crystal lattice vacancies 13 in wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

In the first embodiment of the present invention, the rapid thermal annealing step is carried out in the presence of a nitriding atmosphere, that is, an atmosphere containing nitrogen gas ($N_2$) or a nitrogen-containing compound gas such as ammonia which is capable of nitriding an exposed silicon surface. The atmosphere may thus consist entirely of nitrogen or nitrogen compound gas, or it may additionally comprise a non-nitriding gas such as argon. An increase in vacancy concentration throughout the wafer is achieved nearly, if not immediately, upon achieving the annealing temperature. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). The resulting wafer will have a relatively uniform vacancy concentration (number density) profile in the wafer.

Based upon experimental evidence obtained to-date, the atmosphere in which the rapid thermal annealing step is carried out preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced, or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the wafer is decreased through this range of temperatures, the vacancies diffuse to the oxide layer 9 and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout wafer bulk 11 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near central plane 7 and the vacancy concentration decreasing in the direction of the front surface 3 and back surface 5 of the wafer. In general, the average cooling rate within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

In step $S_4$, the wafer is subjected to an oxygen precipitation heat-treatment. For example, the wafer may be annealed at a temperature of 800° C. for four hours and then at a temperature of 1000° C. for sixteen hours. Alternatively and preferably, the wafer is loaded into a furnace which is at a temperature of about 800° C. as the first step of an electronic device manufacturing process. When loaded into a furnace at this temperature, the previously rapidly thermal annealed wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed, whereas in the vacancy lean zone nothing happens. By dividing the wafer into various zones of vacancy concentration, a template is effectively created through which is written an oxygen precipitate pattern which is fixed the moment the wafer is loaded into the furnace.

As illustrated in FIG. 1, the resulting depth distribution of oxygen precipitates in the wafer is characterized by clear regions of oxygen precipitate-free material (denuded zones) 15 and 15' extending from the front surface 3 and back surface 5 to a depth t, t', respectively. Between the oxygen precipitate-free regions, 15 and 15', there is a region 17 which contains a substantially uniform density of oxygen precipitates.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with denuded zone depths of at least about 10, 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced.

While the rapid thermal treatments employed in this process of the present invention may result in the out-diffusion of a small amount of oxygen from the surface of the front and back surfaces of the wafer, the amount of out-diffusion is significantly less than what is observed in conventional processes for the formation of denuded zones. As a result, the ideal precipitating wafers of the present invention have a substantially uniform interstitial oxygen concentration as a function of distance from the silicon surface. For example, prior to the oxygen precipitation heat-treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat-treatments do not result in a substantial amount of oxygen outdiffusion from the heat-treated wafer. As a result, the concentration of interstitial oxygen in the denuded zone at distances more than several microns from the wafer surface will not significantly change as a consequence of the precipitation heat-treatment. For example, if the denuded zone of the wafer consists of the region of the wafer between the surface of the silicon and a distance, $D_1$ (which is at least about 10 micrometers) as measured from the front surface and toward the central plane, the oxygen concentration at a position within the denuded zone which is at a distance from the silicon surface equal to one-half of $D_1$ will typically be at least about 75% of the peak concentration of the interstitial oxygen concentration anywhere in the denuded zone. For some oxygen precipitation heat-treatments, the interstitial oxygen concentration at this position will be even greater, i.e., at least 85%, 90% or even 95% of the maximum oxygen concentration anywhere in the denuded zone.

In a second embodiment of the present invention, a non-nitriding atmosphere is used instead of the nitriding atmosphere used in the heating (rapid thermal annealing) and cooling steps of the first embodiment. Suitable non-nitriding atmospheres include argon, helium, neon, carbon dioxide, and other such non-oxidizing, non-nitriding elemental and compound gases, or mixtures of such gases. The non-nitriding atmosphere, like the nitriding atmosphere, may contain a relatively small partial pressure of oxygen, i.e., a partial pressure less than 0.01 atm. (10,000 ppma), more preferably less than 0.005 atm. (5,000 ppma), more preferably less than 0.002 atm. (2,000 ppma), and most preferably less than 0.001 atm. (1,000 ppma).

In a third embodiment of the present invention, step $S_1$ (the thermal oxidation step) is omitted and the starting wafer has no more than a native oxide layer. When such a wafer is annealed in a nitrogen atmosphere, however, the effect differs from that which is observed when a wafer having an oxide layer which is greater in thickness than a native oxide layer ("enhanced oxide layer") is annealed in nitrogen. When the wafer containing an enhanced oxide layer is annealed in a nitrogen atmosphere, a substantially uniform increase in the vacancy concentration is achieved throughout the wafer nearly, if not immediately, upon reaching the annealing temperature; furthermore, the vacancy concentration does not appear to significantly increase as a function of annealing time at a given annealing temperature. If the wafer lacks anything more than a native oxide layer and if the front and back surfaces of the wafer are annealed in nitrogen, however, the resulting wafer will have a vacancy concentration (number density) profile which is generally "U-shaped" for a cross-section of the wafer; that is, a maximum concentration will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer.

Experimental evidence further suggests that this difference in behavior for wafers having no more than a native oxide layer and wafers having an enhanced oxide layer can be avoided by including molecular oxygen or another oxidizing gas in the atmosphere. Stated another way, when wafers having no more than a native oxide are annealed in a nitrogen atmosphere containing a small partial pressure of oxygen, the wafer behaves the same as wafers having an enhanced oxide layer. Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step.

In accordance with the present invention, therefore, the atmosphere during the rapid thermal annealing step preferably contains a partial pressure of at least about 0.0001 atm. (100 ppma), more preferably a partial pressure of at least about 0.0002 atm. (200 ppma). For the reasons previously discussed, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

In other embodiments of the present invention, the front and back surfaces of the wafer may be exposed to different atmospheres, each of which may contain one or more nitriding or non-nitriding gases. For example, the back surface of the wafer may be exposed to a nitriding atmosphere as the front surface is exposed to a non-nitriding atmosphere. Alternatively, multiple wafers (e.g., 2, 3 or more wafers) may be simultaneously annealed while being stacked in face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon the side of the wafer at which the denuded zone is desired, e.g., front surface 3 of the wafer (see FIG. 1).

The starting material for the process of the present invention may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material.

Figure 15:
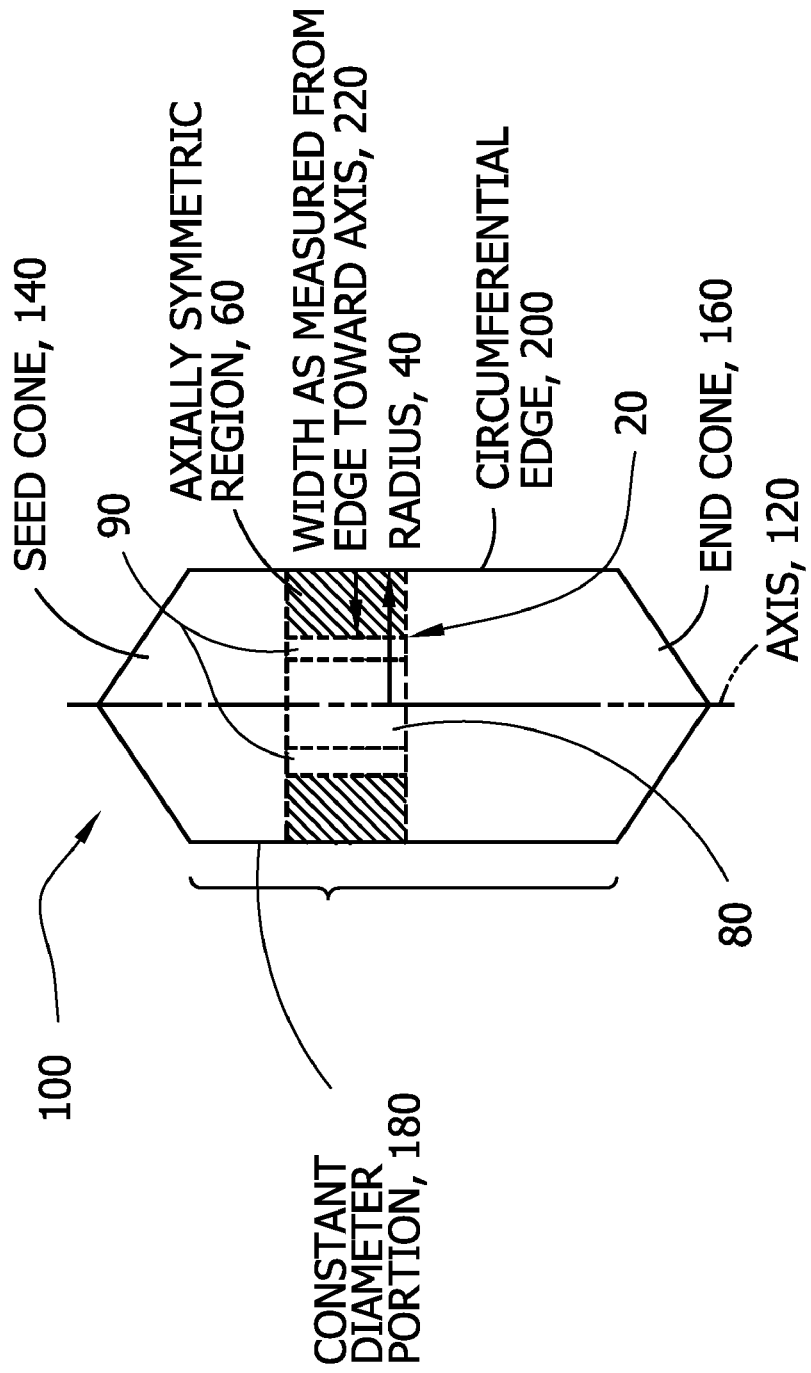
FIG. 15 is a longitudinal, cross-sectional view of a single crystal silicon ingot showing, in detail, an axially symmetric region of a constant diameter portion of the ingot.

More particularly, referring now to FIG. 15, such wafers may be obtained from a single crystal silicon ingot 100, grown in accordance with the Czochralski method, comprising a central axis 120, a seed-cone 140, an end-cone 160 and a constant diameter portion 180 between the seed-cone and the end-cone. The constant diameter portion has a circumferential edge 200 and a radius 40 extending from the central axis 120 to the circumferential edge 200. In addition, the ingot may contain an axially symmetric region of self-interstitial dominated material 60, which is substantially free of agglomerated intrinsic point defects, surrounding a generally cylindrical region of vacancy dominated material 80, a portion or all of which may also be substantially free of agglomerated intrinsic point defects; alternatively, the self-interstitial dominated region 60 may extend from center to edge, or the vacancy dominated region 80 may extend from center to edge.

In one embodiment, an axially symmetric region 90 has a width, as measured along the radius 40 extending from V/I boundary 20 to axis 120, which is at least about 15 mm in width, and preferably has a width which is at least about 7.5%, more preferably at least about 15%, still more preferably at least about 25%, and most preferably at least about 50% of the radius of the constant diameter portion of the ingot. In a particularly preferred embodiment, axially symmetric region 90 includes axis 120 of the ingot, i.e., the axially symmetric region 90 and the generally cylindrical region 80 coincide. Stated another way, ingot 100 includes a generally cylindrical region of vacancy dominated material 80, at least a portion of which is free of agglomerated defects. In addition, axially symmetric region 90 extends over a length of at least about 20%, preferably at least about 40%, more preferably at least about 60%, and still more preferably at least about 80% of the length of the constant diameter portion of the ingot.

In another embodiment, such wafers may be obtained from a single crystal silicon ingot 100 comprising an axially symmetric region 60 which generally has a width 220, as measured from circumferential edge 200 radially inward toward central axis 120, of at least about 30%, and in some embodiments at least about 40%, at least about 60%, or even at least about 80% of the radius of the constant diameter portion of the ingot. In addition, the axially symmetric region generally extends over a length 260 of at least about 20%, preferably at least about 40%, more preferably at least about 60%, and still more preferably at least about 80% of the length of the constant diameter portion of the ingot.

If an epitaxial layer is to be deposited upon an ideal precipitating wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example, by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

Preparation of Single Crystal Silicon Containing an Axially Symmetric Region

Based upon experimental evidence to date, it appears that the type and initial concentration of intrinsic point defects is initially determined as the ingot cools from the temperature of solidification (i.e., about 1410° C.) to a temperature greater than 1300° C. (i.e., at least about 1325° C., at least about 1350° C. or even at least about 1375° C.). That is, the type and initial concentration of these defects are controlled by the ratio $v/G_0$, where v is the growth velocity and $G_0$ is the average axial temperature gradient over this temperature range.

Figure 11:
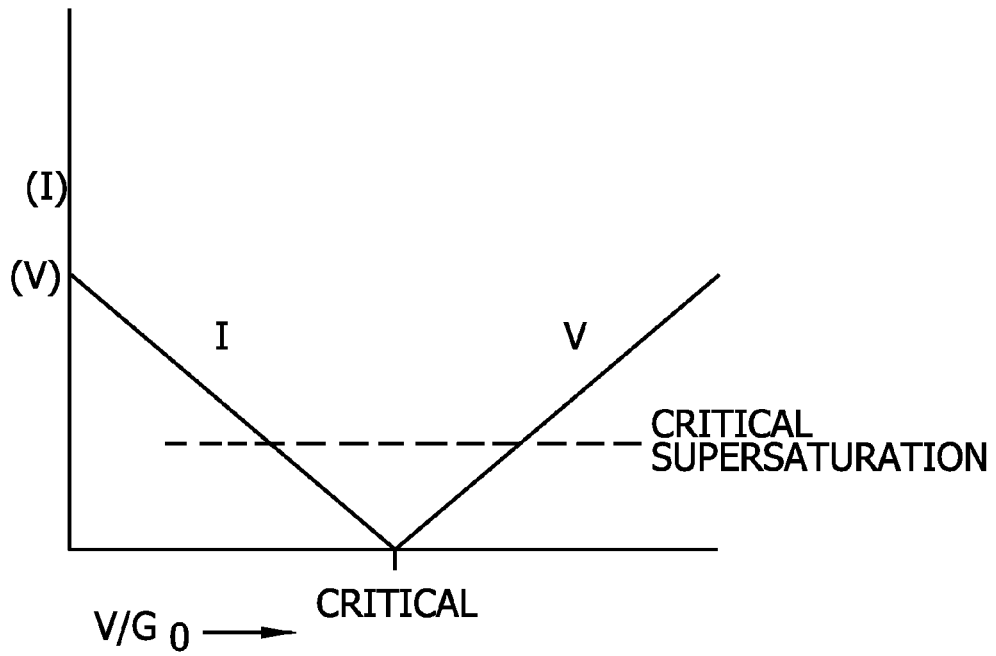
FIG. 11 is a graph which shows an example of how the initial concentration of self-interstitials, [I], and vacancies, [V], changes with an increase in the value of the ratio $v/G_0$, where v is the growth rate and $G_0$ is the average axial temperature gradient.

Referring to FIG. 11, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. At this critical value, the concentrations of these intrinsic point defects are at equilibrium.

As the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur. Agglomerated intrinsic point defects in silicon can severely impact the yield potential of the material in the production of complex and highly integrated circuits.

In accordance with the present invention, it has been discovered that the reactions in which vacancies within the silicon matrix react to produce agglomerated vacancy defects and in which self-interstitials within the silicon matrix react to produce agglomerated interstitial defects can be suppressed. Without being bound to any particular theory, it is believed that the concentration of vacancies and self-interstitials is controlled during the growth and cooling of the crystal ingot in the process of the present invention, such that the change in free energy of the system never exceeds a critical value at which the agglomeration reactions spontaneously occur to produce agglomerated vacancy or interstitial defects.

In general, the change in system free energy available to drive the reaction in which agglomerated vacancy defects are formed from vacancy point defects or agglomerated interstitial defects are formed from self-interstitial atoms in single crystal silicon is governed by Equation (1):

$$\Delta G_{V/I} = kT \ln\left(\frac{[V/I]}{[V/I]^{eq}}\right) \tag{1}$$

wherein $\Delta G_{V/I}$ is the change in free energy for the reaction which forms agglomerated vacancy defects or the reaction which forms the interstitial defects, as applicable, k is the Boltzmann constant, T is the temperature in K,

[V/I] is the concentration of vacancies or interstitials, as applicable, at a point in space and time in the single crystal silicon, and $[V/I]^{eq}$ is the equilibrium concentration of vacancies or interstitials, as applicable, at the same point in space and time at which [V/I] occurs and at the temperature, T.

According to this equation, for a given concentration of vacancies, [V], a decrease in the temperature, T, generally results in an increase in $\Delta G_V$ due to a sharp decrease in $[V]^{eq}$ with temperature. Similarly, for a given concentration of interstitials, [I], a decrease in the temperature, T, generally results in an increase in $\Delta G_I$ due to a sharp decrease in $[I]^{eq}$ with temperature.

Figure 12:
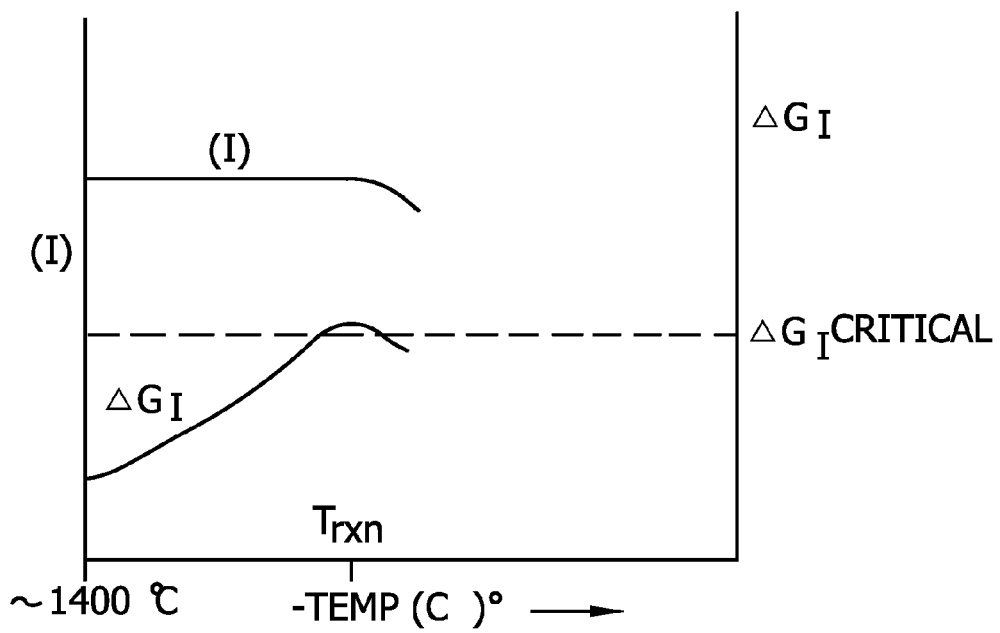
FIG. 12 is a graph which shows an example of how $\Delta G_f$, the change in free energy required for the formation of agglomerated interstitial defects, increases as the temperature, T, decreases, for a given initial concentration of self-interstitials, [I].

FIG. 12 schematically illustrates the change in $\Delta G_I$ and the concentration of silicon self-interstitials for an ingot which is cooled from the temperature of solidification without simultaneously employing some means for suppression of the concentration of silicon self-interstitials. As the ingot cools, $\Delta G_I$ increases according to Equation (1), due to the increasing supersaturation of [I], and the energy barrier for the formation of agglomerated interstitial defects is approached. As cooling continues, this energy barrier is eventually exceeded, at which point a reaction occurs. This reaction results in the formation of agglomerated interstitial defects and the concomitant decrease in $\Delta G_I$ as the supersaturated system is relaxed, i.e., as the concentration of [I] decreases.

Similarly, as an ingot is cooled from the temperature of solidification without simultaneously employing some means for suppression of the concentration of vacancies, $\Delta G_V$ increases according to Equation (1), due to the increasing supersaturation of [V], and the energy barrier for the formation of agglomerated vacancy defects is approached. As cooling continues, this energy barrier is eventually exceeded, at which point a reaction occurs. This reaction results in the formation of agglomerated vacancy defects and the concomitant decrease in $\Delta G_V$ as the supersaturated system is relaxed.

The agglomeration of vacancies and interstitials can be avoided in regions of vacancy and interstitial dominated material, respectively, as the ingot cools from the temperature of solidification by maintaining the free energy of the vacancy system and the interstitial system at values which are less than those at which agglomeration reactions occur. In other words, the system can be controlled so as to never become critically supersaturated in vacancies or interstitials. This can be achieved by establishing initial concentrations of vacancies and interstitials (controlled by $v/G_0(r)$ as hereinafter defined) which are sufficiently low such that critical supersaturation is never achieved. In practice, however, such concentrations are difficult to achieve across an entire crystal radius and, in general, therefore, critical supersaturation may be avoided by suppressing the initial vacancy concentration and the initial interstitial concentration subsequent to crystal solidification, i.e., subsequent to establishing the initial concentration determined by $v/G_0(r)$.

Surprisingly, it has been found that due to the relatively large mobility of self-interstitials, which is generally about $10^{-4}$ cm$^2$/second, and to a lesser extent, to the mobility of vacancies, it is possible to effect the suppression of interstitials and vacancies over relatively large distances, i.e. distances of about 5 cm to about 10 cm or more, by the radial diffusion of self-interstitials to sinks located at the crystal surface or to vacancy dominated regions located within the crystal. Radial diffusion can be effectively used to suppress the concentration of self-interstitials and vacancies, provided sufficient time is allowed for the radial diffusion of the initial concentration of intrinsic point defects. In general, the diffusion time will depend upon the radial variation in the initial concentration of self-interstitials and vacancies, with lesser radial variations requiring shorter diffusion times.

Figure 13:
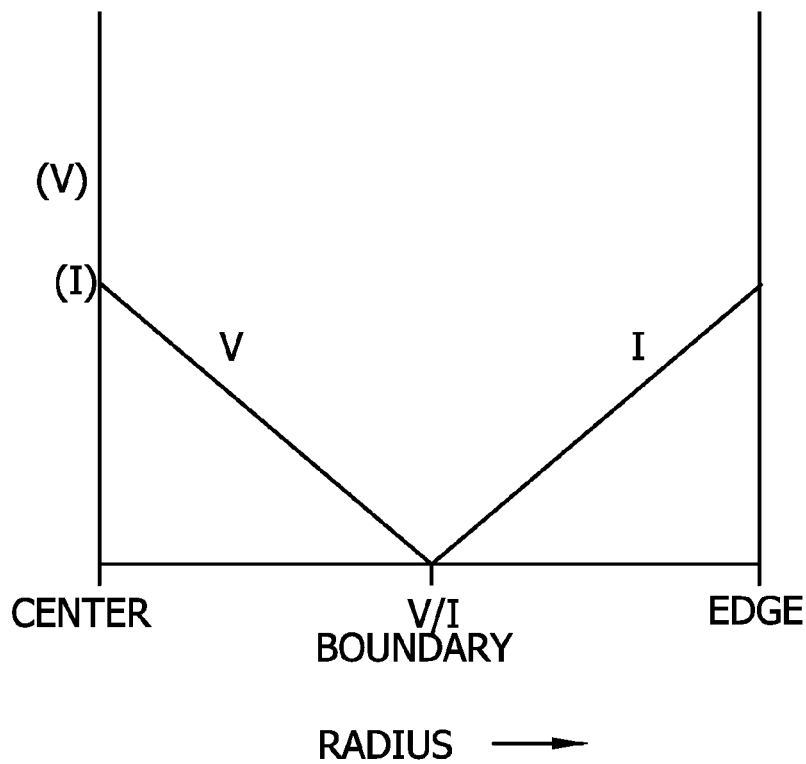
FIG. 13 is a graph which shows an example of how the initial concentration of self-interstitials, [I], and vacancies, [V], can change along the radius of an ingot or wafer, as the value of the ratio $v/G_0$ decreases, due to an increase in the value of $G_0$. Note that at the V/I boundary a transition occurs from vacancy dominated material to self-interstitial dominated material.
Figure 14:
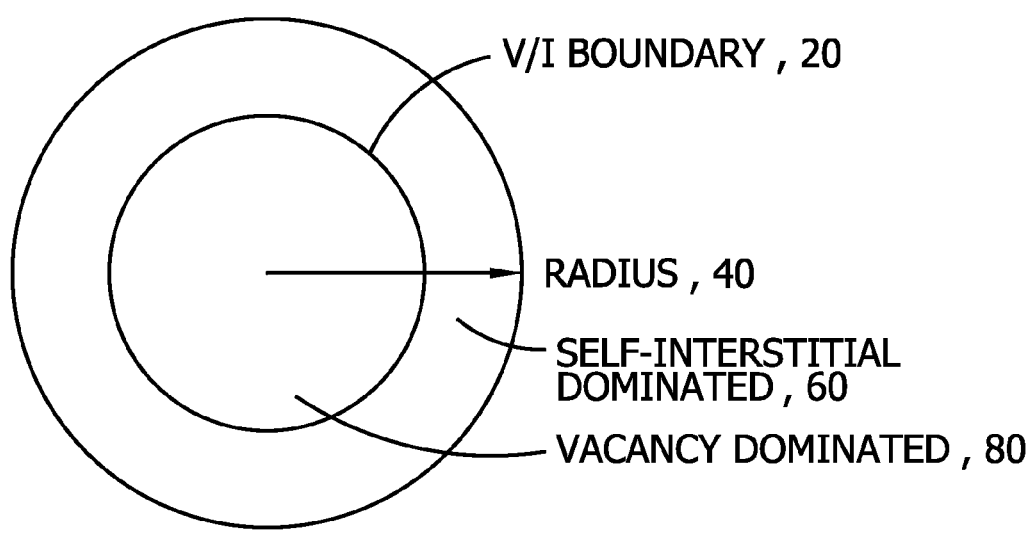
FIG. 14 is a top plan view of a single crystal silicon ingot or wafer showing regions of vacancy, V, and self-interstitial, I, dominated materials respectively, as well as the V/I boundary that exists between them.

Typically, the average axial temperature gradient, $G_0$, increases as a function of increasing radius for single crystal silicon, which is grown according to the Czochralski method. This means that the value of $v/G_0$ is typically not singular across the radius of an ingot. As a result of this variation, the type and initial concentration of intrinsic point defects is not constant. If the critical value of $v/G_0$, denoted in FIGS. 13 and 14 as the V/I boundary 20, is reached at some point along the radius 40 of the ingot, the material will switch from being vacancy dominated to self-interstitial dominated. In addition, the ingot will contain an axially symmetric region of self-interstitial dominated material 60 (in which the initial concentration of silicon self-interstitial atoms increases as a function of increasing radius), surrounding a generally cylindrical region of vacancy dominated material 80 (in which the initial concentration of vacancies decreases as a function of increasing radius).

As an ingot containing a V/I boundary is cooled from the temperature of solidification, radial diffusion of interstitial atoms and vacancies causes a radially inward shift in the V/I boundary due to a recombination of self-interstitials with vacancies. In addition, radial diffusion of self-interstitials to the surface of the crystal will occur as the crystal cools. The surface of the crystal is capable of maintaining near equilibrium point defect concentrations as the crystal cools. Radial diffusion of point defects will tend to reduce the self-interstitial concentration outside the V/I boundary and the vacancy concentration inside the V/I boundary. If enough time is allowed for diffusion, therefore, the concentration of vacancy and interstitials everywhere may be such that $\Delta G_V$ and $\Delta G_I$ will be less than the critical values at which the vacancy agglomeration reaction and the interstitial agglomeration reactions occur.

Referring again to FIG. 15, the crystal growth conditions, including growth velocity, v, the average axial temperature gradient, $G_0$, and the cooling rate are preferably controlled to cause the formation of a single crystal silicon ingot 100, as previously described. Preferably, these conditions are controlled to cause the formation of an axially symmetric region of interstitial dominated material 60 and a generally cylindrical region of vacancy dominated material 80, which may or may not contain an axially symmetric region of agglomerated intrinsic point defect-free material 90. When present, the axially symmetric region 90 has a width which may vary, as previously discussed; likewise, when present, the axially symmetric region 60 also has a width which may vary, as previously discussed.

The width of axially symmetric regions 60 and 90 may have some variation along the length of the central axis 120. For an axially symmetric region of a given length, therefore, the width 220 of axially symmetric region 60 is determined by measuring the distance from the circumferential edge 200 of the ingot 100 radially toward a point which is farthest from the central axis. In other words, the width is measured such that the minimum distance within the given length of the axially symmetric region 60 is determined. Similarly, the width of axially symmetric region 90 is determined by measuring the distance from the V/I boundary 20 radially toward a point which is farthest from the central axis 120. In other words, the width is measured such that the minimum distance within the given length of the axially symmetric region 90 is determined.

The growth velocity, v, and the average axial temperature gradient, $G_0$, (as previously defined) are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). Preferably, the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$). Most preferably, the ratio $v/G_0$ will range in value from about 0.75 to about 1.25 times the critical value of $v/G_0$ (i.e., about $1.6 \times 10^{-5}$ cm$^2$/sK to about $2.1 \times 10^{-5}$ cm$^2$/sK based upon currently available information for the critical value of $v/G_0$). In one particularly preferred embodiment, $v/G_0$ within the axially symmetric region 80 has a value falling between the critical value of $v/G_0$ and 1.1 times the critical value of $v/G_0$. In another particularly preferred embodiment, $v/G_0$ within the axially symmetric region 60 has a value falling between about 0.75 times the critical value of $v/G_0$ and the critical value of $v/G_0$.

To maximize the width of the axially symmetric regions 60 or 90, it is preferred that the ingot be cooled from the solidification temperature to a temperature in excess of about 1050° C. over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. Control of the cooling rate can be achieved by using any means currently known in the art for minimizing heat transfer, including the use of insulators, heaters, radiation shields, and magnetic fields.

Control of the average axial temperature gradient, $G_0$, may be achieved through the design of the "hot zone" of the crystal puller, i.e. the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed, $G_0$ may be further controlled by adjusting the power supplied to the heater. Any, or all, of these methods can be used during a batch Czochralski process in which melt volume is depleted during the process.

It is generally preferred for some embodiments of the present invention that the average axial temperature gradient, $G_0$, be relatively constant as a function of diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly effects the growth rate, v. In terms of process control, this means that it is favorable to have values for $G_0$ which differ over the radius of the ingot. Significant differences in the value of $G_0$, however, can result in a large concentration of self-interstitials generally increasing toward the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, more preferably, from about 0.3 mm/minute to about 0.5 mm/minute. It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible while still allowing for the formation of an axially symmetric region or regions in accordance with the present invention.

The amount of self-interstitial diffusion is controlled by controlling the cooling rate as the ingot is cooled from the solidification temperature (about 1410° C.) to the temperature at which silicon self-interstitials become immobile, for commercially practical purposes. Silicon self-interstitials appear to be extremely mobile at temperatures near the solidification temperature of silicon, i.e. about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski grown silicon. This is a consequence of the relatively narrow range of initial self-interstitial concentrations which are typically obtained in silicon grown according to the Czochralski method. In general, therefore, a self-interstitial agglomeration reaction may occur, if at all, at temperatures within the range of about 1100° C. to about 800° C., and typically at a temperature of about 1050° C.

Within the range of temperatures at which self-interstitials appear to be mobile, and depending upon the temperature in the hot zone, the cooling rate will typically range from about 0.1° C./minute to about 3° C./minute. Preferably, the cooling rate will range from about 0.1° C./minute to about 1.5° C./minute, more preferably from about 0.1° C./minute to about 1° C./minute, and still more preferably from about 0.1° C./minute to about 0.5° C./minute.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may therefore be suppressed, which act to prevent an agglomeration event from occurring.

Utilizing the diffusivity of interstitials by controlling the cooling rate acts to relax the otherwise stringent $v/G_0$ requirements that may be required in order to obtain an axially symmetric region free of agglomerated defects. Stated another way, as a result of the fact that the cooling rate may be controlled in order to allow interstitials more time to diffuse, a large range of $v/G_0$ values, relative to the critical value, are acceptable for purposes of obtaining an axially symmetric region free of agglomerated defects.

To achieve such cooling rates over appreciable lengths of the constant diameter portion of the crystal, consideration must also be given to the growth process of the end-cone of the ingot, as well as the treatment of the ingot once end-cone growth is complete. Typically, upon completion of the growth of the constant diameter portion of the ingot, the pull rate will be increased in order to begin the tapering necessary to form the end-cone. However, such an increase in pull rate will result in the lower segment of the constant diameter portion cooling more quickly within the temperature range in which interstitials are sufficiently mobile, as discussed above, As a result, these interstitials may not have sufficient time to diffuse to sinks to be annihilated; that is, the concentration in this lower segment may not be suppressed to a sufficient degree and agglomeration of interstitial defects may result.

In order to prevent the formation of such defects from occurring in this lower segment of the ingot, it is therefore preferred that constant diameter portion of the ingot have a uniform thermal history in accordance with the Czochralski method. A uniform thermal history may be achieved by pulling the ingot from the silicon melt at a relatively constant rate during the growth of not only the constant diameter portion, but also during the growth of the end-cone of the crystal and possibly subsequent to growth of the end-cone. The relatively constant rate may be achieved, for example, by (i) reducing the rates of rotation of the crucible and crystal during the growth of the end-cone relative to the crucible and crystal rotation rates during the growth of the constant diameter portion of the crystal, and/or (ii) increasing the power supplied to the heater used to heat the silicon melt during the growth of the end-cone relative to the power conventionally supplied during end-cone growth. These additional adjustments of the process variables may occur either individually or in combination.

When the growth of the end-cone is initiated, a pull rate for the end-cone is established such that, any segment of the constant diameter portion of the ingot which remains at a temperature in excess of about 1050° C. experiences the same thermal history as other segment(s) of the constant diameter portion of the ingot which contain an axially symmetric region free of agglomerated intrinsic point defects which have already cooled to a temperature of less than about 1050° C.

As previously noted, a minimum radius of the vacancy dominated region exists for which the suppression of agglomerated interstitial defects may be achieved. The value of the minimum radius depends on $v/G_0(r)$ and the cooling rate. As crystal puller and hot zone designs will vary, the ranges presented above for $v/G_0(r)$, pull rate, and cooling rate will also vary. Likewise these conditions may vary along the length of a growing crystal. Also as noted above, the width of the interstitial dominated region free of agglomerated interstitial defects is preferably maximized. Thus, it is desirable to maintain the width of this region to a value which is as close as possible to, without exceeding, the difference between the crystal radius and the minimum radius of the vacancy dominated region along the length of the growing crystal in a given crystal puller.

The optimum width of axially symmetric regions 60 and 90 and the required optimal crystal pulling rate profile for a given crystal puller hot zone design may be determined empirically. Generally speaking, this empirical approach involves first obtaining readily available data on the axial temperature profile for an ingot grown in a particular crystal puller, as well as the radial variations in the average axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

Figure 16:
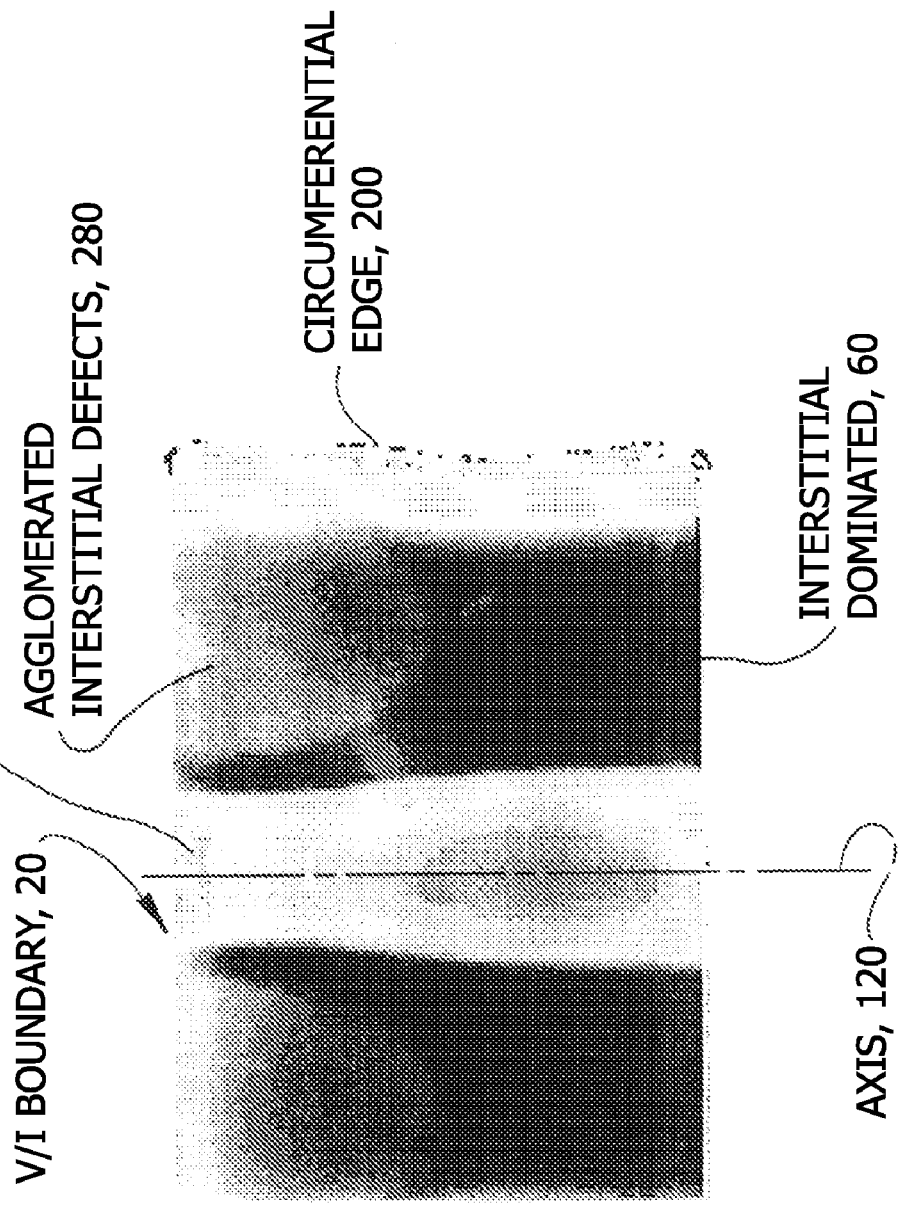
FIG. 16 is an image produced by a scan of the minority carrier lifetime of an axial cut of the ingot following a series of oxygen precipitation heat treatments, showing in detail a generally cylindrical region of vacancy dominated material, a generally annular shaped axially symmetric region of self-interstitial dominated material, the V/I boundary present between them, and a region of agglomerated interstitial defects.

FIG. 16 is an image produced by a scan of the minority carrier lifetime of an axial cut of a section of a 200 mm diameter ingot following a series of oxygen precipitation heat-treatments which reveal defect distribution patterns. It depicts an example in which a near-optimum pull rate profile is employed for a given crystal puller hot zone design. In this example, a transition occurs from a $v/G_0(r)$ at which the maximum width of the interstitial dominated region is exceeded (resulting in the generation of regions of agglomerated interstitial defects 280) to an optimum $v/G_0(r)$ at which the axially symmetric region has the maximum width.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments, or changes, in the pull rate in turn cause $v/G_0$ to vary over the length of the constant diameter portion of the ingot. In accordance with the process of the present invention, the pull rate is therefore controlled in order to maximize the width of the axially symmetric region of the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

Figure 34:
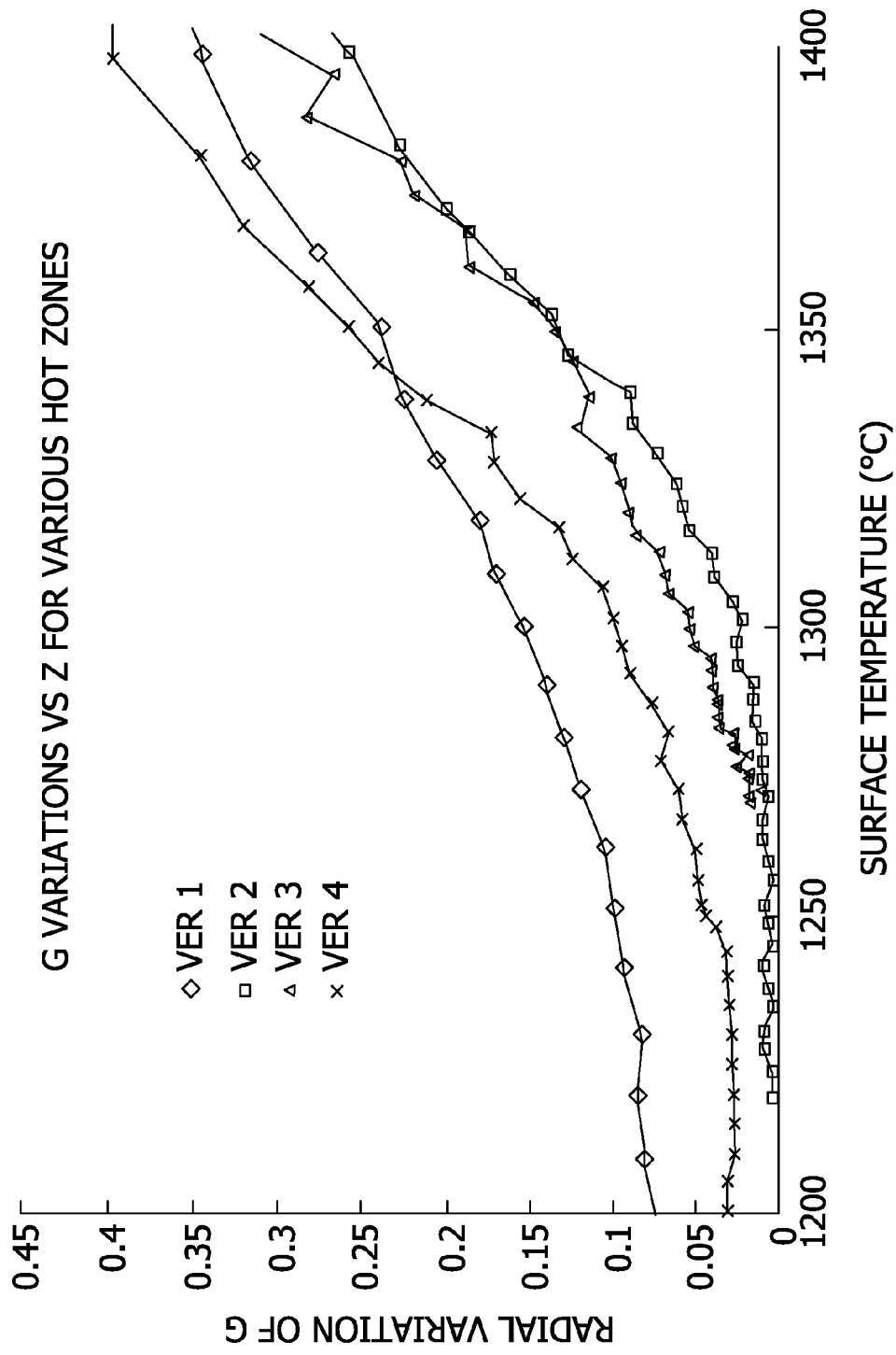
FIG. 34 is a graph illustrating the radial variations in the average axial temperature gradient, $G_0(r)$, which may occur in hot zones of various configurations.
Figure 35:
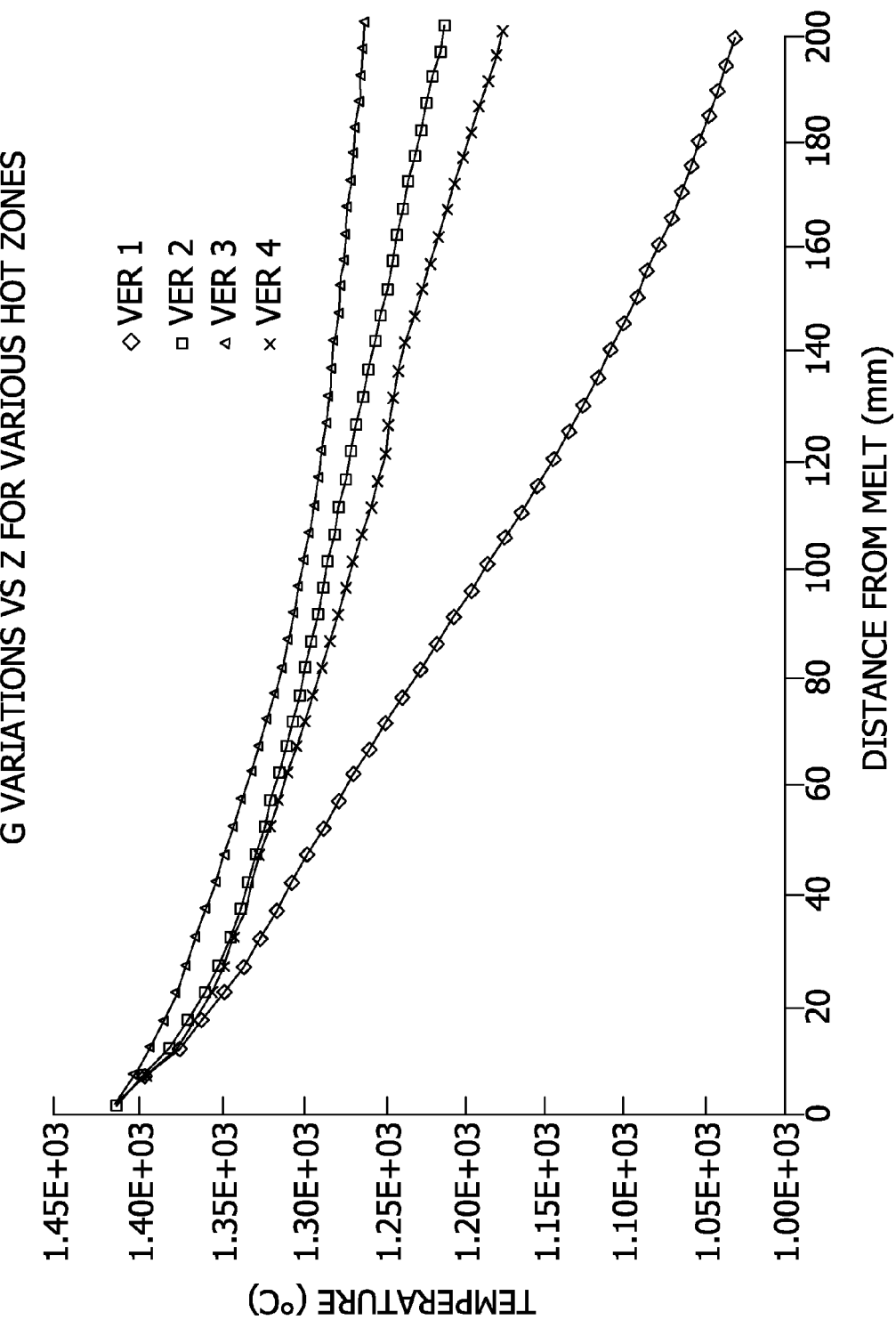
FIG. 35 is a graph illustrating the axial temperature profile for an ingot in four different hot zone configurations.

In general, it is easier to make vacancy dominated material free of agglomerated defects when radial variation of the axial temperature gradient, $G_0(r)$, is minimized. Referring to FIG. 35, axial temperature profile for four separate hot zone configurations are illustrated. FIG. 34 presents the variation in the axial temperature gradient, $G_0(r)$, from the center of the crystal to one-half of the crystal radius, determined by averaging the gradient from the solidification temperature to the temperature indicated on the x-axis. When crystals were pulled in hot zones designated as Ver. 1 and Ver. 4 which have larger radial variation in $G_0(r)$, it was not possible to obtain crystals having vacancy dominated material from center to edge of any axial length which was free of agglomerated defects. When crystals were pulled in hot zones designated as Ver. 2 and Ver. 3 which have lesser radial variation in $G_0(r)$, however, it was possible to obtain crystals having vacancy dominated material from center to edge which was free of agglomerated defects for some axial length of the crystal.

Figure 10:
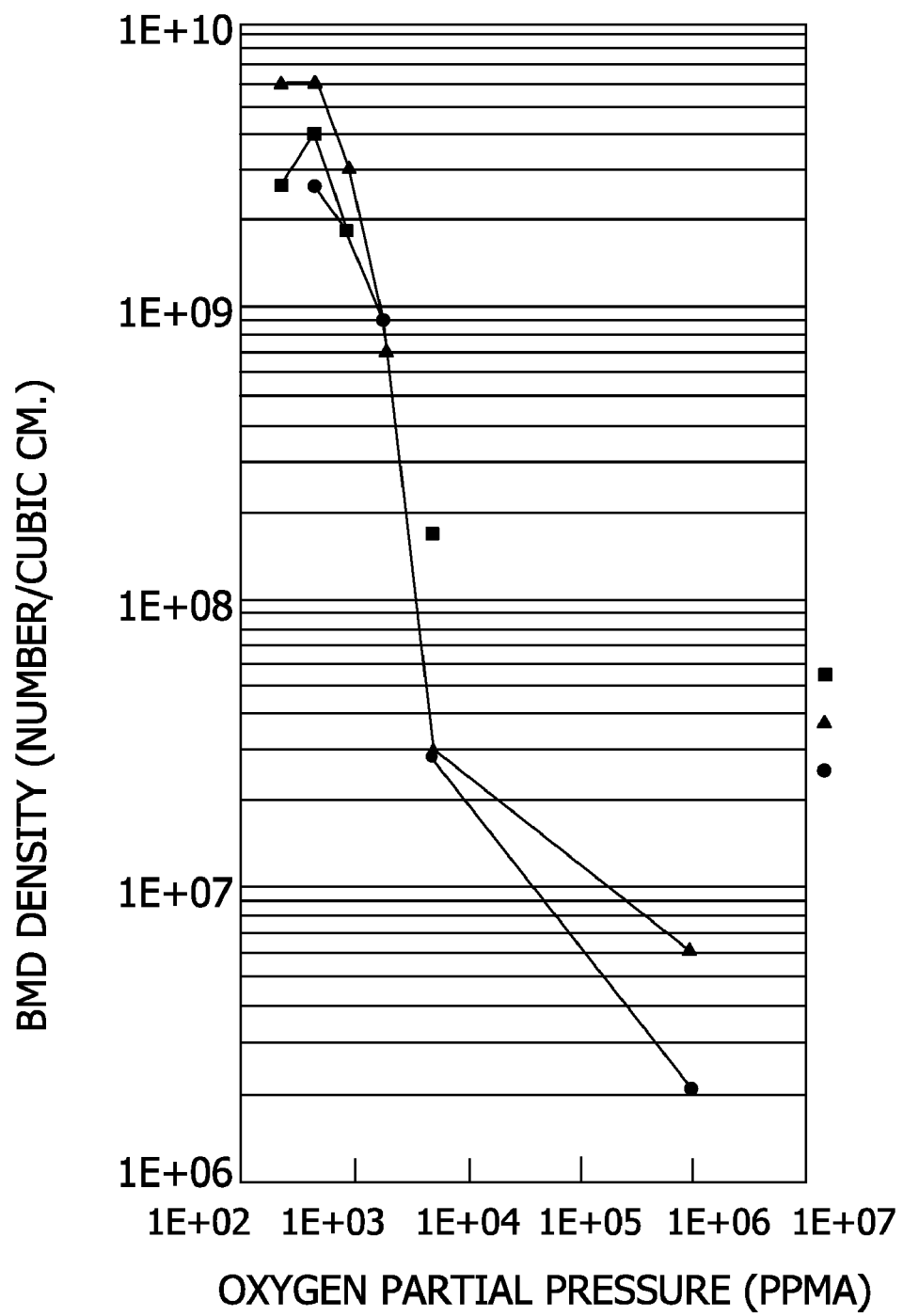
FIG. 10 is logarithmic graph of the number density of bulk microdefects (BMD) versus the partial pressure of oxygen present in the atmosphere during rapid thermal annealing of single crystal silicon wafers in accordance with the present invention, as described in Example 4.

In one embodiment of the process of the present invention, the initial concentration of silicon self-interstitial atoms is controlled in the axially symmetric, self-interstitial dominated region 60 of ingot 100. Referring again to FIG. 10, in general, the initial concentration of silicon self-interstitial atoms is controlled by controlling the crystal growth velocity, v, and the average axial temperature gradient, $G_0$, such that the value of the ratio $v/G_0$ is relatively near the critical value of this ratio, at which the V/I boundary occurs. In addition, the average axial temperature gradient, $G_0$, can be established such that the variation of $G_0$, i.e. $G_0(r)$, (and thus, $v/G_0(r)$) as a the variation of $G_0$ (and thus, $v/G_0$) as a function of the ingot radius is also controlled.

In another embodiment of the present invention, $V/G_0$ is controlled such that no V/I boundary exists along the radius for at least a portion of the length of the ingot. In this length, the silicon is vacancy dominated from center to circumferential edge and agglomerated vacancy defects are avoided in an axially symmetric region extending radially inward from the circumferential edge of the ingot principally by controlling $V/G_0$. That is, the growth conditions are controlled so that $v/G_0$ has a value falling between the critical value of $v/G_0$ and 1.1 times the critical value of $v/G_0$.

Visual Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit that other etching techniques.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

Definitions

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^3$ defects/$cm^3$; "V/I boundary" means the position along the radius of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

EXAMPLES

Examples 1 through 4 illustrate the ideal oxygen precipitation process of the present invention. Examples 5 through 11 illustrate the preparation of single crystal silicon containing an axially symmetric region of vacancy dominated material, self-interstitial dominated material, or both, which is substantially free of agglomerated intrinsic point defects, as previously discussed. All of these Examples should therefore not be interpreted in a limiting sense.

Ideal Oxygen Precipitation Process

Example 1

Silicon single crystals were pulled by the Czochralski method, sliced and polished to form silicon wafers. These wafers were then subjected to a surface oxidation step ($S_1$), rapid thermal annealing step in nitrogen or argon ($S_2$), rapidly cooled ($S_3$), and subjected to an oxygen stabilization and growth step ($S_4$) under the conditions set forth in Table I. The initial oxygen concentration of the wafers ($O_i$) before steps $S_1$-$S_4$, the oxygen precipitate density in the bulk of the wafers after step $S_4$ (OPD), and the depth of the denuded zone after step $S_4$ (DZ) are also reported in Table I.

TABLE I

| | Sample | | |
|---|---|---|---|
| | 4-7 | 4-8 | 3-14 |
| $S_1$ | 15 min at 1,000° C. in $N_2$ + ~1% $O_2$ | 15 min at 1,000° C. in $N_2$ + ~1% $O_2$ | none |
| $S_2$ | 35 seconds at 1250° C. in $N_2$ | 35 seconds at 1250° C. in Ar | 35 seconds at 1250° C. in $N_2$ |
| $S_3$ | 100° C./sec | 100° C./sec | 100° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm³) | $7 \times 10^{17}$ | $6.67 \times 10^{17}$ | $7.2 \times 10^{17}$ |
| OPD (atoms/cm³) | $1 \times 10^{10}$ | $4.4 \times 10^9$ | $1.69 \times 10^{10}$ |
| DZ (depth in μm) | 70 | 95 | 0 |

Figure 2:
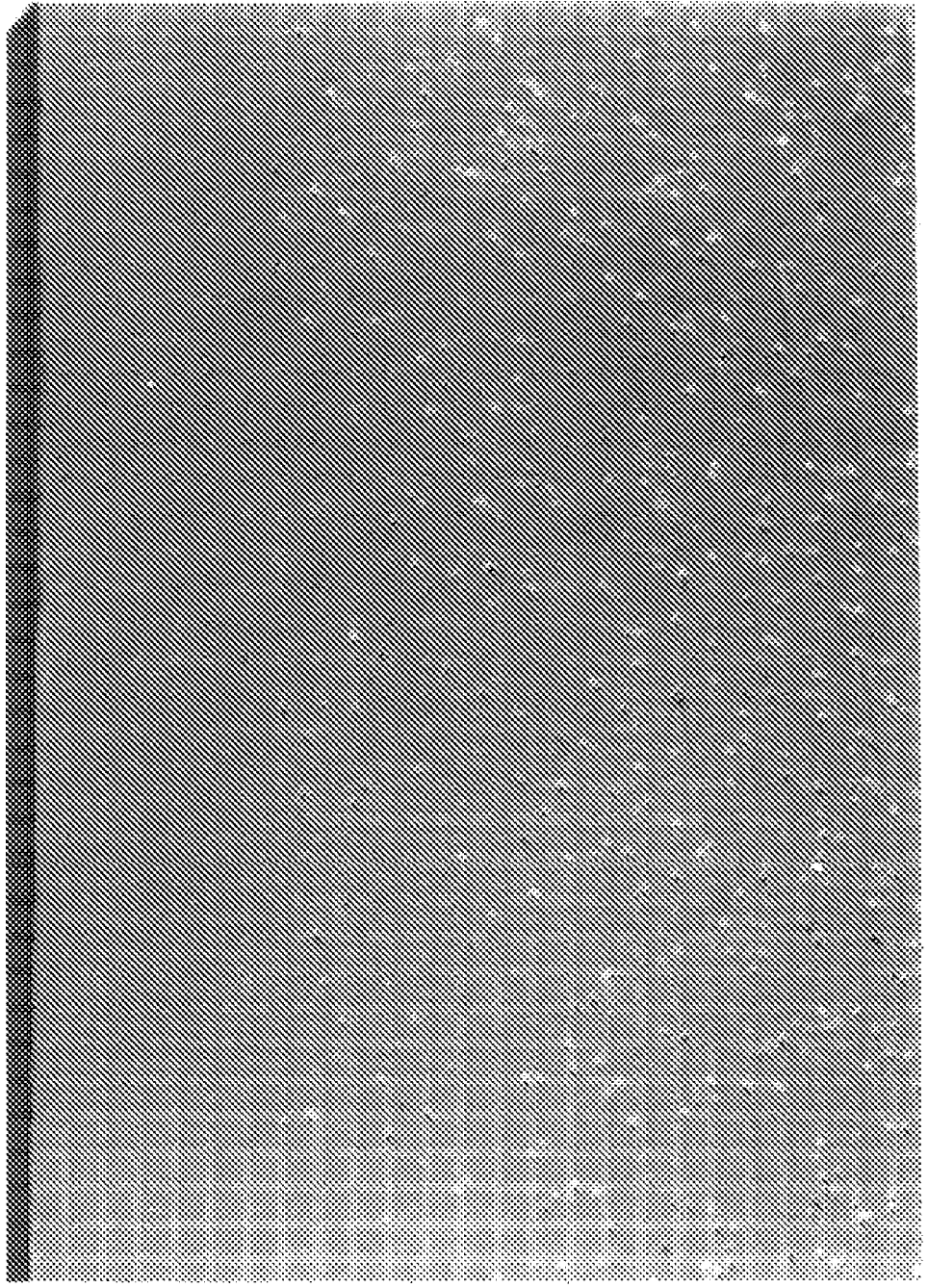
FIG. 2 is a photograph of a cross-section of a wafer (sample 4-7) which was processed as described in Example 1.
Figure 3:
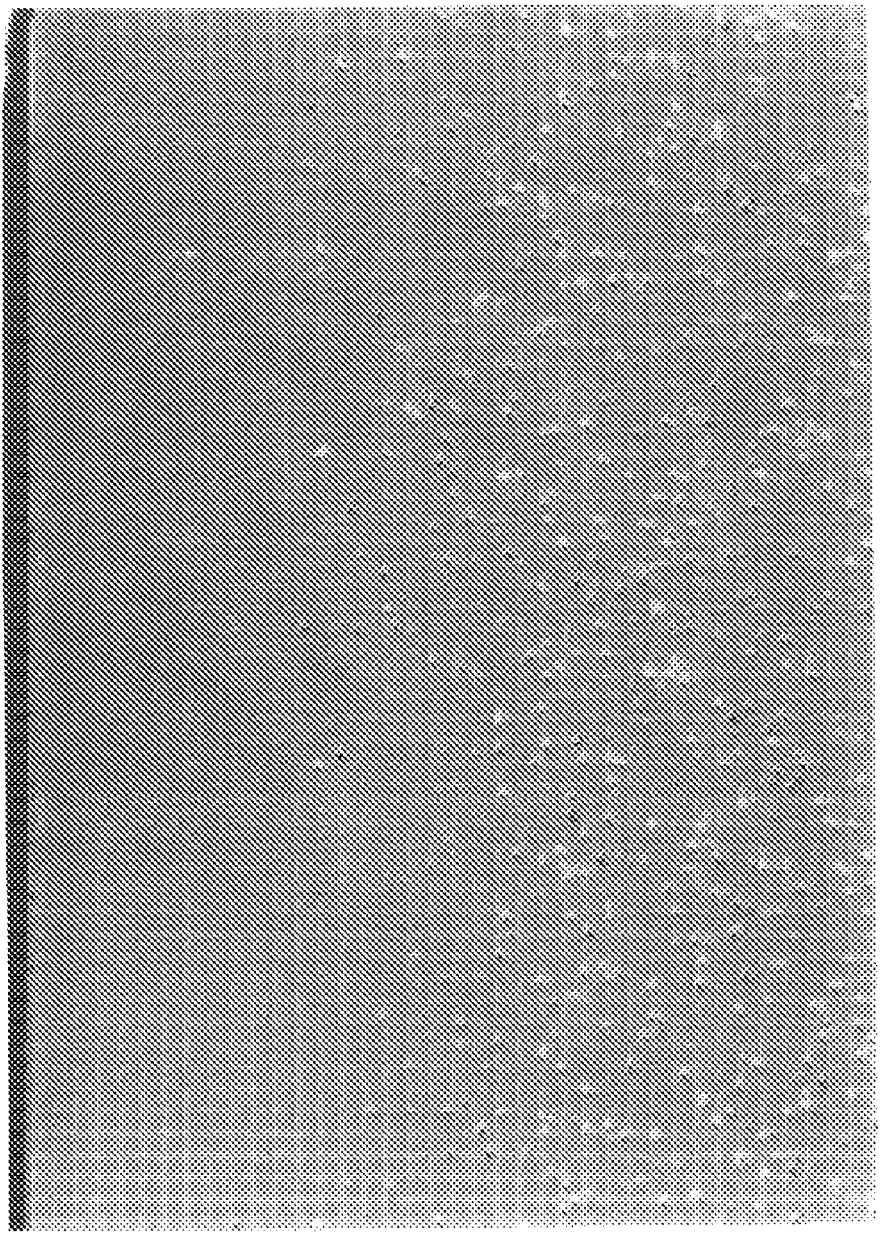
FIG. 3 is a photograph of a cross-section of a wafer (sample 4-8) which was subjected to the series of steps described in Example 1.
Figure 4:
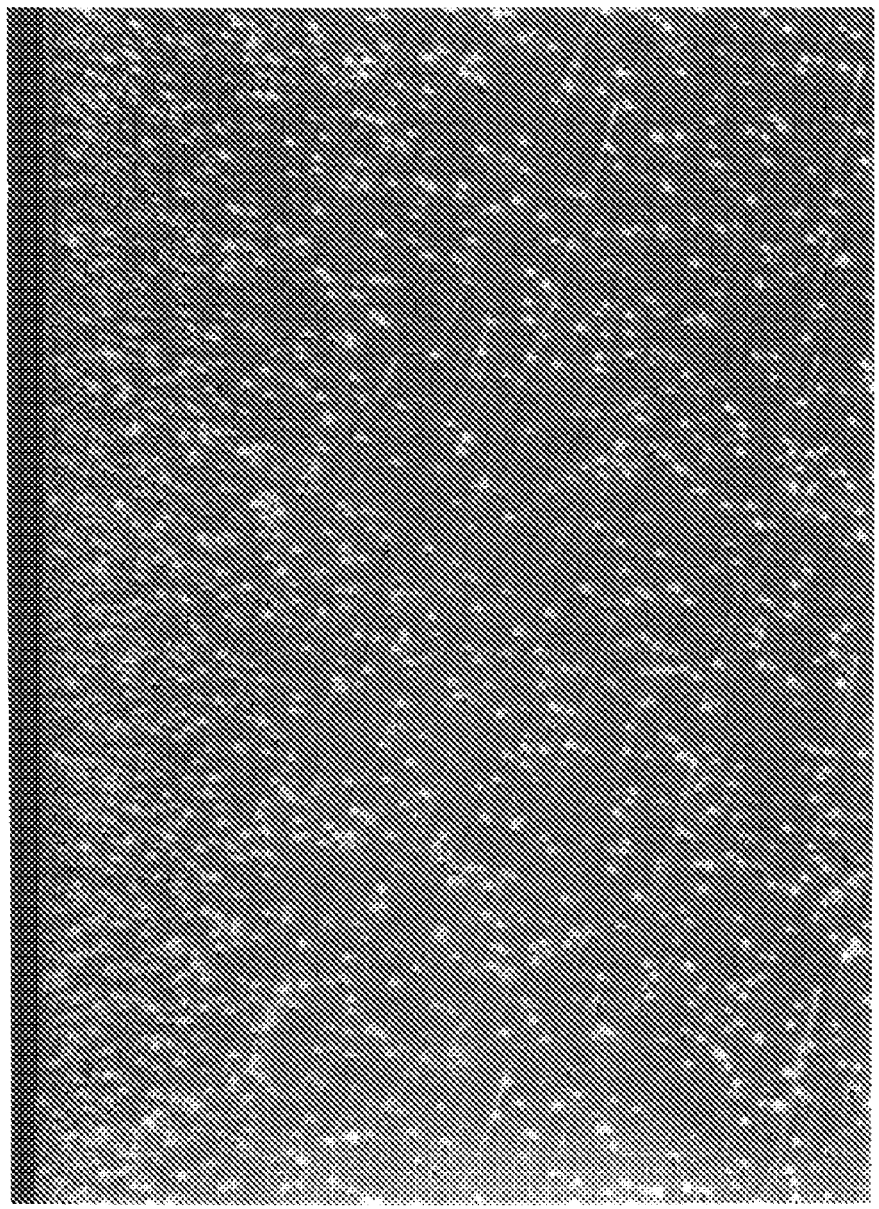
FIG. 4 is a photograph of a cross-section of a wafer (sample 3-14) which was subjected to the series of steps described in Example 1.

FIGS. 2, 3, and 4 show cross-sections of the resulting wafers (these figures are enlargements of photographs taken at a magnification of 200×); sample 4-7 is shown in FIG. 2, sample 4-8 is shown in FIG. 3, and sample 3-14 is shown in FIG. 4.

Figure 5:
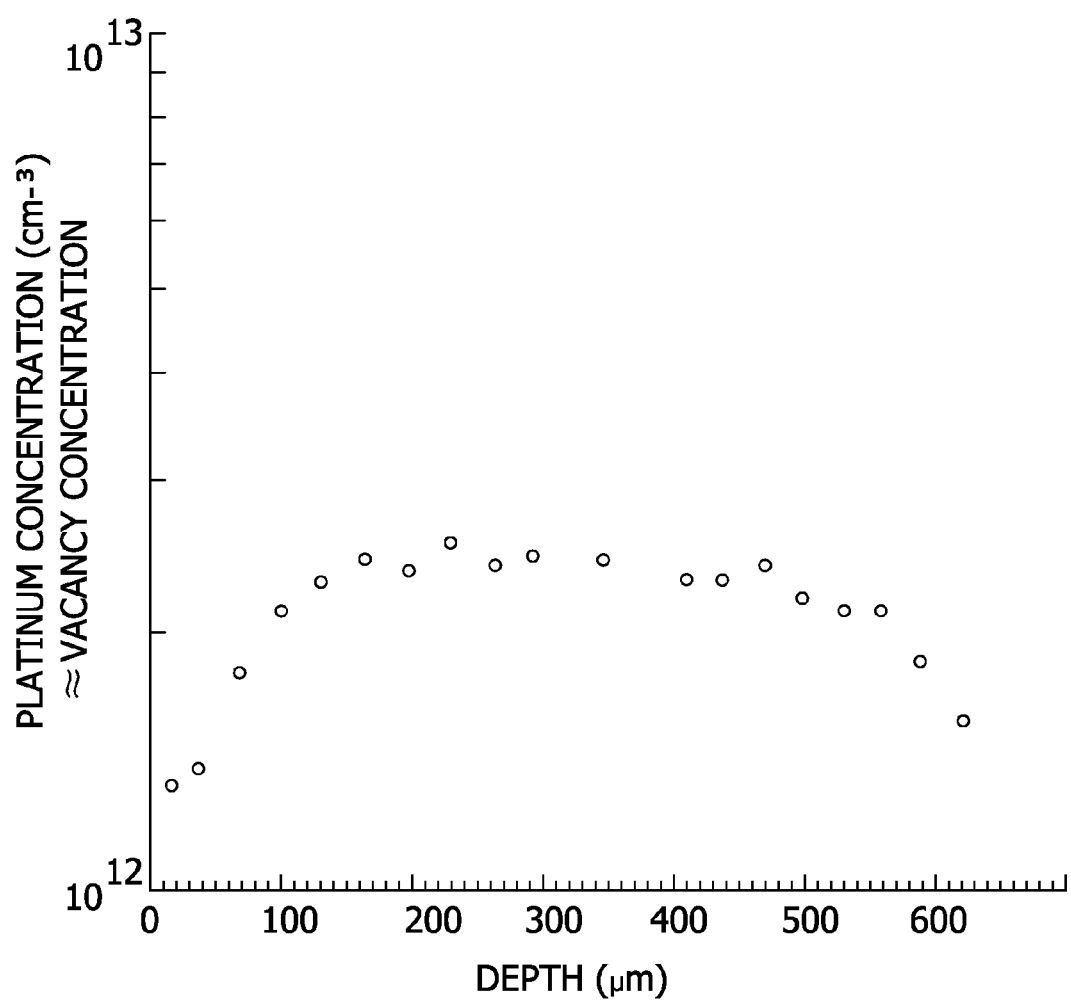
FIG. 5 is a graph of the log of platinum concentration (atoms/cm$^3$) versus depth from the surface of a wafer (sample 4-7) which was subjected to the series of steps set forth in Example 1.

In addition, the concentration of crystal lattice vacancies in the sample 4-7 was mapped using a platinum diffusion technique. A plot of platinum concentration versus depth from the surface of the wafer (a depth of 0 micrometers corresponding to the front side of the wafer) appears in FIG. 5.

Example 2

Figure 6:
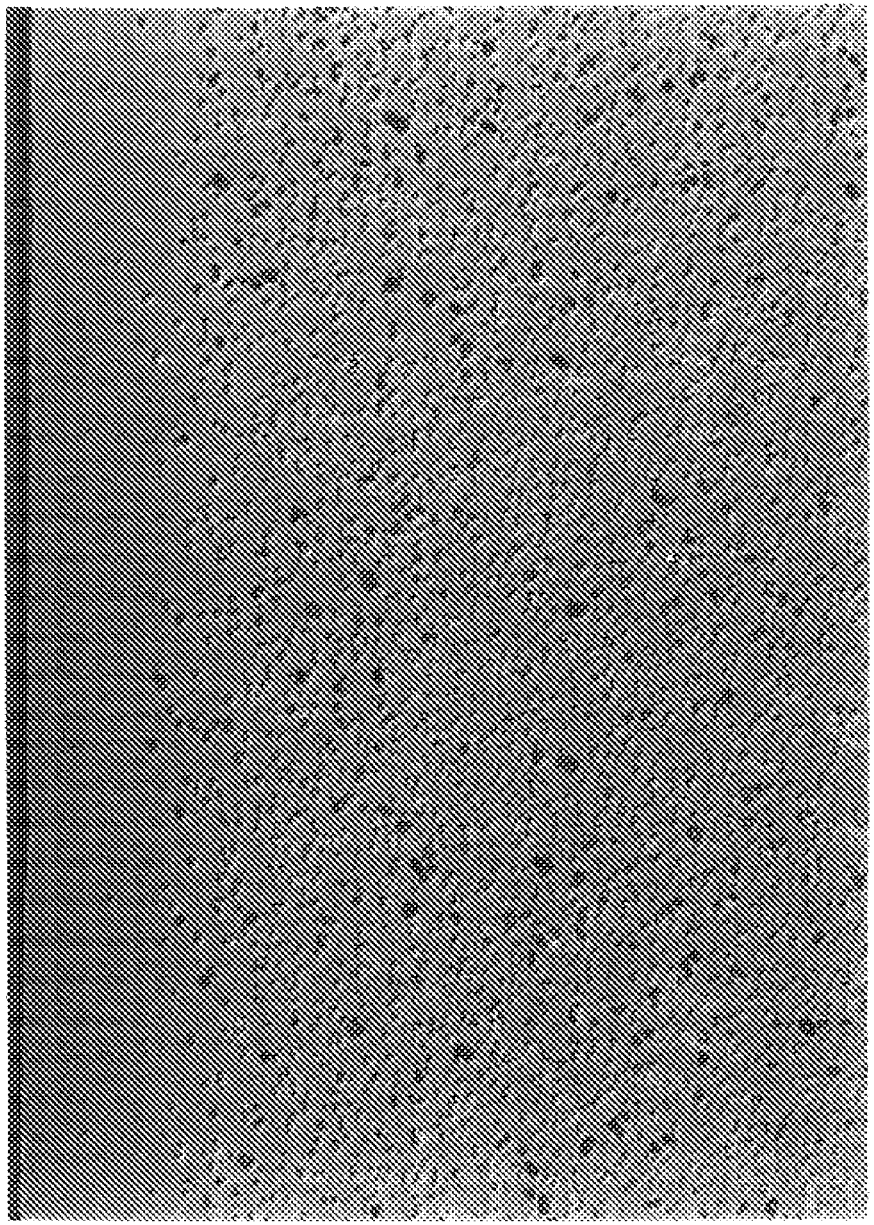
FIG. 6 is a photograph of a cross-section of a wafer (sample 3-4) which was subjected to the series of steps set forth in Example 2.
Figure 7:
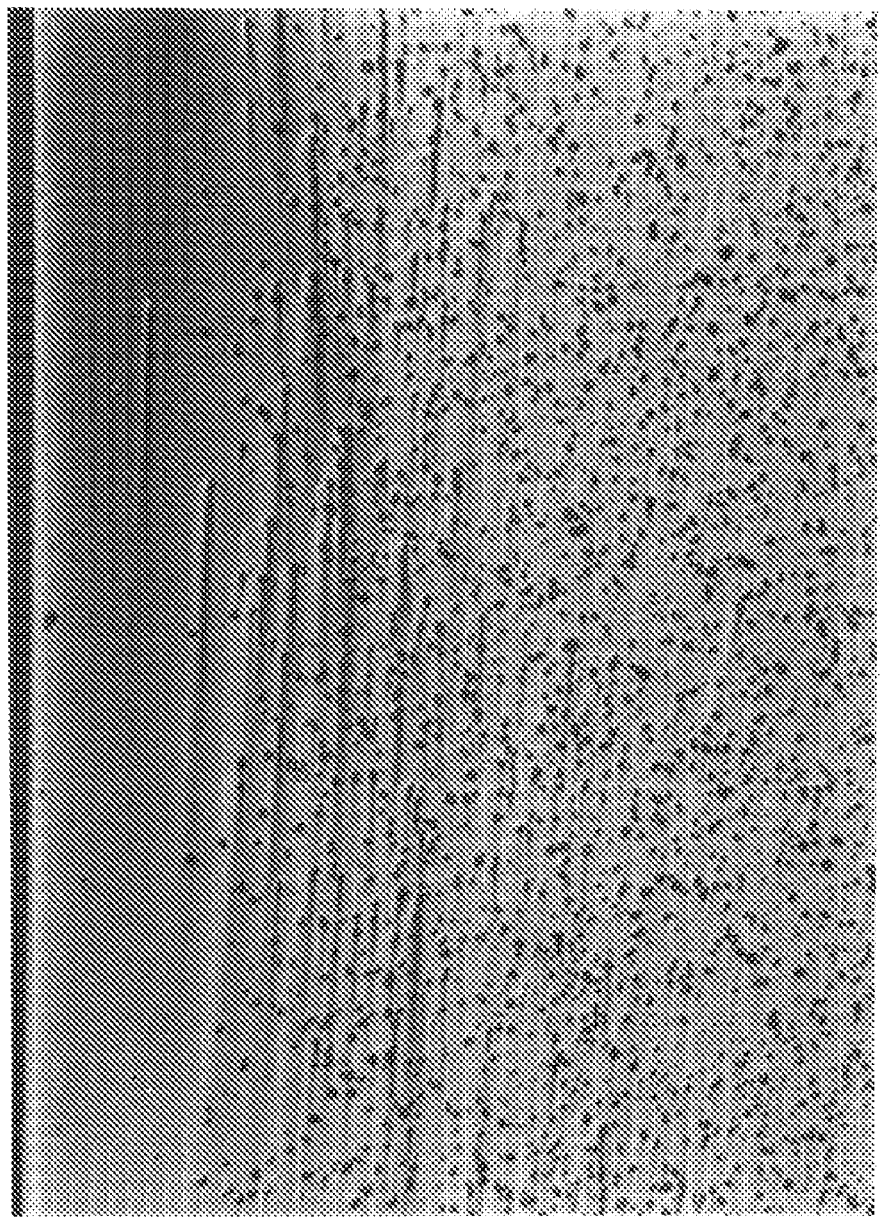
FIG. 7 is a photograph of a cross-section of a wafer (sample 3-5) which was subjected to the series of steps set forth in Example 2.
Figure 8:
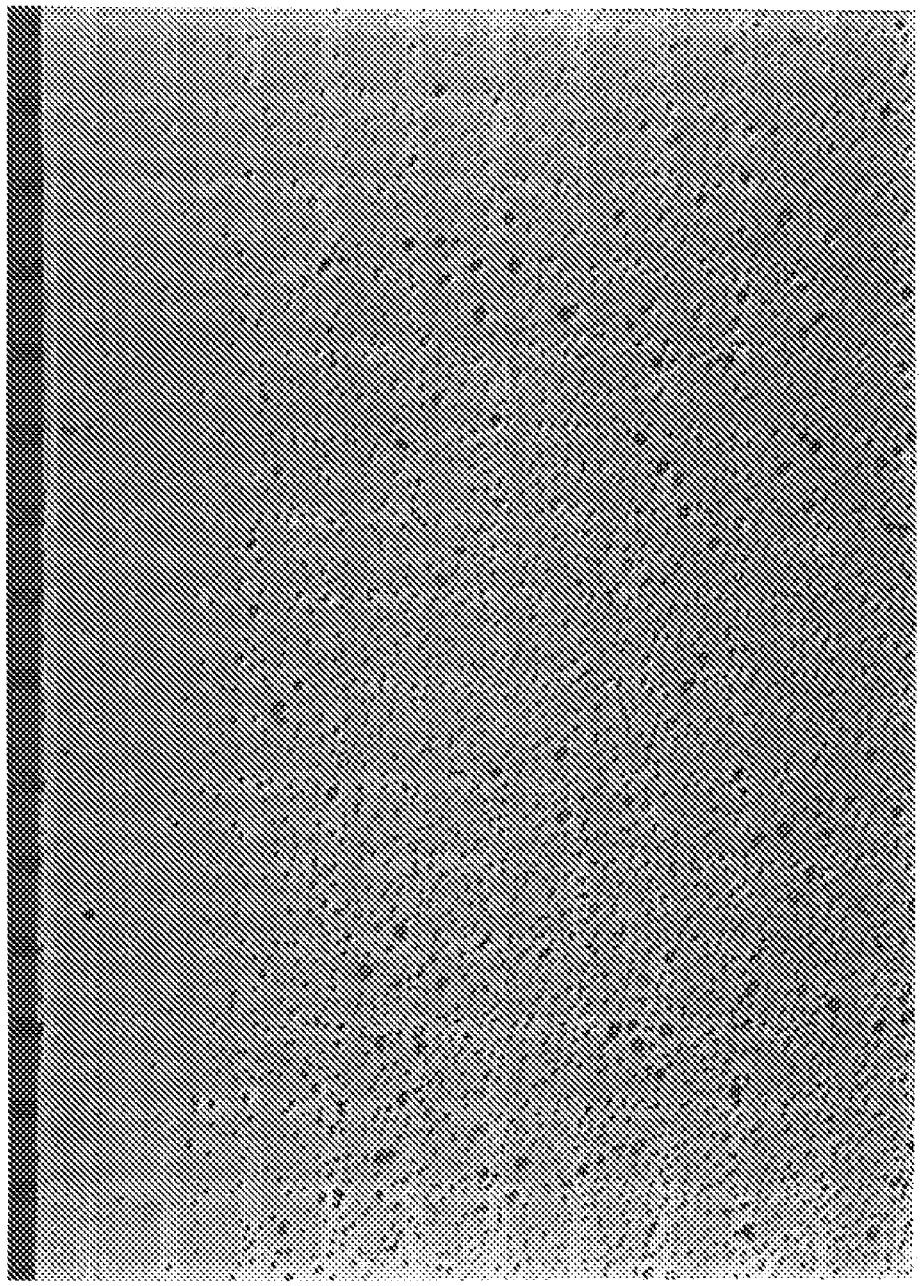
FIG. 8 is a photograph of a cross-section of a wafer (sample 3-6) which was subjected to the series of steps set forth in Example 2.

To demonstrate that the process of the present invention is relatively independent of oxygen concentration for Czochralski-grown silicon wafers, three wafers having different oxygen concentrations were subjected to the same series of steps described in Example 1. The conditions for each of these steps, the initial oxygen concentration of the wafers ($O_i$) before steps $S_1$-$S_4$, the oxygen precipitate density (OPD) in the bulk of the wafers after step $S_4$, and the depth of the denuded zone (DZ) after step $S_4$ as measured from the surface of the wafer are reported in Table II. FIGS. 6, 7, and 8 show cross-sections of the resulting wafers (these figures are enlargements of photographs taken at a magnification of 200×); sample 3-4 is shown in FIG. 6, sample is shown in FIG. 7, and sample 3-6 is shown in FIG. 8.

TABLE II

| | Sample | | |
|---|---|---|---|
| | 3-4 | 3-5 | 3-6 |
| $S_1$ | 15 min at 1,000° C. in $N_2$ + ~1% $O_2$ | 15 min at 1,000° C. in $N_2$ + ~1% $O_2$ | 15 min at 1,000° C. in $N_2$ + ~1% $O_2$ |
| $S_2$ | 35 seconds at 1250° C. in $N_2$ | 35 seconds at 1250° C. in Ar | 35 seconds at 1250° C. in $N_2$ |
| $S_3$ | 125° C./sec | 125° C./sec | 125° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm³) | $6 \times 10^{17}$ | $7 \times 10^{17}$ | $8 \times 10^{17}$ |
| OPD (atoms/cm³) | $4 \times 10^{10}$ | $1 \times 10^{10}$ | $6 \times 10^{10}$ |

TABLE II-continued

| | Sample | | |
|---|---|---|---|
| | 3-4 | 3-5 | 3-6 |
| DZ (depth in μm) | ~40 | ~40 | ~40 |

Example 3

Figure 9:
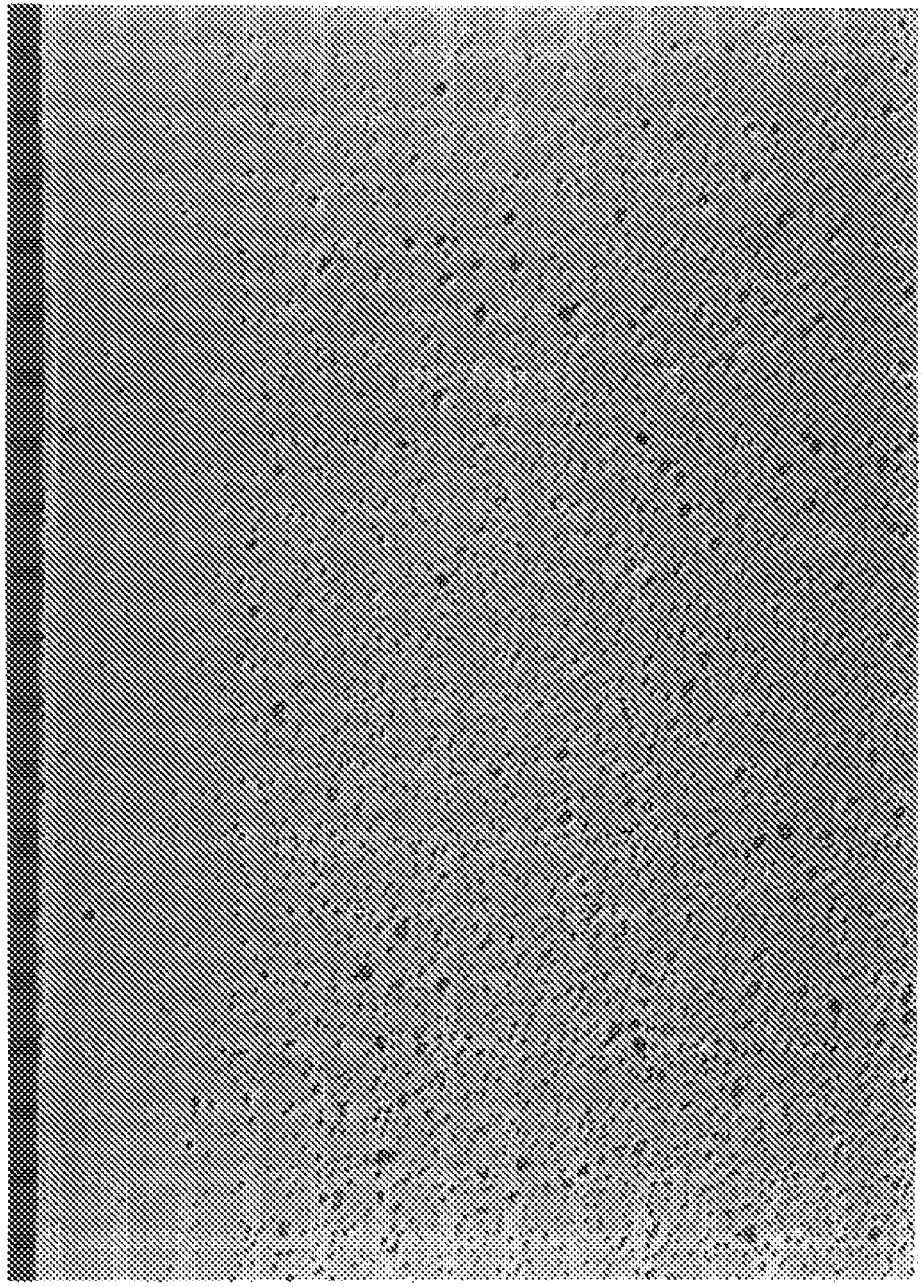
FIG. 9 is a photograph of a cross-section of a wafer (sample 1-8) which was subjected to the series of steps set forth in Example 3.

To demonstrate that the process of the present invention was relatively independent of the conditions used for the oxygen precipitate stabilization and growth step ($S_4$), a wafer (sample 1-8) having the same initial oxygen concentration was subjected to the same series of steps described in Example 2 for sample 3-4 except that a proprietary, commercial 16 Mb DRAM process was used as the oxygen precipitate stabilization and growth step ($S_4$). FIG. 9 shows a cross-section of the resulting wafer (this figure is an enlargement of a photograph taken at a magnification of 200×). After step $S_4$, samples 1-8 and 3-4 had comparable bulk oxygen precipitate densities ($7 \times 10^{10}$/cm³ for sample 1-8 versus $4 \times 10^{10}$/cm³ for sample 3-4) and comparable denuded zone depths (approximately 40 micrometers).

Example 4

This example illustrates the trend that may be observed in the density of bulk microdefects (BMD), i.e., the density of oxygen precipitants, and the depth of the denuded zone (DZ) resulting from an increase in the concentration of oxygen in the atmosphere during the heat-treatment. Three different sets of wafers were subjected to rapid thermal annealing under varying process conditions. The wafers in Set A were annealed at 1200° C. for 30 seconds under a nitrogen atmosphere; the wafers in Set B were annealed under the same conditions for 20 seconds; and, the wafers in Set C were annealed at 1200° C. for 30 seconds under an argon atmosphere. A pre-oxidation step was not performed on any of the wafers in the three sets in this Example.

As indicated by Table III, below, the oxygen partial pressure was increased for each wafer within a given Set. Once annealing was completed, the BMD density and DZ depth for each wafer was determined by means standard in the art. The results are present in Table III, below.

TABLE III

| Wafer Set | Oxygen Partial Pressure | BMD Density (defects/cm⁻³) | DZ Depth (microns) |
|---|---|---|---|
| A | 250 ppma | $6.14 \times 10^9$ | 70 |
| A | 500 ppma | $6.24 \times 10^9$ | 80 |
| A | 1000 ppma | $2.97 \times 10^9$ | 80 |
| A | 2000 ppma | $7.02 \times 10^8$ | 100 |
| A | 5000 ppma | $2.99 \times 10^7$ | ND |
| A | $1 \times 10^6$ ppma | $6.03 \times 10^6$ | ND |
| B | 500 ppma | $2.59 \times 10^9$ | 80 |
| B | 1000 ppma | $1.72 \times 10^9$ | 100 |
| B | 2000 ppma | $9.15 \times 10^8$ | 100 |
| B | 5000 ppma | $2.65 \times 10^7$ | ND |
| B | $1 \times 10^6$ ppma | $2.17 \times 10^6$ | ND |
| C | 250 ppma | $2.65 \times 10^9$ | 90 |
| C | 500 ppma | $4.03 \times 10^9$ | 70 |
| C | 1000 ppma | $1.72 \times 10^9$ | 140 |
| C | 5000 ppma | $1.69 \times 10^8$ | 120 |

ND = not determined

The above data shows that as the partial pressure of oxygen in the atmosphere increases, the number density of bulk microdefects decreases. In addition, when the oxygen partial pressure reaches 10,000 ppma, the number density of bulk microdefects is indistinguishable from the number density of bulk microdefects which is observed in wafers which have been subjected to an oxygen precipitation heat-treatment without a prior rapid thermal annealing in accordance with the present invention.

Single Crystal Silicon Containing an Axially Symmetric Region

Example 5

Figure 17:
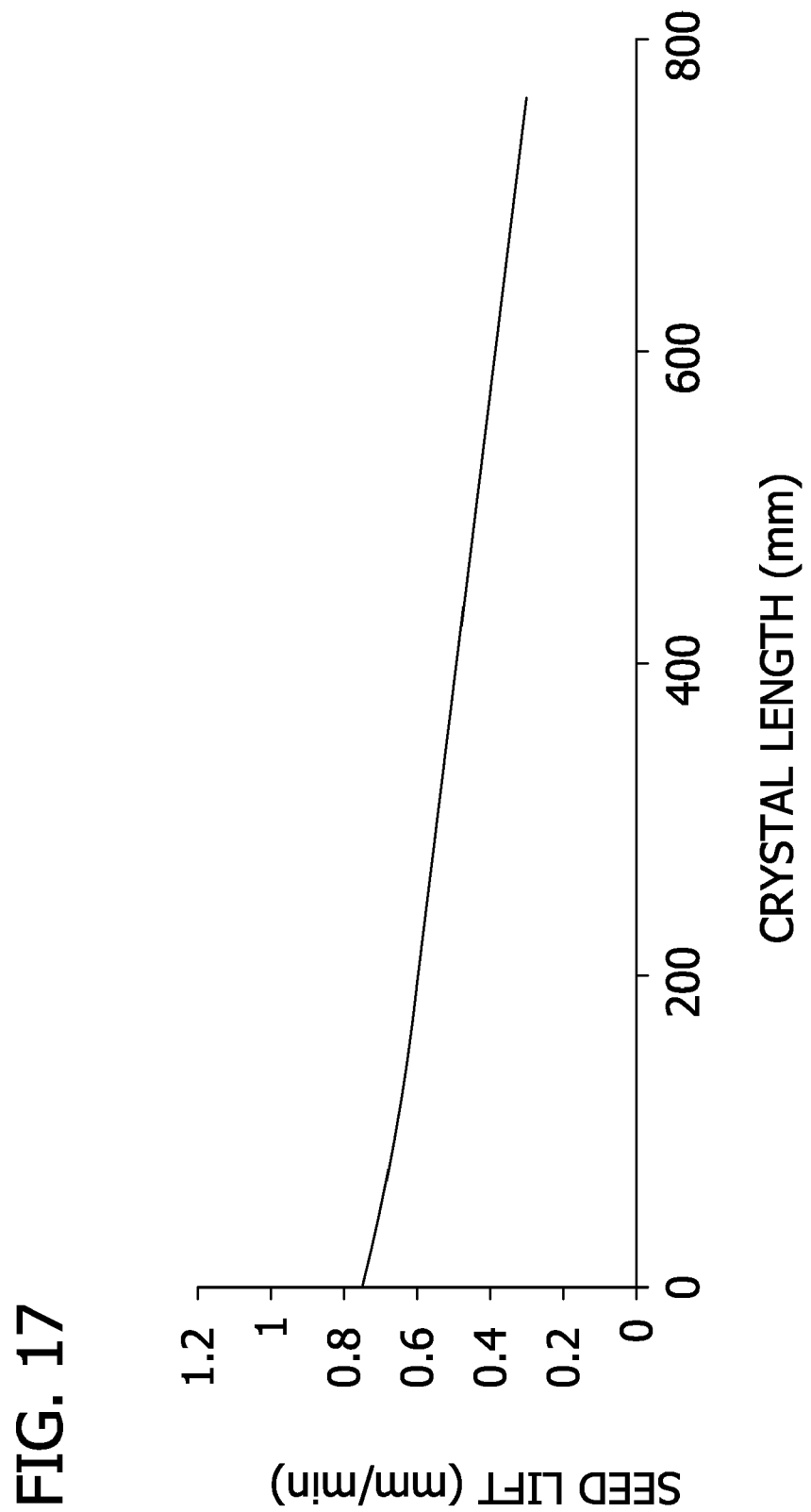
FIG. 17 is a graph of pull rate (i.e. seed lift) as a function of crystal length, showing how the pull rate is decreased linearly over a portion of the length of the crystal.

Optimization Procedure For A Crystal Puller Having A Pre-existing Hot Zone Design A first 200 mm single crystal silicon ingot was grown under conditions in which the pull rate was ramped linearly from about 0.75 mm/min. to about 0.35 mm/min. over the length of the crystal. FIG. 17 shows the pull rate as a function of crystal length. Taking into account the pre-established axial temperature profile of a growing 200 mm ingot in the crystal puller and the pre-established radial variations in the average axial temperature gradient, $G_0$, i.e., the axial temperature gradient at the melt/solid interface, these pull rates were selected to insure that ingot would be vacancy dominated material from the center to the edge at one end of the ingot and interstitial dominated material from the center to the edge of the other end of the ingot. The grown ingot was sliced longitudinally and analyzed to determine where the formation of agglomerated interstitial defects begins.

Figure 18:
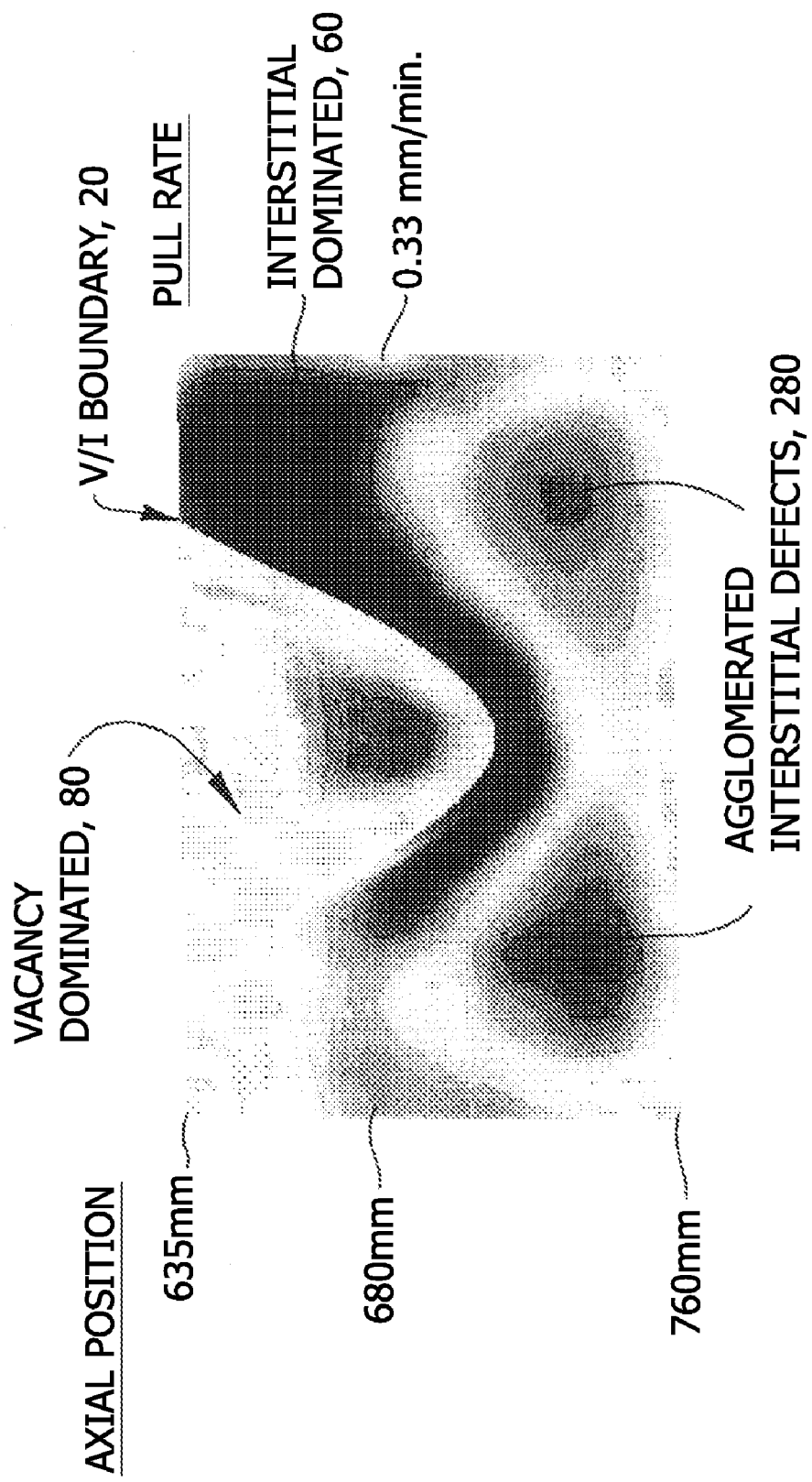
FIG. 18 is an image produced by a scan of the minority carrier lifetime of an axial cut of the ingot following a series of oxygen precipitation heat treatments, as described in Example 5.

FIG. 18 is an image produced by a scan of the minority carrier lifetime of an axial cut of the ingot over a section ranging from about 635 mm to about 760 mm from the shoulder of the ingot following a series of oxygen precipitation heat-treatments which reveal defect distribution patterns. At a crystal position of about 680 mm, a band of agglomerated interstitial defects 280 can be seen. This position corresponds to a critical pull rate of v* (680 mm)=0.33 mm/min. At this point, the width of the axially symmetric region 60 (a region which is interstitial dominated material but which lacks agglomerated interstitial defects) is at its maximum; the width of the vacancy dominated region 80, $R_v$* (680) is about 35 mm and the width of the axially symmetric region, $R_I$* (680) is about 65 mm.

Figure 19:
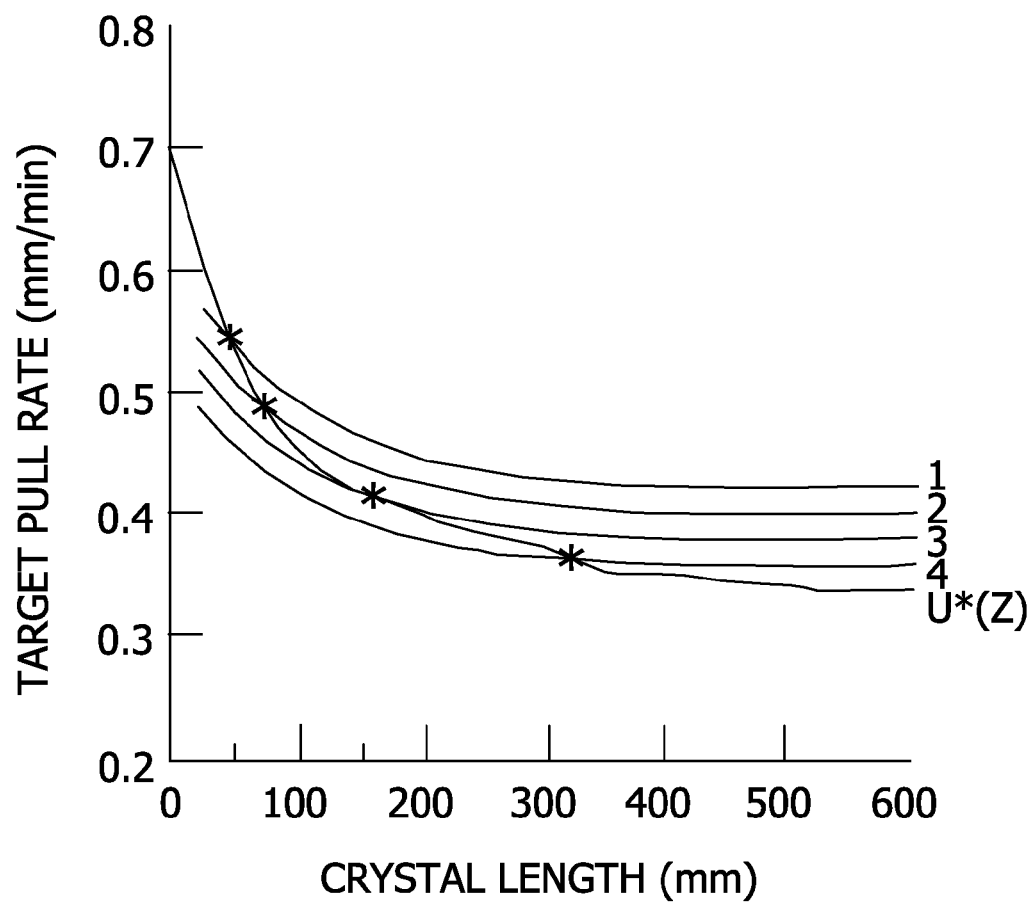
FIG. 19 is a graph of pull rate as a function of crystal length for each of four single crystal silicon ingots, labeled 1-4 respectively, which are used to yield a curve, labeled v*(Z), as described in Example 5.

A series of four single crystal silicon ingots were then grown at steady state pull rates which were somewhat greater than and somewhat less than the pull rate at which the maximum width of the axially symmetric region of the first 200 mm ingot was obtained. FIG. 19 shows the pull rate as a function of crystal length for each of the four crystals, labeled, respectively, as 1-4. These four crystals were then analyzed to determine the axial position (and corresponding pull rate) at which agglomerated interstitial defects first appear or disappear. These four empirically determined points (marked "*") are shown in FIG. 19. Interpolation between and extrapolation from these points yielded a curve, labeled v* (Z) in FIG. 19. This curve represents, to a first approximation, the pull rate for 200 mm crystals as a function of length in the crystal puller at which the axially symmetric region is at its maximum width.

Growth of additional crystals at other pull rates and further analysis of these crystals would further refine the empirical definition of v* (Z).

Example 6

Reduction of Radial Variation in $G_0(r)$

Figure 20:
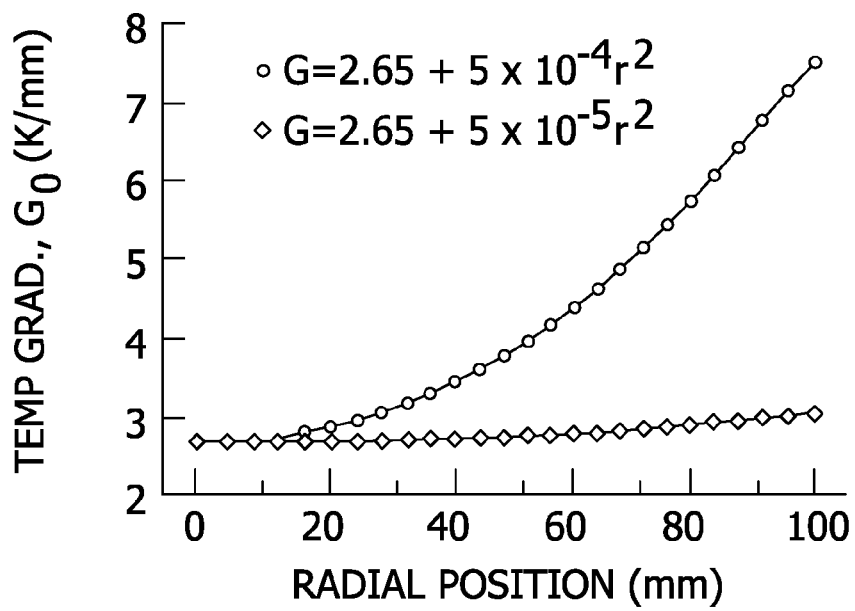
FIG. 20 is a graph of the average axial temperature gradient at the melt/solid interface, $G_0$, as a function of radial position, for two different cases as described in Example 6.
Figure 21:
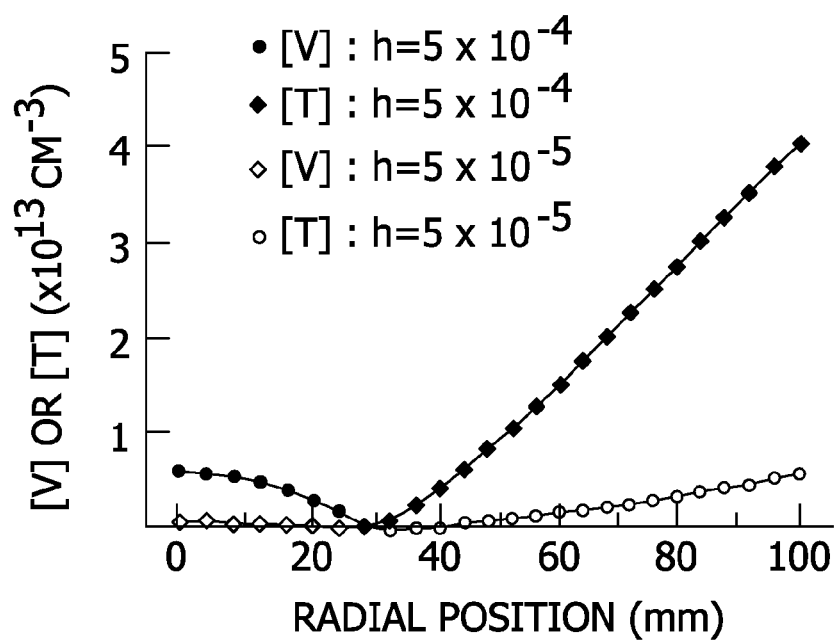
FIG. 21 is a graph of the initial concentration of vacancies, [V], or self-interstitials, [I], as a function of radial position, for two different cases as described Example 6.

FIGS. 20 and 21 illustrate the improvement in quality that can be achieved by reduction of the radial variation in the axial temperature gradient at the melt/solid interface, $G_0(r)$. The initial concentration (about 1 cm from the melt/solid interface) of vacancies and interstitials are calculated for two cases with different $G_0(r)$: (1) $G_0(r)=2.65+5\times10^{-4}r^2$ (K/mm) and (2) $G_0(r)=2.65+5\times10^{-5}r^2$ (K/mm). For each case the pull rate was adjusted such that the boundary between vacancy-rich silicon and interstitial-rich silicon is at a radius of 3 cm. The pull rate used for case 1 and 2 were 0.4 and 0.35 mm/min, respectively. From FIG. 21 it is clear that the initial concentration of interstitials in the interstitial-rich portion of the crystal is dramatically reduced as the radial variation in the initial axial temperature gradient is reduced. This leads to an improvement in the quality of the material since it becomes easier to avoid the formation of interstitial defect clusters due to supersaturation of interstitials.

Example 7

Increased Out-Diffusion Time for Interstitials

Figure 22:
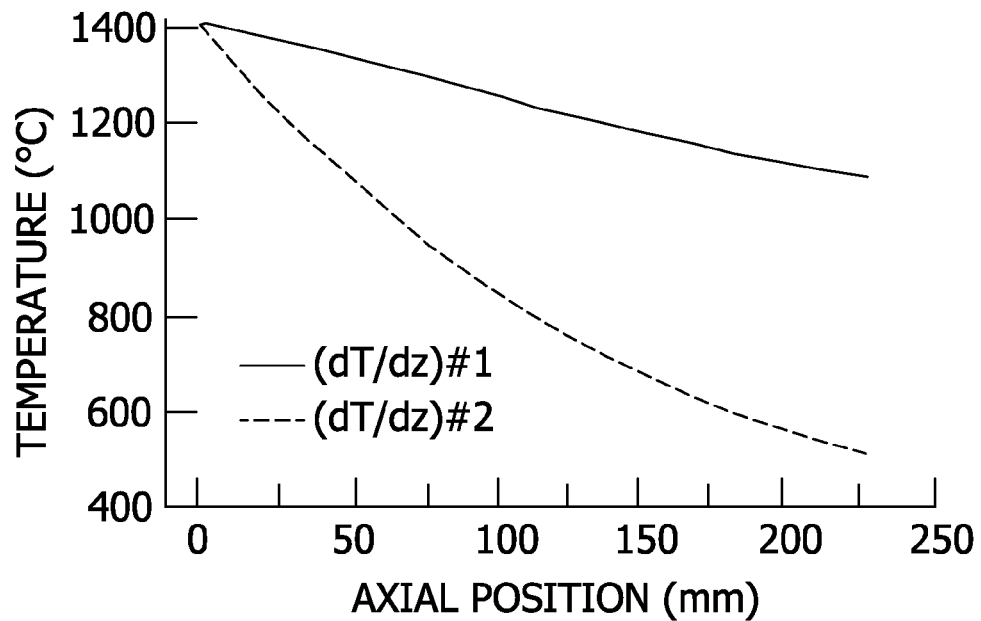
FIG. 22 is a graph of temperature as a function of axial position, showing the axial temperature profile in ingots for two different cases as described in Example 7.
Figure 23:
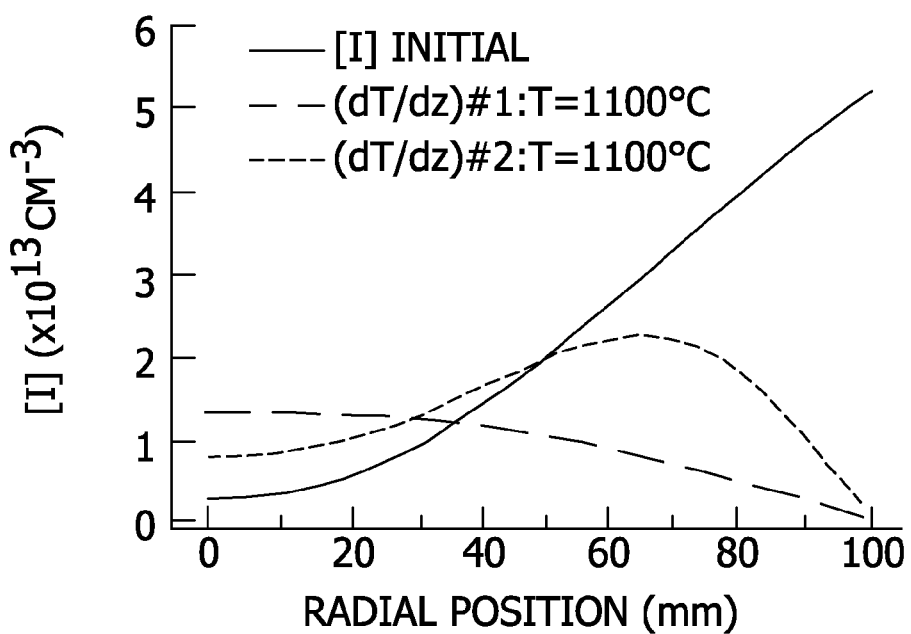
FIG. 23 is a graph of the self-interstitial concentrations resulting from the two cooling conditions illustrated in FIG. 22 and as more fully described in Example 7.

FIGS. 22 and 23 illustrate the improvement in quality that can be achieved by increasing the time for out-diffusion of interstitials. The concentration of interstitials is calculated for two cases with differing axial temperature profiles in the crystal, dT/dz. The axial temperature gradient at the melt/solid interface is the same for both cases, so that the initial concentration (about 1 cm from the melt/solid interface) of interstitials is the same for both cases. In this example, the pull rate was adjusted such that the entire crystal is interstitial-rich. The pull rate was the same for both cases, 0.32 mm/min. The longer time for interstitial out-diffusion in case 2 results in an overall reduction of the interstitial concentration. This leads to an improvement in the quality of the material since it becomes easier to avoid the formation of interstitial defect clusters due to supersaturation of interstitials.

Example 8

Figure 24:
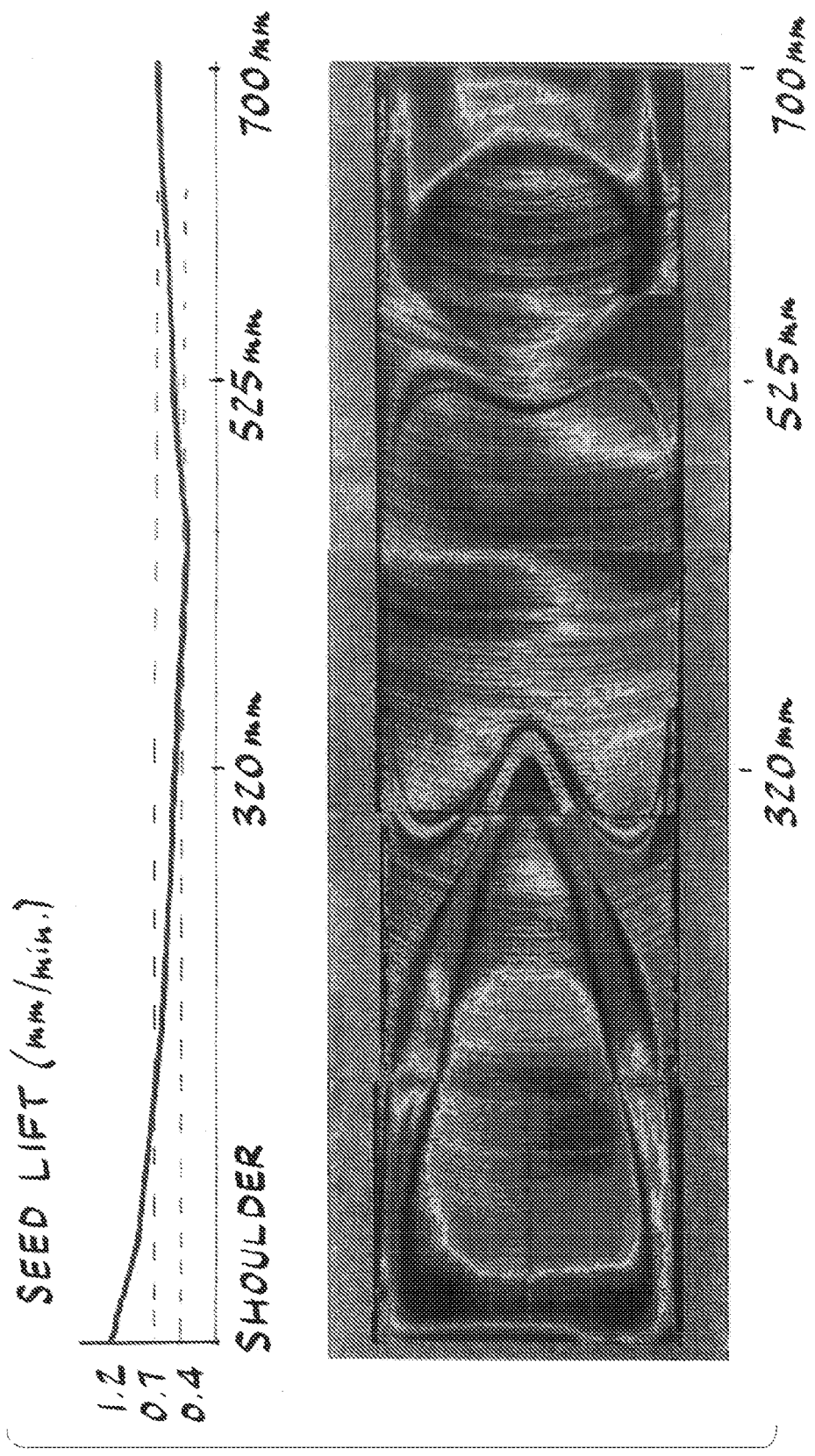
FIG. 24 is an image produced by a scan of the minority carrier lifetime of an axial cut of an entire ingot following a series of oxygen precipitation heat treatments, as described in Example 8.

A 700 mm long, 150 mm diameter crystal was grown with a varying pull rate. The pull rate varied nearly linearly from about 1.2 mm/min at the shoulder to about 0.4 mm/min at 430 mm from the shoulder, and then nearly linearly back to about 0.65 mm/min at 700 mm from the shoulder. Under these conditions in this particular crystal puller, the entire radius is grown under interstitial-rich conditions over the length of crystal ranging from about 320 mm to about 525 mm from the shoulder of the crystal. Referring to FIG. 24, at an axial position of about 525 mm and a pull rate of about 0.47 mm/min, the crystal is free of agglomerated intrinsic point defects clusters across the entire diameter. Stated another way, there is one small section of the crystal in which the width of the axially symmetric region, i.e., the region which is substantially free of agglomerated defects, is equal to the radius of the ingot.

Example 9

As described in Example 5, a series of single crystal silicon ingots were grown at varying pull rates and then analyzed to determine the axial position (and corresponding pull rate) at which agglomerated interstitial defects first appeared or disappeared. Interpolation between and extrapolation from these points, plotted on a graph of pull rate v. axial position, yielded a curve which represents, to a first approximation, the pull rate for a 200 mm crystal as a function of length in the crystal puller at which the axially symmetric region is at its maximum width. Additional crystals were then grown at other pull rates and further analysis of these crystals was used to refine this empirically determined optimum pull rate profile.

Using this data and following this optimum pull rate profile, a crystal of about 1000 mm in length and about 200 mm in diameter was grown. Slices of the grown crystal, obtained from various axial position, were then analyzed using oxygen precipitation methods standard in the art in order to (i) determine if agglomerated interstitial defects were formed, and (ii) determine, as a function of the radius of the slice, the position of the V/I boundary. In this way the presence of an axially symmetric region was determined, as well as the width of this region a function of crystal length or position.

Figure 25:
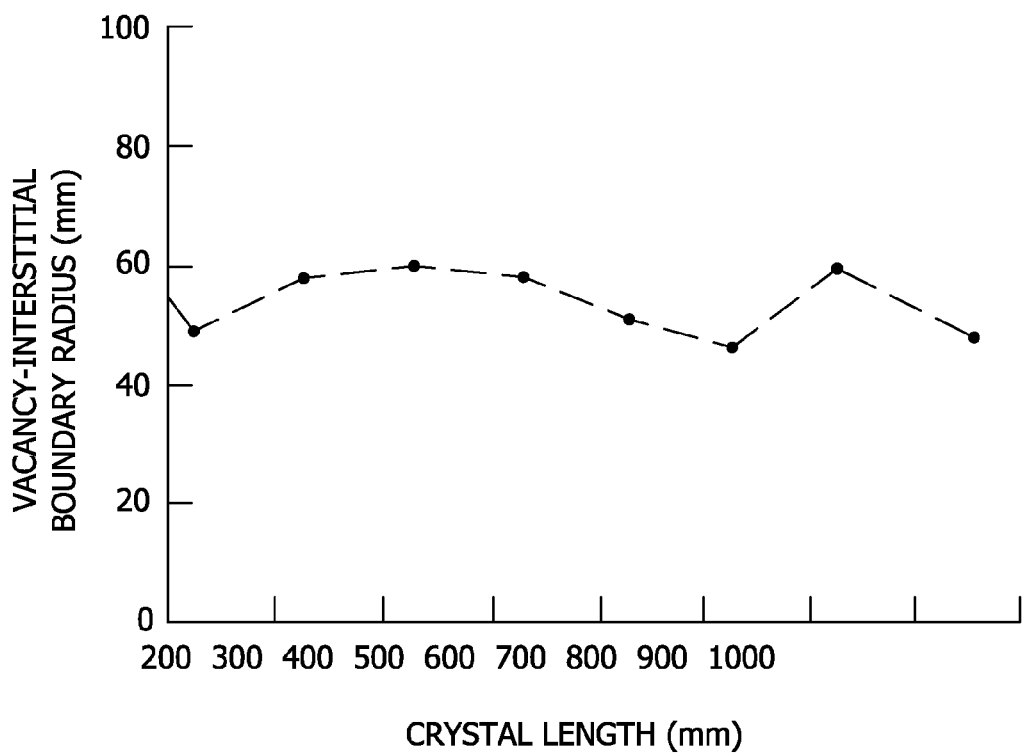
FIG. 25 is a graph illustrating the position of the V/I boundary as a function of the length of the single crystal silicon ingot, as described in Example 9.

The results obtained for axial positions ranging from about 200 mm to about 950 mm from the shoulder of the ingot are present in the graph of FIG. 25. These results show that a pull rate profile may be determined for the growth of a single crystal silicon ingot such that the constant diameter portion of the ingot may contain an axially symmetric region having a width, as measured from the circumferential edge radially toward the central axis of the ingot, which is at least about 40% the length of the radius of the constant diameter portion. In addition, these results show that this axially symmetric region may have a length, as measured along the central axis of the ingot, which is about 75% of the length of the constant diameter portion of the ingot.

Example 10

A single crystal silicon ingot have a length of about 1100 mm and a diameter of about 150 mm was grown with a decreasing pull rate. The pull rate at the shoulder of the constant diameter portion of the ingot was about 1 mm/min. The pull rate decreased exponentially to about 0.4 mm/min., which corresponded to an axial position of about 200 mm from the shoulder. The pull rate then decreased linearly until a rate of about 0.3 mm/min. was reached near the end of the constant diameter portion of the ingot.

Figure 26A:
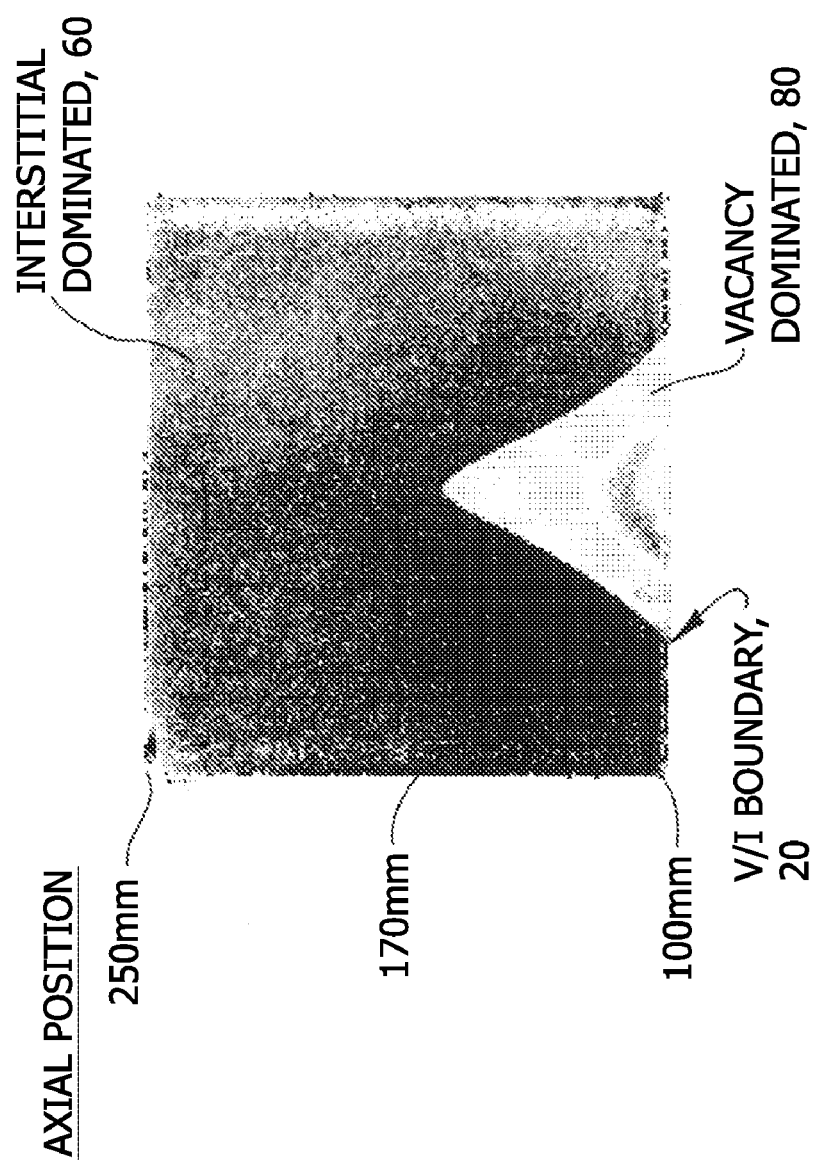
FIG. 26a is an image produced by a scan of the minority carrier lifetime of an axial cut of a segment of an ingot, ranging from about 100 mm to about 250 mm from the shoulder of the ingot, following a series of oxygen precipitation heat treatments, as described in Example 10.
Figure 26B:
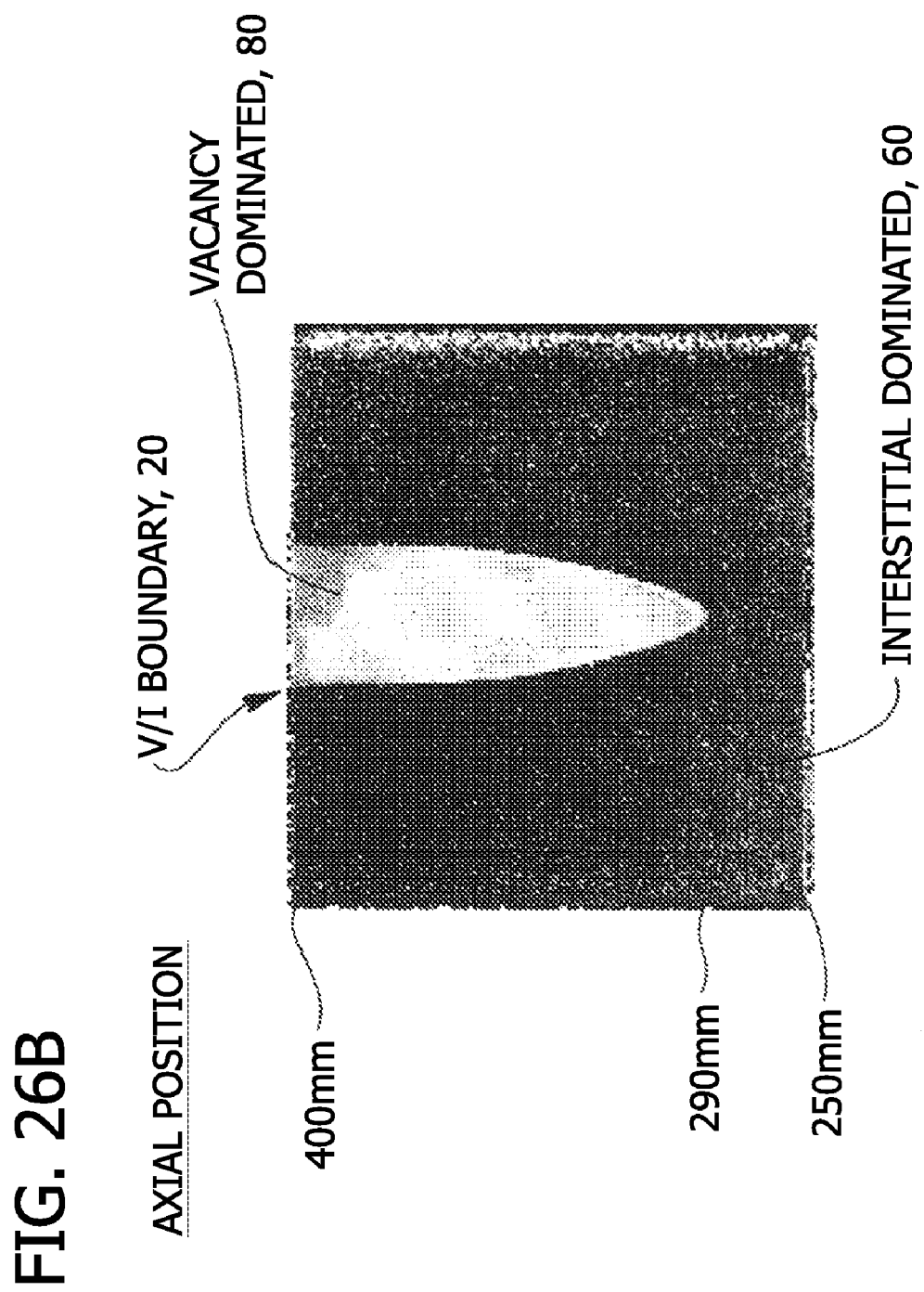
FIG. 26b is an image produced by a scan of the minority carrier lifetime of an axial cut of a segment of an ingot, ranging from about 250 mm to about 400 mm from the shoulder of the ingot, following a series of oxygen precipitation heat treatments, as described in Example 10.

Under these process conditions in this particular hot zone configuration, the resulting ingot contains a region wherein the axially symmetric region has a width which about equal to the radius of the ingot. Referring now to FIGS. 26a and 26b, which are images produced by a scan of the minority carrier lifetime of an axial cut of a portion of the ingot following a series of oxygen precipitation heat treatments, consecutive segments of the ingot, ranging in axial position from about 100 mm to about 250 mm and about 250 mm to about 400 mm are present. It can be seen from these figures that a region exists within the ingot, ranging in axial position from about 170 mm to about 290 mm from the shoulder, which is free of agglomerated intrinsic point defects across the entire diameter. Stated another way, a region is present within the ingot wherein the width of the axially symmetric region, i.e., the region which is substantially free of agglomerated interstitial defects, is about equal to the radius of the ingot.

In addition, in a region ranging from an axially position from about 125 mm to about 170 mm and from about 290 mm to greater than 400 mm there are axially symmetric regions of interstitial dominated material free of agglomerated intrinsic point defects surrounding a generally cylindrical core of vacancy dominated material which is also free of agglomerated intrinsic point defects.

Finally, in a region ranging from an axially position from about 100 mm to about 125 mm there is an axially symmetric region of interstitial dominated material free of agglomerated defects surrounding a generally cylindrical core of vacancy dominated material. Within the vacancy dominated material, there is an axially symmetric region which is free of agglomerated defects surrounding a core containing agglomerated vacancy defects.

Example 11

Cooling Rate and Position of V/I Boundary

A series of single crystal silicon ingots (150 mm and 200 mm nominal diameter), were grown in accordance with the Czochralski method using different hot zone configurations, designed by means common in the art, which affected the residence time of the silicon at temperatures in excess of about 1050° C. The pull rate profile for each ingot was varied along the length of the ingot in an attempt to create a transition from a region of agglomerated vacancy point defects to a region of agglomerated interstitial point defects.

Once grown, the ingots were cut longitudinally along the central axis running parallel to the direction of growth, and then further divided into sections which were each about 2 mm in thickness. Using the copper decoration technique previously described, one set of such longitudinal sections was then heated and intentionally contaminated with copper, the heating conditions being appropriate for the dissolution of a high concentration of copper interstitials. Following this heat treatment, the samples were then rapidly cooled, during which time the copper impurities either outdiffused or precipitated at sites where oxide clusters or agglomerated interstitial defects where present. After a standard defect delineating etch, the samples were visually inspected for the presence of precipitated impurities; those regions which were free of such precipitated impurities corresponded to regions which were free of agglomerated interstitial defects.

Another set of the longitudinal sections was subjected to a series of oxygen precipitation heat treatments in order to cause the nucleation and growth of new oxide clusters prior to carrier lifetime mapping. Contrast bands in lifetime mapping were utilized in order to determine and measure the shape of the instantaneous melt/solid interface at various axial positions in each ingot. Information on the shape of the melt/solid interface was then used, as discussed further below, to estimate the absolute value of, and the radial variation in, the average axial temperature gradient, $G_0$. This information was also used, in conjunction with the pull rate, to estimate the radial variation in $v/G_0$.

To more closely examine the effect growth conditions have on the resulting quality of a single crystal silicon ingot, several assumptions were made which, based on experimental evidence available to-date, are believed to be justified. First, in order to simplify the treatment of thermal history in terms of the time taken to cool to a temperature at which the agglomeration of interstitial defects occurs, it was assumed that about 1050° C. is a reasonable approximation for the temperature at which the agglomeration of silicon self-interstitials occurs. This temperature appears to coincide with changes in agglomerated interstitial defect density observed during experiments in which different cooling rates were employed. Although, as noted above, whether agglomeration occurs is also a factor of the concentration of interstitials, it is believed that agglomeration will not occur at temperatures above about 1050° C. because, given the range of interstitial concentrations typical for Czochralski-type growth processes, it is reasonable to assume that the system will not become critically supersaturated with interstitials above this temperature. Stated another way, for concentrations of interstitials which are typical for Czochralski-type growth processes, it is reasonable to assume that the system will not become critically supersaturated, and therefore an agglomeration event will not occur, above a temperature of about 1050° C.

The second assumption that was made to parameterize the effect of growth conditions on the quality of single crystal silicon is that the temperature dependence of silicon self-interstitial diffusivity is negligible. Stated another way, it is assumed that self-interstitials diffuse at the same rate at all temperatures between about 1400° C. and about 1050° C. Understanding that about 1050° C. is considered a reasonable approximation for the temperature of agglomeration, the essential point of this assumption is that the details of the cooling curve from the melting point does not matter. The diffusion distance depends only on the total time spent cooling from the melting point to about 1050° C.

Using the axial temperature profile data for each hot zone design and the actual pull rate profile for a particular ingot, the total cooling time from about 1400° C. to about 1050° C. may be calculated. It should be noted that the rate at which the temperature changes for each of the hot zones was reasonably uniform. This uniformity means that any error in the selection of a temperature of nucleation for agglomerated interstitial defects, i.e. about 1050° C., will arguably lead only to scaled errors in the calculated cooling time.

In order to determine the radial extent of the vacancy dominated region of the ingot ($R_{vacancy}$), or alternatively the width of the axially symmetric region, it was further assumed that the radius of the vacancy dominated core, as determined by the lifetime map, is equivalent to the point at solidification where $v/G_0 = v/G_0$ critical. Stated another way, the width of the axially symmetric region was generally assumed to be based on the position of the V/I boundary after cooling to room temperature. This is pointed out because, as mentioned above, as the ingot cools recombination of vacancies and silicon self-interstitials may occur. When recombination does occur, the actual position of the V/I boundary shifts inwardly toward the central axis of the ingot. It is this final position which is being referred to here.

Figure 27:
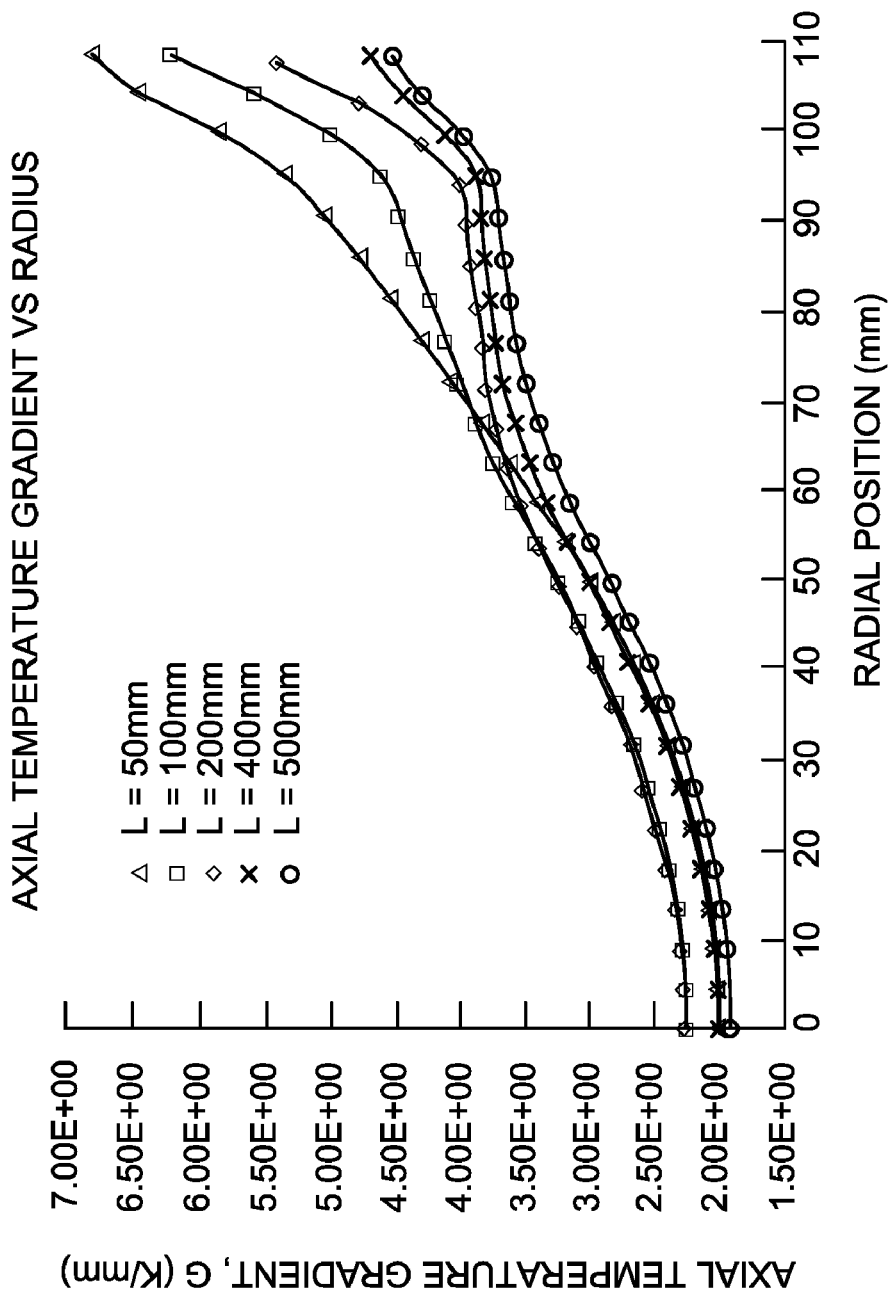
FIG. 27 is a graph of the axial temperature gradient, $G_0$, at various axial positions for an ingot, as described in Example 11.

To simplify the calculation of $G_0$, the average axial temperature gradient in the crystal at the time of solidification, the melt/solid interface shape was assumed to be the melting point isotherm. The crystal surface temperatures were calculated using finite element modeling (FEA) techniques and the details of the hot zone design. The entire temperature field within the crystal, and therefore $G_0$, was deduced by solving Laplace's equation with the proper boundary conditions, namely, the melting point along the melt/solid interface and the FEA results for the surface temperature along the axis of the crystal. The results obtained at various axial positions from one of the ingots prepared and evaluated are presented in FIG. 27.

To estimate the effect that radial variations in $G_0$ have on the initial interstitial concentration, a radial position R', that is, a position halfway between the V/I boundary and the crystal surface, was assumed to be the furthest point a silicon self-interstitial can be from a sink in the ingot, whether that sink be in the vacancy dominated region or on the crystal surface. By using the growth rate and the $G_0$ data for the above ingot, the difference between the calculated $v/G_0$ at the position R' and $v/G_0$ at the V/I boundary (i.e., the critical $v/G_0$ value) provides an indication of the radial variation in the initial interstitial concentration, as well as the effect this has on the ability for excess interstitials to reach a sink on the crystal surface or in the vacancy dominated region.

Figure 28:
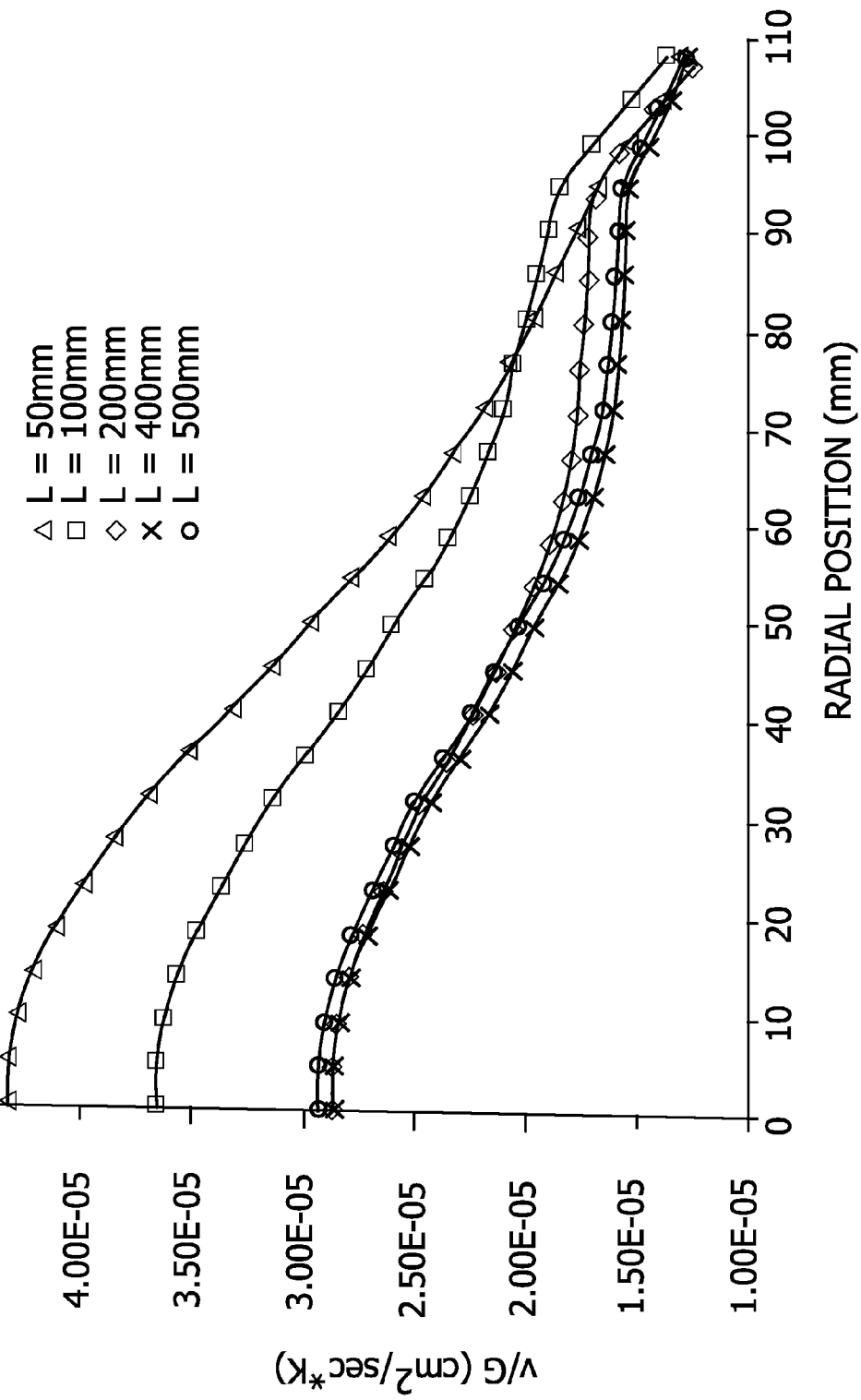
FIG. 28 is a graph of the radial variations in the average axial temperature gradient, $G_0$, at various for an ingot, as described in Example 11.

For this particular data set, it appears there is no systematic dependence of the quality of the crystal on the radial variation in $v/G_0$. As can be seen in FIG. 28, the axial dependence in the ingot is minimal in this sample. The growth conditions involved in this series of experiments represent a fairly narrow range in the radial variation of $G_0$. As a result, this data set is too narrow to resolve a discernable dependence of the quality (i.e., the presence of absence of a band of agglomerated intrinsic point defects) on the radial variation of $G_0$.

Figure 29:
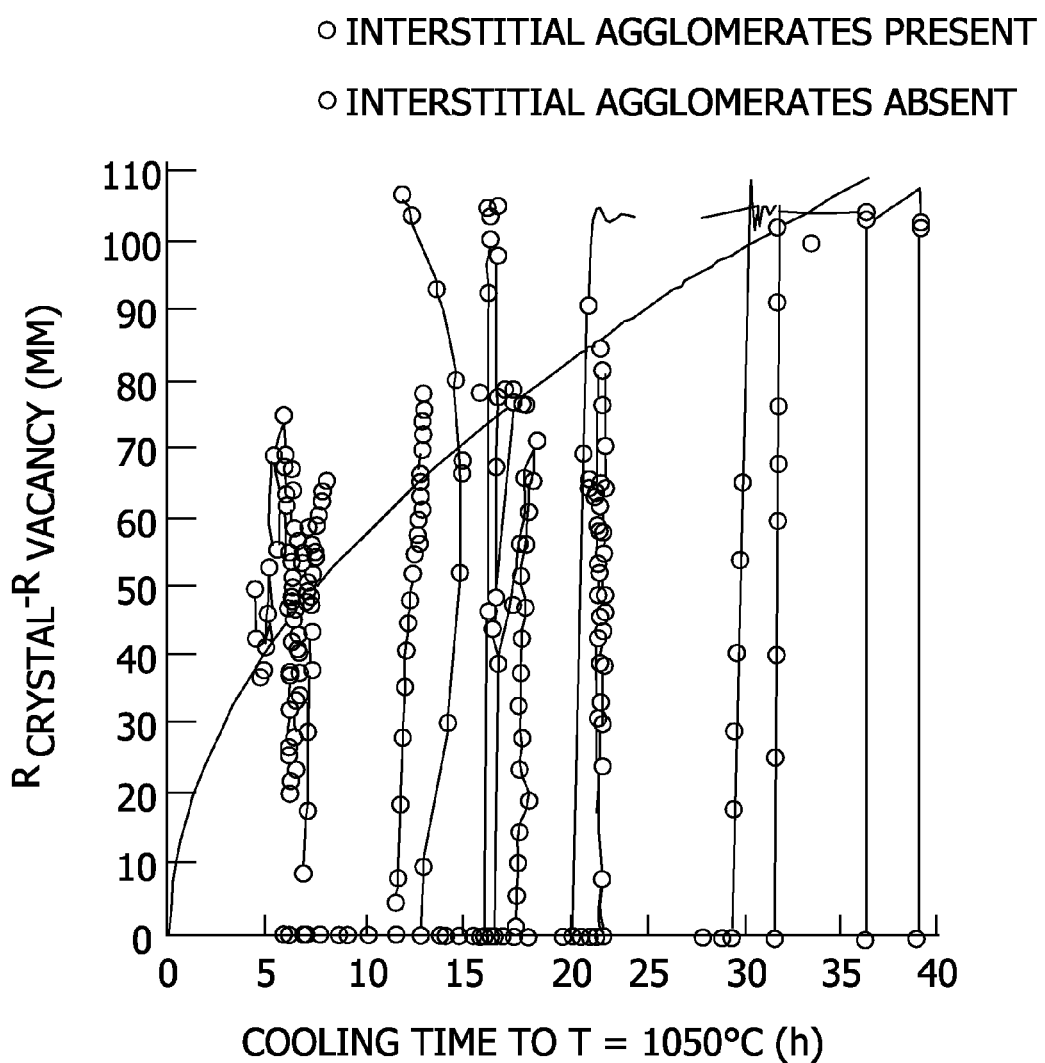
FIG. 29 is a graph illustrating the relationship between the width of the axially symmetric region and the cooling rate, as described in Example 11.

As noted, samples of each ingot prepared were evaluated at various axial positions for the present or absence of agglomerated interstitial defects. For each axial position examined, a correlation may be made between the quality of the sample and the width of the axially symmetric region. Referring now to FIG. 29, a graph may be prepared which compares the quality of the given sample to the time the sample, at that particular axial position, was allowed to cool from solidification to about 1050° C. As expected, this graph shows the width of the axially symmetric region (i.e., $R_{crystal} - R_{vacancy}$) has a strong dependence on the cooling history of the sample within this particular temperature range. In order of the width of the axially symmetric region to increase, the trend suggests that longer diffusion times, or slower cooling rates, are needed.

Based on the data present in this graph, a best fit line may be calculated which generally represents a transition in the quality of the silicon from "good" (i.e., defect-free) to "bad" (i.e., containing defects), as a function of the cooling time allowed for a given ingot diameter within this particular temperature range. This general relationship between the width of the axially symmetric region and the cooling rate may be expressed in terms of the following equation:

$$(R_{crystal} - R_{transition})^2 = D_{eff} * t_{1050° C.}$$

wherein $R_{crystal}$ is the radius of the ingot, $R_{transition}$ is the radius of the axially symmetric region at an axial position in the sample were a transition occurs in the interstitial dominated material from being defect-free to containing defects, or vice versa, $D_{eff}$ is a constant, about $9.3*10^{-4}$ cm$^2$sec$^{-1}$, which represents the average time and temperature of interstitial diffusivity, and $t_{1050° C.}$ is the time required for the given axial position of the sample to cool from solidification to about 1050° C.

Referring again to FIG. 29, it can be seen that, for a given ingot diameter, a cooling time may be estimated in order to obtain an axially symmetric region of a desired diameter. For example, for an ingot having a diameter of about 150 mm, an axially symmetric region having a width about equal to the radius of the ingot may be obtained if, between the temperature range of about 1410° C. and about 1050° C., this particular portion of the ingot is allowed to cool for about 10 to about 15 hours. Similarly, for an ingot having a diameter of about 200 mm, an axially symmetric region having a width about equal to the radius of the ingot may be obtained if between this temperature range this particular portion of the ingot is allowed to cool for about 25 to about 35 hours. If this line is further extrapolated, cooling times of about 65 to about 75 hours may be needed in order to obtain an axially symmetric region having a width about equal to the radius of an ingot having a diameter of about 300 mm. It is to be noted in this regard that, as the diameter of the ingot increases, additional cooling time is required due to the increase in distance that interstitials must diffuse in order to reach sinks at the ingot surface or the vacancy core.

Referring now to FIGS. 30, 31, 32 and 33, the effects of increased cooling time for various ingots may be observed. Each of these figures depicts a portion of a ingot having a nominal diameter of 200 mm, with the cooling time from the temperature of solidification to 1050° C. progressively increasing from FIG. 30 to FIG. 33.

Figure 30:
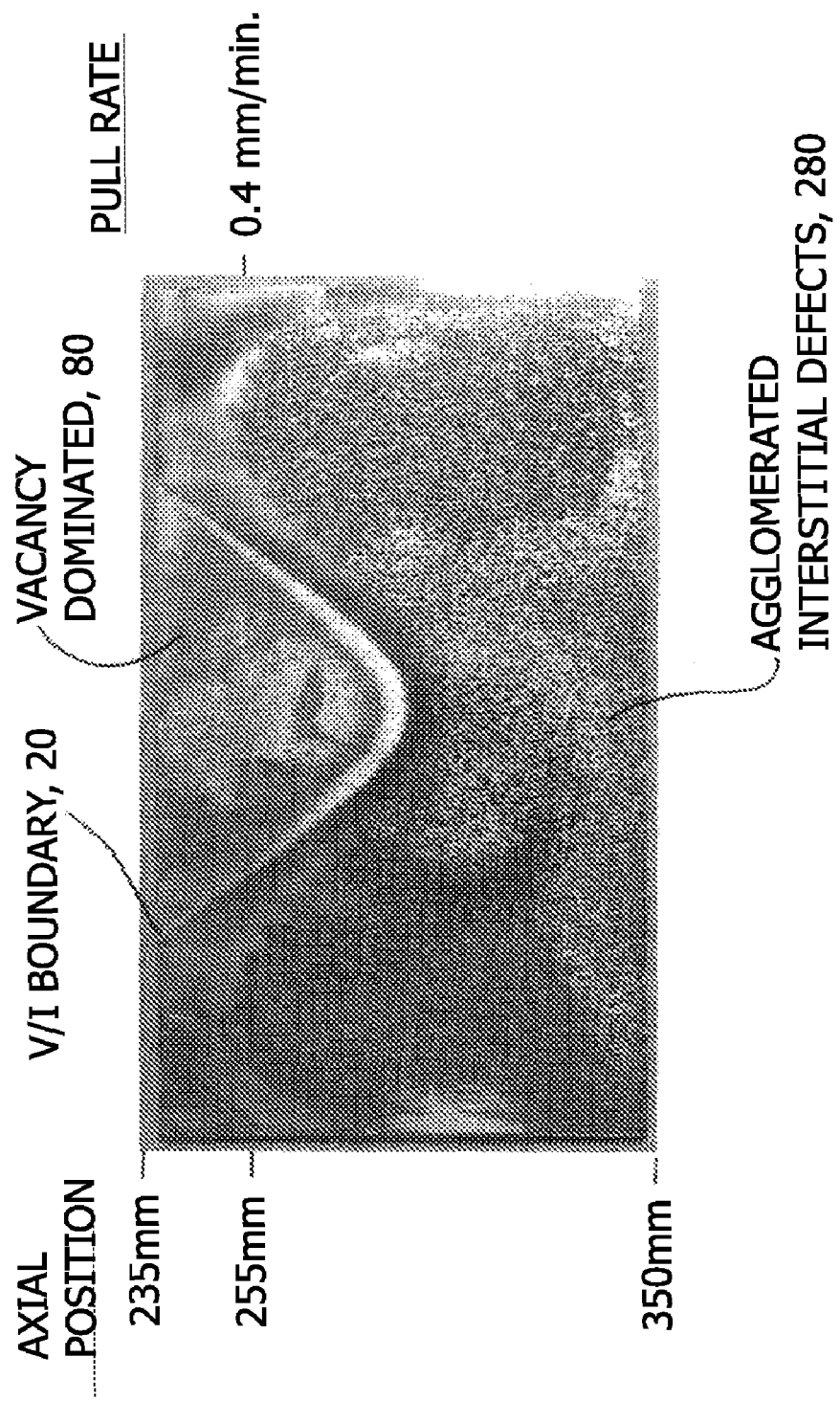
FIG. 30 is a photograph of an axial cut of a segment of an ingot, ranging from about 235 mm to about 350 mm from the shoulder of the ingot, following copper decoration and a defect-delineating etch, described in Example 11.

Referring to FIG. 30, a portion of an ingot, ranging in axial position from about 235 mm to about 350 mm from the shoulder, is shown. At an axial position of about 255 mm, the width of the axially symmetric region free of agglomerated interstitial defects is at a maximum, which is about 45% of the radius of the ingot. Beyond this position, a transition occurs from a region which is free of such defects, to a region in which such defects are present.

Figure 31:
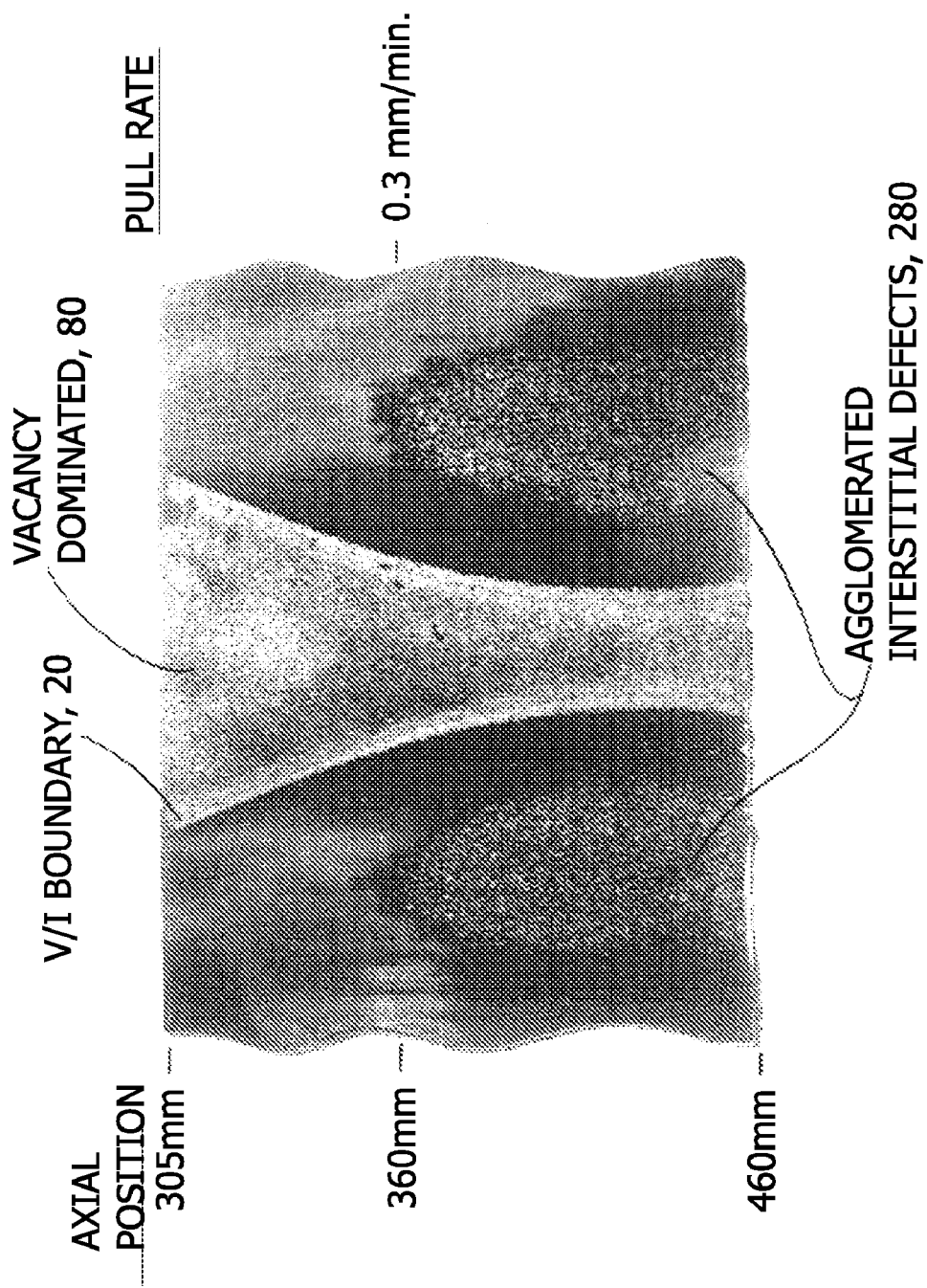
FIG. 31 is a photograph of an axial cut of a segment of an ingot, ranging from about 305 mm to about 460 mm from the shoulder of the ingot, following copper decoration and a defect-delineating etch, described in Example 11.

Referring now to FIG. 31, a portion of an ingot, ranging in axial position from about 305 mm to about 460 mm from the shoulder, is shown. At an axial position of about 360 mm, the width of the axially symmetric region free of agglomerated interstitial defects is at a maximum, which is about 65% of the radius of the ingot. Beyond this position, defect formation begins.

Figure 32:
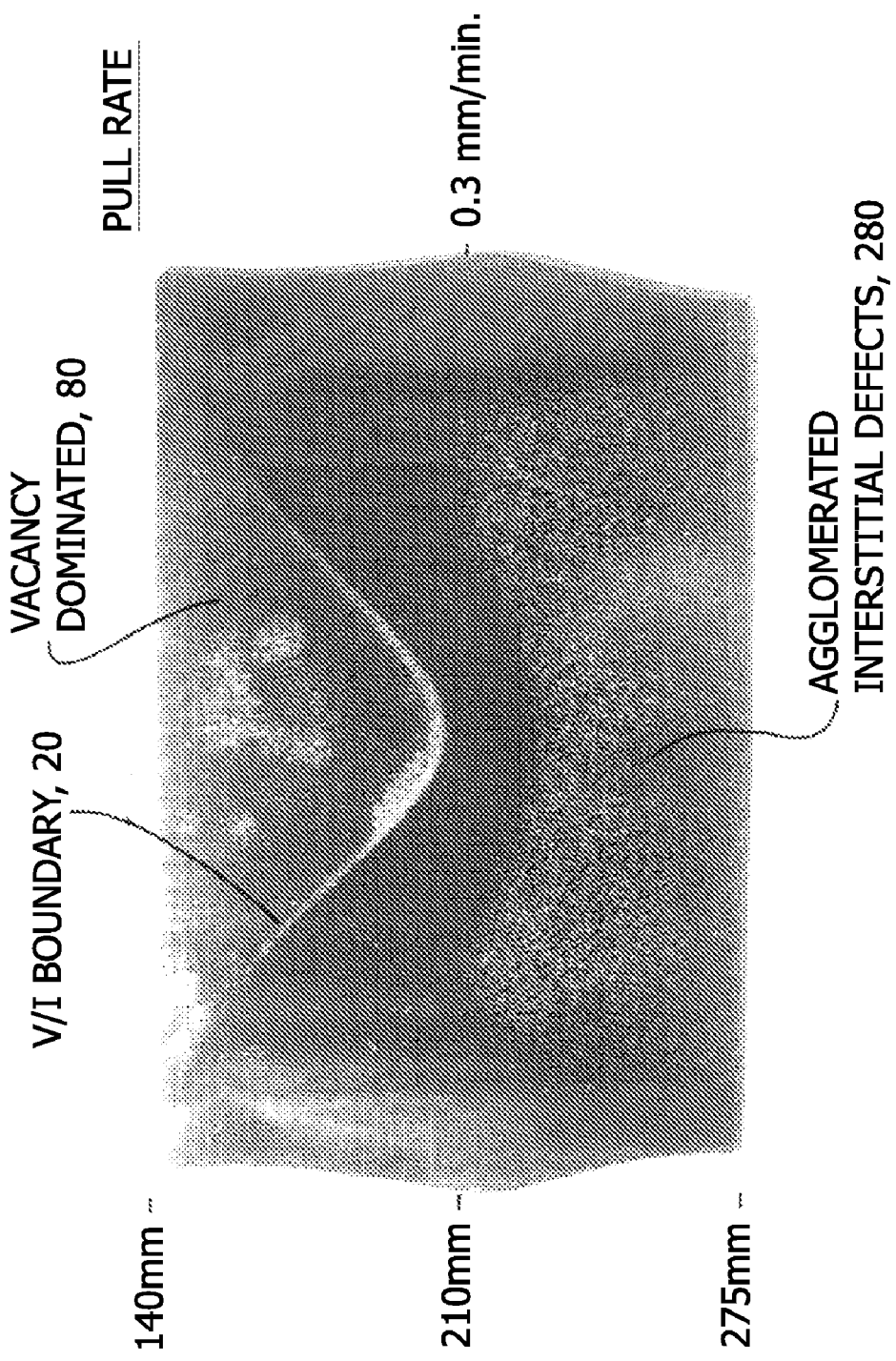
FIG. 32 is a photograph of an axial cut of a segment of an ingot, ranging from about 140 mm to about 275 mm from the shoulder of the ingot, following copper decoration and a defect-delineating etch, described in Example 11.

Referring now to FIG. 32, a portion of an ingot, ranging in axial position from about 140 mm to about 275 mm from the shoulder, is shown. At an axial position of about 210 mm, the width of the axially symmetric region is about equal to the radius of the ingot; that is, a small portion of the ingot within this range is free of agglomerated intrinsic point defects.

Figure 33:
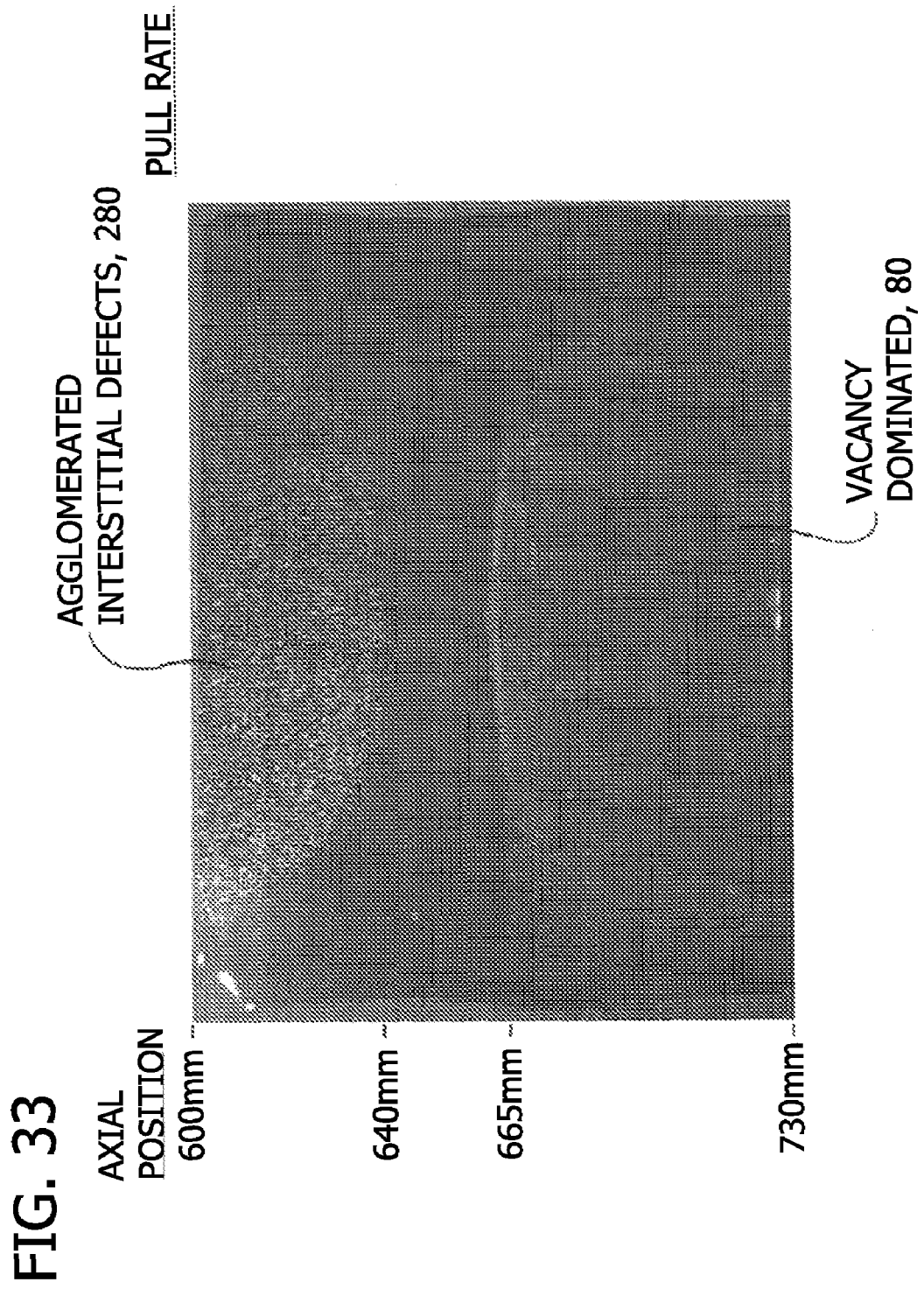
FIG. 33 is a photograph of an axial cut of a segment of an ingot, ranging from about 600 mm to about 730 mm from the shoulder of the ingot, following copper decoration and a defect-delineating etch, described in Example 11.

Referring now to FIG. 33, a portion of an ingot, ranging in axial position from about 600 mm to about 730 mm from the shoulder, is shown. Over an axial position ranging from about 640 mm to about 665 mm, the width of the axially symmetric region is about equal to the radius of the ingot. In addition, the length of the ingot segment in which the width of the axially symmetric region is about equal to the radius of the ingot is greater than what is observed in connection with the ingot of FIG. 32.

When viewed in combination, therefore, FIGS. 30, 31, 32, and 33 demonstrate the effect of cooling time to 1050° C. upon the width and the length of the defect-free, axially symmetric region. In general, the regions containing agglomerated interstitial defects occurred as a result of a continued decrease of the crystal pull rate leading to an initial interstitial concentration which was too large to reduce for the cooling time of that portion of the crystal. A greater length of the axially symmetric region means a larger range of pull rates (i.e., initial interstitial concentration) are available for the growth of such defect-free material. Increasing the cooling time allows for initially higher concentration of interstitials, as sufficient time for radial diffusion may be achieved to suppress the concentration below the critical concentration required for agglomeration of interstitial defects. Stated in other words, for longer cooling times, somewhat lower pull rates (and, therefore, higher initial interstitial concentrations) will still lead to the maximum axially symmetric region 60. Therefore, longer cooling times lead to an increase in the allowable pull rate variation about the condition required for maximum axially symmetric region diameter and ease the restrictions on process control. As a result, the process for an axially symmetric region over large lengths of the ingot becomes easier.

Referring again to FIG. 33, over an axial position ranging from about 665 mm to greater than 730 mm from the shoulder of crystal, a region of vacancy dominated material free of agglomerated defects is present in which the width of the region is equal to the radius of the ingot.

As can be seen from the above data, by means of controlling the cooling rate, the concentration of self-interstitials may be suppressed by allowing more time for interstitials to diffuse to regions where they may be annihilated. As a result, the formation of agglomerated interstitial defects is prevented within significant portion of the single crystal silicon ingot.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A process for heat-treating a Cz, single crystal silicon wafer to influence the precipitation behavior of oxygen in the wafer in a subsequent thermal processing step, the wafer comprising two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer, wherein said wafer further comprises an axially symmetric region which has radial width of at least about 30% the length of the radius of the wafer and has no detectible agglomerated intrinsic point defects at a detection limit of $10^3$ defects/cm$^3$, the process comprising the steps of;

subjecting the wafer to a heat-treatment in excess of about 1175° C. in a non-oxidizing atmosphere to form crystal lattice vacancies in the front surface and bulk layers; and, controlling the cooling rate of the heat-treated wafer to produce a wafer having a vacancy concentration profile in which a maximum concentration is located between the central plane and the back surface layer, the vacancy concentration generally increasing from the front surface to the region of maximum concentration and generally decreasing from the region of maximum concentration to the back surface with the difference in the concentration of vacancies in the front surface layer, the back surface layer, and the bulk layer being such that a thermal treatment at a temperature in excess of 750° C. is capable of forming in the wafer a denuded zone in the front surface layer and in the back surface layer and oxygen clusters or precipitates in the bulk zone, with the concentration of the oxygen clusters or precipitates in the bulk layer being primarily dependant upon the concentration of vacancies.

2. The process of claim 1 wherein said heat-treatment to form crystal lattice vacancies further comprises exposing the front surface to a non-nitriding atmosphere and the back surface to a nitriding atmosphere.

3. The process of claim 2 wherein said nitriding atmosphere is selected from a group consisting of nitrogen and ammonia.

4. The process of claim 3 wherein said nitriding atmosphere is nitrogen.

5. The process of claim 4 wherein said nitriding atmosphere further comprises oxygen.

6. The process of claim 1 wherein said heat-treatment to form crystal lattice vacancies further comprises annealing the wafer with a second silicon wafer having a front surface that is generally parallel to a back surface, wherein the wafers are arranged such that the wafer's front surface is in contact with the second wafer's front surface in a face-to-face arrangement.

7. A process for producing a single crystal silicon wafer having two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer, the wafer being characterized in that the wafer has a non-uniform distribution of crystal lattice vacancies in which a maximum concentration is located between the central plane and the back surface layer, the vacancy concentration generally increasing from the front surface to the region of maximum concentration and generally decreasing from the region of maximum concentration to the back surface, the wafer further comprising a first axially symmetric region, which has no detectable agglomerated intrinsic point defects at a detection limit of $10^3$ defects/cm$^3$, the process comprising the steps of:

growing a single crystal silicon ingot in which the ingot comprises a central axis, a seed-cone, an end-cone and a constant diameter portion between the seed-cone and the end-cone having a circumferential edge, a radius extending from the central axis to the circumferential edge, and a nominal diameter of 150 mm, 200 mm, or greater than 200 mm;

controlling (i) a growth velocity, v, (ii) an average axial temperature gradient, $G_0$, during the growth of the constant diameter portion of the crystal over the temperature range from solidification to a temperature of no less than about 1325° C., and (iii) the cooling rate of the crystal from the solidification temperature to about 1,050° C. to cause the formation of an axially symmetrical segment which has no detectable agglomerated intrinsic point defects at a detection limit of $10^3$ defects/cm$^3$, wherein the axially symmetric region extends inwardly from the circumferential edge of the ingot, has a width as measured from the circumferential edge radially toward the central axis of the ingot which is at least about 30% the length of the radius of the ingot, and has a length as measured along the central axis of at least about 20% the length of the constant diameter portion of the ingot;

slicing a single crystal silicon wafer from the constant diameter portion of the ingot;

subjecting the wafer to a heat-treatment in excess of about 1175° C. in a non-oxidizing atmosphere to form crystal lattice vacancies in the front surface and bulk layers; and, controlling the cooling rate of the heat-treated wafer to produce a wafer having a vacancy concentration profile in which a maximum concentration is located between the central plane and the back surface layer, the vacancy concentration generally increasing from the front surface to the region of maximum concentration and generally decreasing from the region of maximum concentration to the back surface and the difference in the concentration of vacancies in the front surface layer, the back surface layer, and the bulk layer being such that a thermal treatment at a temperature in excess of 750° C. is capable of forming in the wafer a denuded zone in the front surface layer and in the back surface layer and oxygen clusters or precipitates in the bulk zone, with the concentration of the oxygen clusters or precipitates in the bulk layer being primarily dependant upon the concentration of vacancies.

8. The process of claim 7 wherein said heat-treatment to form crystal lattice vacancies further comprises exposing the front surface to a non-nitriding atmosphere and the back surface to a nitriding atmosphere.

9. The process of claim 8 wherein said nitriding atmosphere is selected from a group consisting of nitrogen and ammonia.

10. The process of claim 9 wherein said nitriding atmosphere is nitrogen.

11. The process of claim 10 wherein said nitriding atmosphere further comprises oxygen.

12. The process of claim 7 wherein said heat-treatment to form crystal lattice vacancies further comprises annealing the wafer with a second silicon wafer having a front surface that is generally parallel to a back surface, wherein the wafers are arranged such that the wafer's front surface is in contact with the second wafer's front surface in a face-to-face arrangement.

13. A process for heat-treating a Cz, single crystal silicon wafer, to influence the precipitation behavior of oxygen in the wafer in a subsequent thermal processing step, the wafer comprising two major, generally parallel surfaces, one of which is a front surface of the wafer and the other of which is a back surface of the wafer, a central plane between the front and back surfaces, a circumferential edge joining the front and back surfaces, a central axis generally perpendicular to the front and back surfaces, a radius extending from the central axis to the circumferential edge, a nominal diameter of 150 mm, 200 mm, or greater than 200 mm, a front surface layer which comprises the region of the wafer between the front surface and a distance, $D_1$, of at least about 10 micrometers measured from the front surface and toward the central plane, a back surface layer which comprises a second region of the wafer between the back surface and a distance $D_2$, of at least about 10 micrometers as measured from the back surface and toward the central plane, and a bulk layer which comprises a third region of the wafer between the front surface layer and the back surface layer, wherein said wafer further comprises a first axially symmetric region in which vacancies are the predominant intrinsic point defect and which has no detectible agglomerated intrinsic point defects at a detection limit of $10^3$ defects/cm$^3$, wherein the first axially symmetric region comprises the central axis or has a width of at least about 15 mm the process comprising the steps of;

subjecting the wafer to a heat-treatment in excess of about 1175° C. in a non-oxidizing atmosphere to form crystal lattice vacancies in the surface layer and the bulk layer; and, controlling the cooling rate of the heat-treated wafer to produce a wafer having a non-uniform concentration of vacancies in which a maximum concentration is located between the central plane and the back surface layer, the vacancy concentration generally increasing from the front surface to the region of maximum concentration and generally decreasing from the region of maximum concentration to the back surface such that, upon subjecting the wafer to an oxygen precipitation heat treatment, a denuded zone is formed in the surface layer and oxygen clusters or precipitates are formed in the bulk layer with the concentration of the oxygen clusters or precipitates in the bulk layer being primarily dependant upon the concentration of vacancies.

14. The process of claim 13 wherein said heat-treatment to form crystal lattice vacancies further comprises exposing the front surface to a non-nitriding atmosphere and the back surface to a nitriding atmosphere.

15. The process of claim 14 wherein said nitriding atmosphere is selected from a group consisting of nitrogen and ammonia.

16. The process of claim 15 wherein said nitriding atmosphere is nitrogen.

17. The process of claim 16 wherein said nitriding atmosphere further comprises oxygen.

18. The process of claim 13 wherein said heat-treatment to form crystal lattice vacancies further comprises annealing the wafer with a second silicon wafer having a front surface that is generally parallel to a back surface, wherein the wafers are arranged such that the wafer's front surface is in contact with the second wafer's front surface in a face-to-face arrangement.

* * * * *